United States Patent
Shinozaki et al.

(10) Patent No.: US 8,363,466 B2
(45) Date of Patent: Jan. 29, 2013

(54) NONVOLATILE SEMICONDUCTOR MEMORY DEVICE AND METHOD OF READING DATA FROM NONVOLATILE SEMICONDUCTOR MEMORY DEVICE

(75) Inventors: Naoharu Shinozaki, Tokyo (JP); Masao Taguchi, Tokyo (JP); Satoru Sugimoto, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 150 days.

(21) Appl. No.: 12/976,355

(22) Filed: Dec. 22, 2010

(65) Prior Publication Data

US 2011/0157978 A1  Jun. 30, 2011

(30) Foreign Application Priority Data

Dec. 26, 2009  (JP) .................. 2009-296543

(51) Int. Cl.
  *G11C 11/34* (2006.01)
(52) U.S. Cl. ........ 365/185.02; 365/185.26; 365/189.011
(58) Field of Classification Search ............. 365/185.02, 365/185.26, 189.011
See application file for complete search history.

(56) References Cited

U.S. PATENT DOCUMENTS 7,535,746 B2 * 5/2009 Kawazoe et al. ............. 365/148
2003/0137873 A1 7/2003 Kawamura

FOREIGN PATENT DOCUMENTS

JP  2003-217288  7/2003

* cited by examiner

*Primary Examiner* — Richard Elms
*Assistant Examiner* — Nam Nguyen
(74) *Attorney, Agent, or Firm* — Morrison & Foerster LLP

(57) ABSTRACT

At the time of reading, an unselected word line voltage is fixed to a first predetermined voltage (0 V or 3 V), and when selecting a word line, a selected word line voltage is set to a second predetermined voltage (−3.5 V or 0 V). This configuration eliminates an application of a pulsed voltage to the word line at the time of reading, making it possible to reduce an influence of read disturbance. In addition, even when a voltage in a range from a power source voltage to a ground voltage or a voltage over the power source voltage is required at the time of reading, it becomes a voltage about 1.5 times an absolute value of the power source voltage. Therefore, a voltage step-up circuit having a large number of stages is not required, and as a result, it is possible to achieve a reduced operation time with a low power consumption.

34 Claims, 40 Drawing Sheets

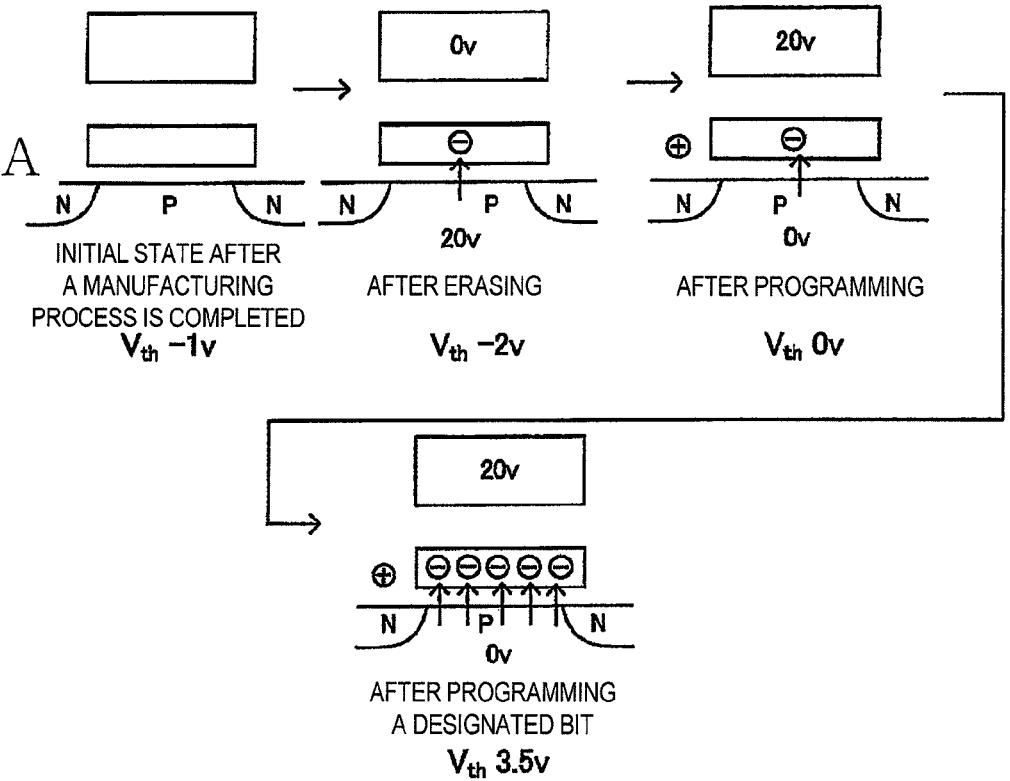
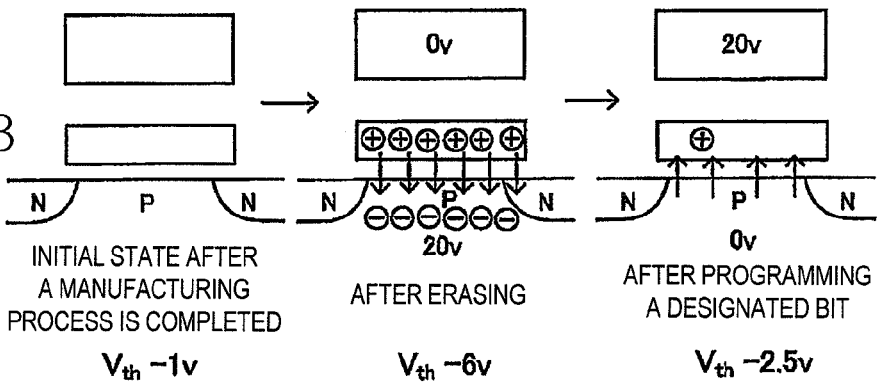

NONVOLATILE SEMICONDUCTOR MEMORY DEVICE AND METHOD OF READING DATA FROM NONVOLATILE SEMICONDUCTOR MEMORY DEVICE

BACKGROUND OF THE INVENTION

1. Field of the Invention

The present invention relates to a nonvolatile semiconductor memory device that can be preferably applied to a NAND flash memory and a method of reading data from a nonvolatile semiconductor memory device, and more particularly relates to a technique of reducing read disturbance at the time data reading.

2. Description of Related Art

A NAND flash memory is constituted by NAND strings in which a plurality of memory cells each having a floating gate are connected in series and a select transistor is connected to each end. The number of memory cells arranged in the NAND string has been increasing with increase of the capacity of NAND flash memories. At present, 32 cells are mostly arranged in a NAND string for a flash memory having a capacity over 1 megabyte, which is used as a recording medium for storing images taken by a digital camera. In the future, when the memory capacity of NAND flash memories is further increased, it is believed that NAND flash memories having 64 cells arranged in a string will become dominant.

However, conventional NAND flash memories have a problem that an influence of read disturbance increases as the number of cells in a string increases. As described in US 2003-137873-A, read disturbance is caused by an electric field stress exerted on a memory cell connected to an unselected word line because a relatively high voltage is applied to the unselected word line in a selected block (a selected segment) so that the memory cell connected to the unselected word line is turned into a light programming operation state at the time of reading.

FIG. 35 shown a circuit configuration of NAND strings used in a NAND flash memory. As shown in FIG. 35, the NAND string includes a plurality of memory cells M0, M1, connected in series each having a floating gate and select transistors SGD and SGS respectively connected to both ends. The drain of the select transistor SGD is connected to a bit line BL, and the source of the select transistor SGS is connected to a common source line ARVSS.

In each of the NAND strings, gates of the memory cells M0, M1, . . . arranged in a horizontal direction are commonly connected to word lines WL0, WL1, . . . , respectively. The gate of the select transistor SGD is connected to a selected signal line SELD. The gate of the select transistor SGS is connected to a selected signal line SELS.

FIG. 36 is a graph representing a distribution of threshold values of memory cells in conventional NAND strings. As shown in FIG. 36, the threshold values of the memory cells M0, M1, . . . are distributed around 0 volt (V) in a case of data "1" and around 3.5 V in a case of data "0". Therefore, for example, when a voltage of 6 V is applied to the gates of the memory cells M0, M1, . . . , all the memory cells M0, M1, . . . , are switched on. Meanwhile, for example, when a voltage of 2.5 V is applied to the gates of the memory cells M0, M1, . . . , the memory cells M0, M1, . . . are switched off if the memory cells are programmed and switched on if the memory cells are not programmed.

Therefore, at the time of reading, the voltage of 6 V is applied to gates of unselected memory cells among the memory cells M0, M1, . . . to switch on the unselected memory cells. The voltage of 2.5 V is applied to selected memory cells among the memory cells M0, M1, . . . . In addition, the voltage of 6 V is applied to the gates of the select transistors SGD and SGS to switch on the select transistors SGD and SGS. When a selected memory cell represents data "1", the selected memory cell is switched on, and when the selected memory cell represents data "0", the selected memory cell is switched off, so that it is possible to read the data based on whether a current flows through the selected memory cell.

FIG. 37 is a waveform diagram showing voltages of word lines in a conventional NAND flash memory. In the example shown in FIG. 37, a voltage of an unselected word line is set to 6 V and that of a selected word line is set to 2.5 V.

As shown in FIG. 37, first, when the word line WL0 is selected, a selected word line voltage of 2.5 V is applied to the word line WL0 in pulses, and an unselected word line voltage of 6 V is applied to the other word lines WL1, WL2, . . . , WL31 in pulses. Subsequently, when the word line WL1 is selected, the selected word line voltage of 2.5 V is applied to the word line WL1 in pulses, and the unselected word line voltage of 6 V is applied to the other word lines WL0, WL2, . . . , WL31 in pulses. The selected word line voltage of 2.5 V is sequentially applied to the word line WL2, WL3, . . . in pulses, and the unselected word line voltage of 6 V is applied to the other word lines in pulses.

As shown in FIG. 38, the word lines WL0, WL1, . . . and the bit lines BL1, BL2, . . . are wired in a lattice pattern in a memory cell array constituted by NAND strings. A pulse of 0 V, 6 V, 0 V are applied to portions of the word lines WL0, WL1, . . . , when the word lines are not selected. On the other hand, a pulse of 0 V, 2.5 V, 0 V is applied to the word line WL when it is selected. This means that a pulsed stress is applied to the memory cell as shown in FIG. 39B.

As shown in FIG. 39A, a pulsed stress is applied to a memory cell array with a high program voltage of 15 to 20 V when programming the memory cell array. Therefore, as shown in FIG. 39B, an application of the pulse of 0 V, 6 V, 0 V to the portions of the word lines WL0, WL1, . . . when they are not selected at the time of reading can be considered to be equivalent to writing based on a weak-pulsed programming voltage. Even with such a weak programming voltage, the memory cell may be programmed if the number of pulses is further increased. This is the major cause for the read disturbance.

When the number of memory cells in the NAND string is 32, a total of 32 pulses are applied to one memory cell, including a single pulse of 2.5 V when it is selected and 31 pulses of 6 V when it is not selected. If the number of memory cells of the NAND string is increased to 64 or more, the number of pulses applied to word lines at the time of the reading is further increased, so that it is considered that the influence of the read disturbance is increased.

As described above, in conventional NAND flash memories, the voltage of 6 V is applied to the unselected word lines in pulses and the voltage of 2.5 V is applied to the selected word line in pulses at the time of the reading. Conventional NAND flash memories including NAND strings having this configuration has a problem that the influence of the read disturbance increases as the number of strings increases.

In addition, as described above, when the unselected word line voltage is set to 6 V and the selected word line voltage is set to 2.5 V, a high voltage equal to or higher than a power source voltage Vcc needs to be prepared at the time of reading in order to use the unselected word line voltage of 6 V. When the power source voltage Vcc to be supplied as a power source for the memory is 3 V, a power source circuit is required to use the unselected word line voltage of 6 V, which generates a high voltage equal to or higher than 6V from the power source voltage of 3 V. Assuming that this kind of power source circuit is built with a charge pump circuit, the number of stages of charge pump or booster increases, which will cause a longer operation time with a larger power consumption.

SUMMARY

It is desired to provide a nonvolatile semiconductor memory device and a method of reading data from a nonvolatile semiconductor memory, with which it is possible to reduce an influence of read disturbance even when the number of strings increases, and also to achieve a high-speed operation with a reduced power consumption in the nonvolatile semiconductor memory device.

In one embodiment, there is provided a nonvolatile semiconductor memory device comprising: a string including a plurality of memory cells connected in series, each of the memory cells having a field effect transistor that stores information in a nonvolatile manner; a bit line connected to one end of the string; a source line connected to other end of the string; a plurality of word lines each connected to an associated one of gate electrodes of the field effect transistors; a word driver that drives the word lines; and a first power source line and a second power source line that supply a first voltage and a second voltage to the word driver, respectively, wherein the first voltage is a voltage between a third voltage of a first one of the field effect transistors that stores first information and a fourth voltage of a second one of the field effect transistors that stores second information, the second voltage is a voltage having an absolute value larger than absolute values of the first to third voltages, the word driver supplies the second voltage to the word lines in a ready time when the string is not accessed, and the word driver supplies the first voltage to a gate electrode of a target field effect transistor to be accessed among the field effect transistors and supplies the second voltage to gate electrodes of other field effect transistors not to be accessed, in a read time when the string is to be accessed.

In another embodiment, there is provided a method of controlling a nonvolatile semiconductor memory device comprising: receiving from outside a command that reads data from a memory cell; shifting (transitioning) a voltage of a first word line corresponding to a first memory cell to be accessed as a target for reading data from a second voltage to a first voltage having an absolute value smaller than an absolute value of the second voltage, in response to the command; and maintaining voltages of a plurality of second word lines corresponding to a plurality of second memory cells connected to the first memory cell in series to the second voltage, in response to the command.

In a still another embodiment, there is provided a memory system comprising: a nonvolatile semiconductor memory device; and a controller that controls the nonvolatile semiconductor memory device, wherein the nonvolatile semiconductor memory device comprising: a string including a plurality of memory cells connected in series, each of the memory cells having a field effect transistor that stores information in a nonvolatile manner; a bit line connected to one end of the string; a source line connected to other end of the string; a plurality of word lines each connected to an associated one of gate electrodes of the field effect transistors; a word driver that drives the word lines; and a first power source line and a second power source line that supply a first voltage and a second voltage to the word driver, respectively, wherein the first voltage is a voltage between a third voltage of a first one of the field effect transistors that stores first information and a fourth voltage of a second one of the field effect transistors that stores second information, the second voltage is a voltage having an absolute value larger than absolute values of the first to third voltages, the word driver supplies the second voltage to the word lines in a ready time when the string is not accessed, and the word driver supplies the first voltage to a gate electrode of a target field effect transistor to be accessed among the field effect transistors and supplies the second voltage to gate electrodes of other field effect transistors not to be accessed, in a read time when the string is to be accessed.

According to the present invention, the voltage of the unselected word line is fixed to a first predetermined voltage, and when selecting a word line, a voltage of the word line is configured to be set to a second predetermined voltage. This makes it possible to reduce an influence of the read disturbance at the time of reading. Furthermore, according to the present invention, even when a voltage in a range from a power source voltage Vcc to a ground voltage Vss or a voltage over the power source voltage Vcc is required at the time of reading, it becomes a voltage about 1.5 times an absolute value of the power source voltage Vcc. Therefore, a voltage step-up circuit having a large number of stages is not required, and as a result, it is possible to reduce an operation time and achieve a low power consumption.

BRIEF DESCRIPTION OF THE DRAWINGS

The above features and advantages of the present invention will be more apparent from the following description of certain preferred embodiments taken in conjunction with the accompanying drawings, in which:

FIGS. 7A and 7B are explanatory diagrams of a case when memory cells with a desired threshold value are formed in a depletion MOS transistor;

DETAILED DESCRIPTION OF THE EMBODIMENTS

Exemplary embodiments of the present invention will be explained below in detail with reference to the accompanying drawings. In the following descriptions, an example in which a NAND flash memory is applied to the present invention is explained; however, the present invention is not limited to NAND flash memories, and memories of other modes can be also applicable to the invention, and these are also included in the scope of the present invention.

First Embodiment

<1-1. Overall Configuration>

Figure 1:
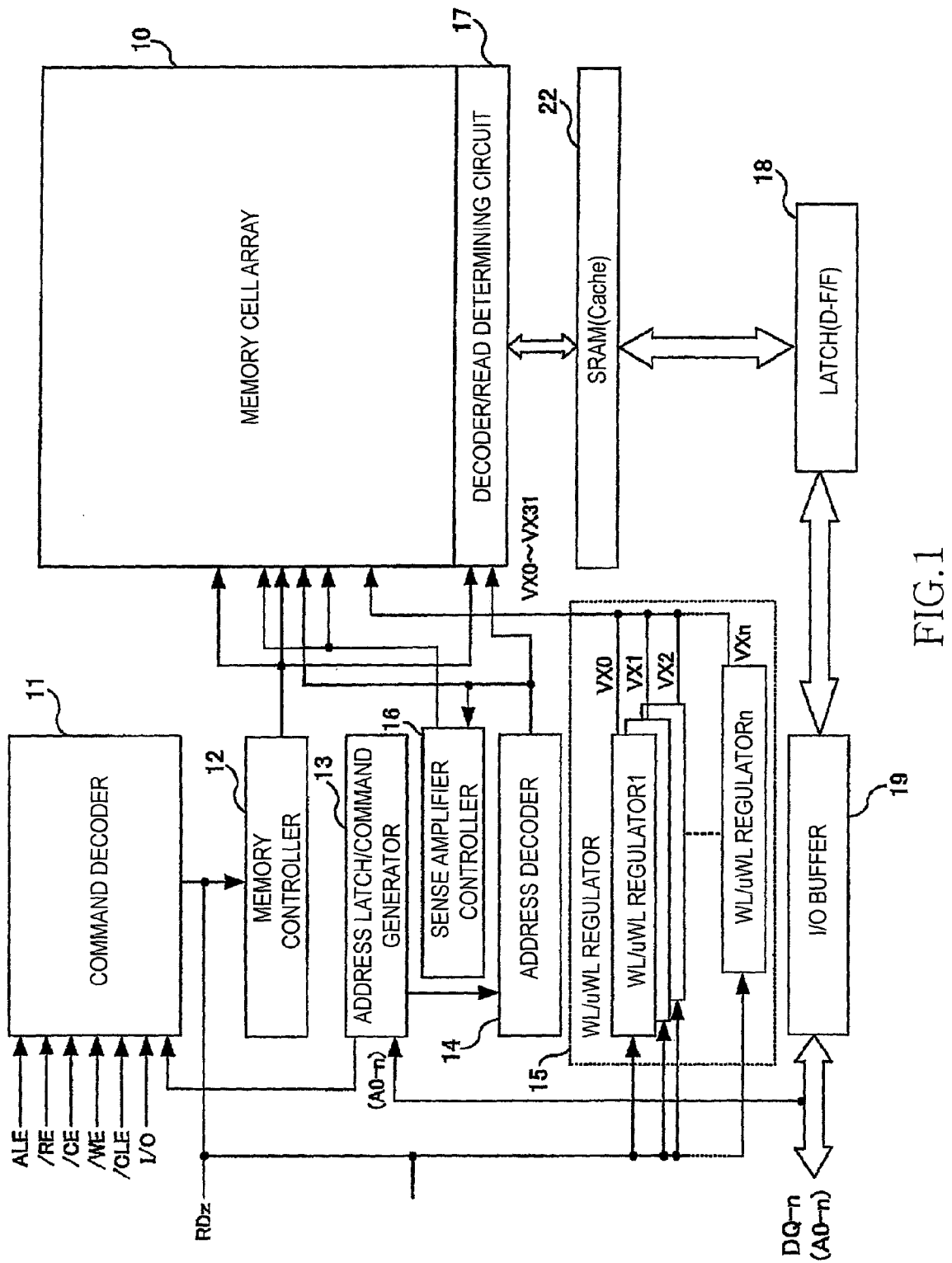
FIG. 1 is a block diagram showing a configuration of a first embodiment of the present invention.
Figure 2:
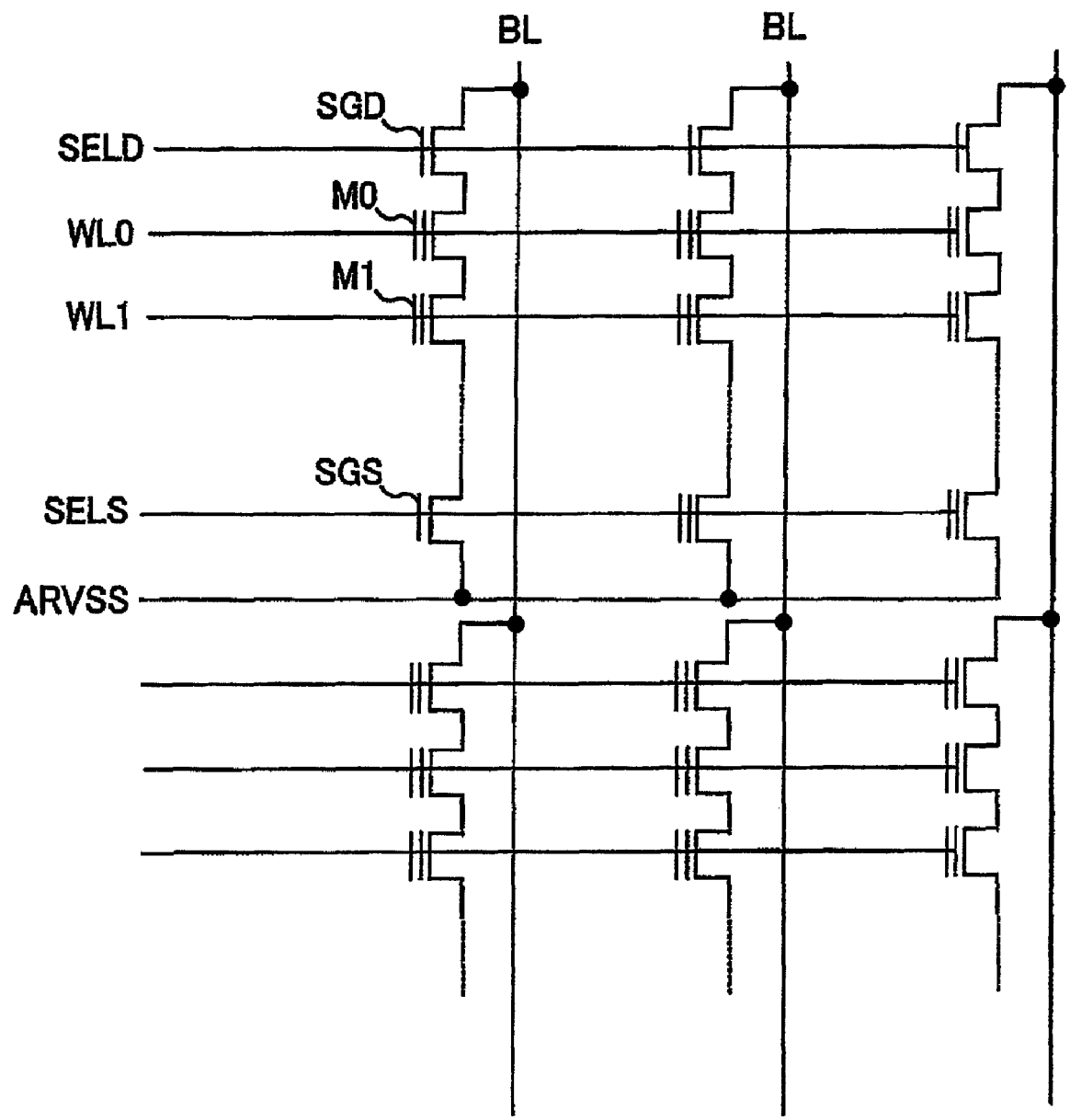
FIG. 2 is an explanatory diagram of NAND strings according to the first embodiment.

FIG. 1 is a block diagram showing an overall configuration of a NAND flash memory according to a first embodiment of the present invention. In FIG. 1, a memory cell array 10 includes a plurality of NAND strings. As shown in FIG. 2, each of the NAND strings is configured with memory cells M0, M1, . . . connected in series and select transistors SGD and SGS respectively connected to both ends. The drain of the select transistor SGD is connected to a bit line BL, and the source of the select transistor SGS is connected to a common source line ARVSS. In each of the NAND strings, the gates of the memory cells M0, M1, . . . arranged in a horizontal direction are commonly connected to word lines WL0, WL1, . . . , respectively. The gate of the select transistor SGD is connected to a selected signal line SELD. The gate of the select transistor SGS is connected to the selected signal line SELS.

As shown FIG. 1, various commands are input to a command decoder 11, such as an address latch enable signal ALE, a read enable signal /RE, a chip enable signal /CE, a write enable signal /WE, a latch enable signal /CLE, and an input/output signal I/O. The command decoder 11 decodes theses commands outputs signals obtained by decoding the commands to a memory controller 12. The memory controller 12 performs a control of each part based on an output of the command decoder 11.

An address is supplied to an address latch/command generator 13. The address supplied to the address latch/command generator 13 is then supplied to an address decoder 14 and the command decoder 11.

The address decoder 14 decodes an input address to determine a memory cell to be accessed on the memory cell array 10.

A WL/uWL regulator 15 generates a selected word line voltage and an unselected word line voltage at the time of reading, which is arranged for each word line. In FIG. 1, the WL/uWL regulator 15 is represented as corresponding to n word lines (WL/uWL regulator 1 to WL/uWL regulator n). Word line voltages from the WL/uWL regulator 1 to WL/uWL regulator n are supplied to word lines WL0 to WLn of the memory cell array 10 through vertical signal lines VX0 to VXn, respectively.

A sense amplifier controller 16 controls sense amplifiers arranged in the memory cell array 10.

When reading data from the memory cell array 10, a decoder/read determining circuit 17 determines data from a read signal read from the memory cell array 10. This data is output to outside through an SRAM 22, a latch 18, and an I/O buffer 19. The SRAM 22 stores therein the data, and the latch 18 temporarily latches the data. Systems for storing the data in the SRAM 22 and temporarily latching the data in the latch 18 can be changed as appropriate for each product.

In the NAND flash memory according to the first embodiment shown in FIG. 1, the WL/uWL regulator 15 is provided for setting the word line voltage at the time of reading. When reading data from the memory cell array 10, a voltage of an unselected word line is fixed to a predetermined voltage VPPL (the ground voltage Vss (0 V) in this embodiment), and when selecting a memory cell, a voltage of the word line is lowered to a predetermined voltage VREAD (−3.5 V in this embodiment) by the WL/uWL regulator 15.

A read mode signal RDz is output from the command decoder 11, by which the WL/uWL regulator 15 is triggered. With this operation, the voltage of the unselected word line among the word lines WL0 to WLn is fixed to VPPL (the ground voltage Vss (0 V)). Therefore, when selecting a memory cell, only a voltage of a word line of a selected memory cell is lowered to VREAD (−3.5 V) by the WL/uWL regulator 15, while voltages of word lines of unselected memory cells are remained to be fixed to VPPL (the ground voltage Vss (0 V)).

In this manner, when reading data from a memory cell in the first embodiment, it is configured that the voltage of the unselected word line is fixed to the predetermined voltage VPPL (the ground voltage Vss (0 V)), and at the time of selecting a word line, only the voltage of the selected word line is lowered to the predetermined voltage VREAD (−3.5 V). This makes it possible to reduce the influence of the read disturbance at the time of reading. Furthermore, in the first embodiment, a high voltage way over the power supply voltage Vcc (3 V) supplied as the power source for the memory is not necessary to read the data. Therefore, a voltage step-up circuit having a large number of stages is not required, and as a result, it is possible to reduce the operation time and at the same time, to improve the energy efficiency and to achieve a reduction of the power consumption.

<1-2. Setting Word Line Voltage in Each Operation Mode>

As described above, when reading data from a memory cell in the NAND flash memory according to the first embodiment, it is configured that the voltage of the unselected word line is fixed to the predetermined voltage VPPL (the ground voltage Vss (0 V)), and at the time of selecting a word line, the voltage of the selected word line is lowered to the predetermined voltage VREAD (−3.5 V). An example of this mode is that, upon entering a read operation mode, voltages of all the word lines WL0 to WLn are set to the unselected word line voltage VPPL (the ground voltage Vss (0 V)), and only when a memory cell of a word line is selected, the voltage of the word line is set to the selected word line voltage VREAD (−3.5 V).

The NAND flash memory is also used in various mode states, such as programming and erasing, as well as the read state. In the first embodiment, the word line voltage is fixed to the unselected word line voltage VPPL (the ground voltage Vss (0 V)) not only when the read state starts but also when there is a transition from various operation states to a ready state.

Figure 3:
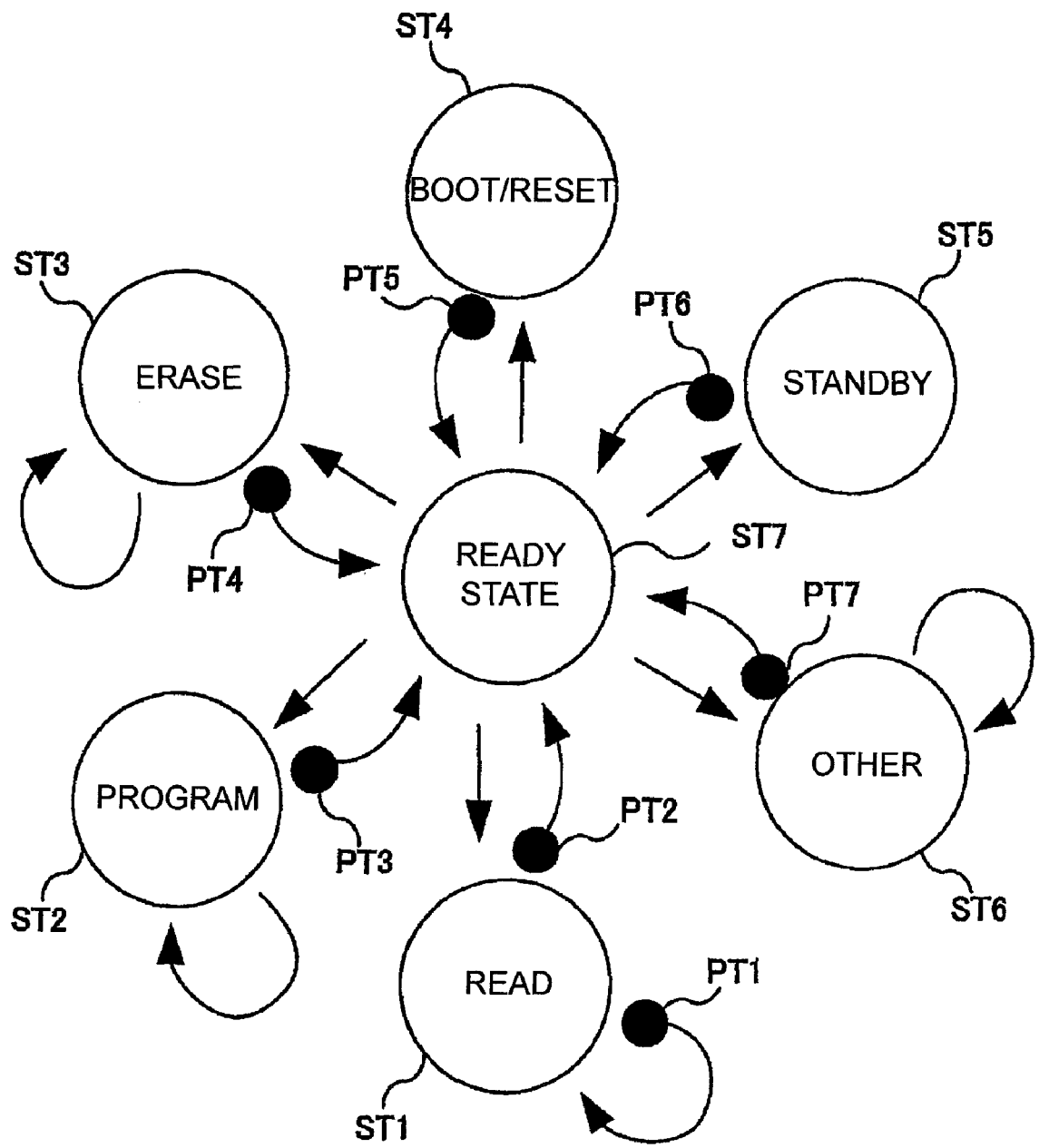
FIG. 3 is a state transition diagram for explaining the first embodiment.

FIG. 3 is an operation state transition diagram of the NAND flash memory according to the first embodiment. Operation states of the NAND flash memory according to the first embodiment include a read operation state ST1, a programming operation state ST2, an erase operation state ST3, a boot/reset operation state ST4, a standby operation state ST5, and other operation state ST6. The operation states also include a ready state ST7 between transitions among the operation states. The ready state ST7 is a state when any one of the commands can be received.

In FIG. 3, arrows indicate that, after an input of a command, a destination operation states is already determined. After the various operation states, it is also indicated that the state returns to the ready state ST7.

Also in FIG. 3, PT1 to PT7 indicate timings to set voltages of all the word lines WL to the unselected word line voltage VPPL (the ground voltage Vss (0 V)). As shown in FIG. 3, in the NAND flash memory according to the first embodiment, when the read operation starts with a read command, voltages of unselected word lines in a selected block are set to the unselected word line voltage VPPL at the timing PT1 indicated by a block dot. Furthermore, when entering the ready state ST7 after having completed all the operation states ST2 to ST6 including the read operation state ST1, all the word lines are set to the unselected word line voltage VPPL (the ground voltage Vss (0 V)) at the timings PT2 to PT7 indicated by block dots just before entering the ready state ST7.

Meanwhile, when an operation that does not go through the ready state ST7 is performed in a consecutive manner in the erase operation state ST3, the programming operation state ST2 or the like, a process of setting the voltages of all the word lines to the unselected word line voltage VPPL (the ground voltage Vss (0 V)) is not performed. When the operation of the ready state ST7 is performed in a consecutive manner, the voltages of all the word lines are once returned to the unselected word line voltage VPPL (the ground voltage Vss (0 V)).

As described above, upon entering the read operating state in the first embodiment, all the word line voltages are fixed to the unselected word line voltage VPPL (the ground voltage Vss (0 V)), and at the same time, unselected word line voltage is fixed to the predetermined voltage VPPL (the ground voltage Vss (0 V)) when there is a transition from various operations states to the ready state. This makes it possible to reduce a time for a verifying operation or the like. In a second embodiment of the present invention described later, the voltage VPPL is the power source voltage Vcc, and, for example, in a 3-V flash memory product, it is explained as 3V. Although some conventional NAND flash memories perform a discharge operation after completing a programming operation or an erase operation, an operation different from that of the conventional NAND flash memory is performed in the first and second embodiments by fixing all the word line voltages to the unselected word line voltage VPPL upon entering the read operation state and fixing the unselected word line voltage to the predetermined voltage VPPL when there is a transition from various operation states to the ready state.

<1-3. Threshold Value of Memory Cell According to First Embodiment>

The threshold value of a memory cell in the NAND flash memory according to the first embodiment is explained next. In the NAND flash memory according to the embodiments of the present invention, the threshold value of the memory cell is determined such that the influence of the read disturbance is reduced and a shortening of the operation time and a reduction of the power consumption can be achieved. Such a threshold value of the memory cell is explained next.

As shown in FIG. 2, the NAND string is configured by connecting the memory cells M0, M1, in series and respectively connecting the select transistors SGD and SGS to both ends. The number of memory cells (the number of strings) is, for example, 32. A memory cell having a floating gate is shown in FIG. 2 as an example of the memory cell having an area for storing data by storing a charge.

Figure 4:
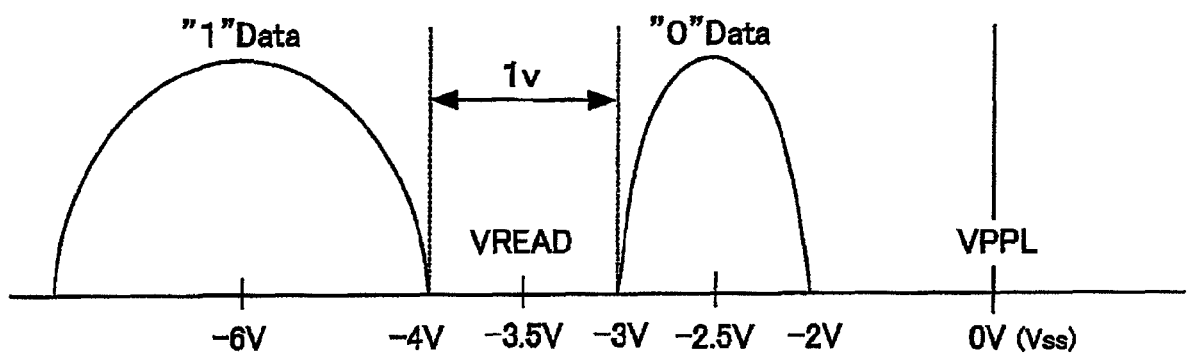
FIG. 4 is a graph for explaining a distribution of threshold values of memory cells in the first embodiment.

FIG. 4 shows a distribution of threshold values of the memory cells M0, M1, . . . in the NAND flash memory according to the first embodiment. In the example shown in FIG. 4, the threshold values of the memory cells are distributed around −6 V in the case of data "1" and around −2.5 V in the case of data "0". Therefore, when a voltage of, for example, 0 V is applied to the word lines WL0, WL1, . . . , all the memory cells M0, M1, . . . are switched on. When a voltage of, for example, −3.5 V is applied to the word lines WL0, WL1, . . . , the memory cells M0, M1, . . . are switched off if the memory cells are programmed and switched on if the memory cells are not programmed. Therefore, in this case, the selected word line voltage VREAD is −3.5 V, and the unselected word line voltage VPPL is the ground voltage Vss (0 V).

As described above, in the case of the first embodiment, the threshold voltage of the memory cell becomes equal to or lower than 0 V. Although data needs to be rewritten to a voltage equal to or higher than 0 V for a NOR memory cell, it does not cause any problem in the NAND memory cell even if the threshold voltage of the memory cell is set to a voltage equal to or lower than 0 V.

Although explanations are given with the unselected word line voltage set to the ground voltage or 0 V in the first embodiment, as can be understood from FIG. 4, this voltage can be a voltage near 0 V or a voltage in a range from +0.2 to −0.2 V, as long as it is higher than the threshold value for the data "0". The unselected word line voltage can be changed as appropriate in a proper range higher than the threshold value for the data "0". Likewise, although explanations are given with the selected word line voltage set to −3.5 V, as can be understood from FIG. 4, this voltage can be a voltage near −3.5 V or a voltage in a range from −3.3 to −3.7 V, as long as it is between the threshold value for the data "1" and the threshold value for the data "0". This means that it is possible to set the selected word line voltage to −3.0 V by shaping a value of a lower edge of the threshold value of the data "0" (−3 V in FIG. 4) in the threshold distribution of the data "0" and setting this value to, for example, −2.5 V. The selected word line voltage can be changed as appropriate in a proper range between the threshold value for the data "1" and the threshold value for the data "0".

An unselected word line voltage and a selected word line voltage that are different from the voltage in the first embodiment are explained below while referring to a flash memory product.

In the case of a 1.8-V flash memory product, it is assumed that the unselected word line voltage is set to, for example, 1.8 V. The unselected word line voltage of the 1.8-V flash memory product can be changed as appropriate in a proper range higher than the threshold value for the data "0". An example of the unselected word line voltage of the 1.8-V flash memory product includes a voltage near 1.8 V, for example, a voltage in a range from +2.0 to +1.6 V. Furthermore, it is assumed that the selected word line voltage of the 1.8-V flash memory product is set to, for example, 0 V or −1.2 V. That is, the selected word line voltage of the 1.8-V flash memory product can be changed as appropriate in a proper range between the threshold value for the data "1" and the threshold value for the data "0". An example of the selected word line voltage of the 1.8-V flash memory product includes a value near 0 V or −1.2 V, for example, a voltage in a range from +0.2 to −0.2 V or from −1.0 to −1.4 V. In the same manner as that of the first embodiment, also in the case of the 1.8-V flash memory product, the selected word line voltage can be set to still another voltage by shaping a value of a lower edge of the threshold value of the data "0" in the threshold distribution of the data "0". On that basis, the selected word line voltage of the 1.8-V flash memory product can be changed as appropriate in a proper range between the threshold value for the data "1" and the threshold value for the data "0".

Besides the unselected word line voltage and the selected word line voltage described above, a configuration is acceptable in which the unselected word line voltage and the selected word line voltage are set to a voltage in a selectable range from 4.5 to −4.5 V (or −3.0 V) in a range of 1.5 times an absolute value of the power supply voltage. As described later, if reading is performed with a voltage in a range of 1.5 times the absolute value of the power supply voltage, the charge pump circuit or the booster circuit can be realized with about two stages with an efficiency of about 80%. Therefore, there are substantially no degradation of the operation speed and the energy efficiency.

It is preferable to take a configuration in which the unselected word line voltage is set to a positive voltage, particularly to a voltage lower than the power supply voltage, and the selected word line voltage is set to a negative voltage.

Although it is expected that a 1.5-V flash memory product and a 1.2-V flash memory product in coming in the market in the near future, even in these cases, it is assumed that the unselected word line voltages are set to 1.5 V and 1.2 V, respectively, and the selected word line voltages are set to −1.5 V and −1.8 V, respectively, so that a voltage difference between the unselected word line voltage and the selected word line voltage becomes 3 V. However, in the present invention, the explanations for the first embodiment and the 1.8-V flash memory product can be applied to the cases of the 1.5-V flash memory product and the 1.2-V flash memory product and they are handled as to have a predetermined voltage difference between the unselected word line voltage and the selected word line voltage. The same is true for any flash memories with a voltage other than the above values.

Figure 5:
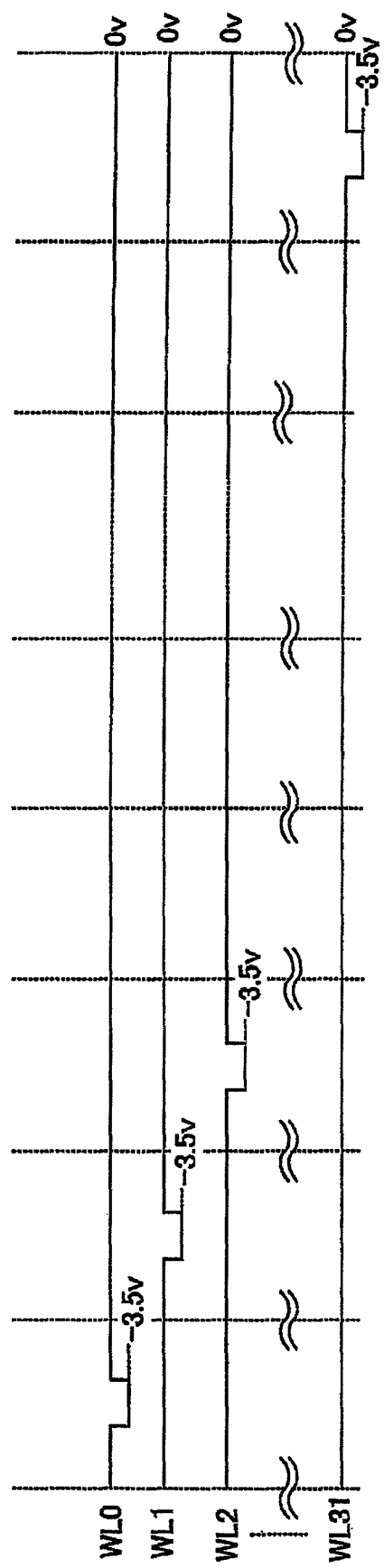
FIG. 5 is an explanatory diagram of a voltage waveform of word lines in the first embodiment.

FIG. 5 is a waveform diagram showing a voltage waveform of each of word lines when the selected word line voltage VREAD is set to −3.5 V and the unselected word line voltage VPPL is set to the ground voltage Vss (0 V).

As shown in FIG. 5, when entering the read operation state, all word lines WL0, WL1, . . . , WL31 are already set to the unselected word line voltage of 0 V. When the word line WL0 is selected, a voltage of the word line WL0 is lowered to the selected word line voltage of −3.5 V, and when data reading is completed, the voltage of the word line WL0 is returned to 0 V. Subsequently, when the word line WL1 is selected, a voltage of the word line WL1 is lowered to the selected word line voltage of −3.5 V, and when the data reading is completed, the voltage of the word line WL1 is returned to 0 V. Voltages of the word lines WL2, . . . , WL31 are then sequentially lowered to the selected word line voltage of −3.5 V, and when the reading is completed, the voltages of the word lines WL2, . . . , WL31 are returned to 0 V. During this time, voltages of the other unselected word lines are constantly maintained to 0 V.

In this manner, in the first embodiment, regardless of the number of cells in a string, a voltage of a memory cell is lowered to −3.5 V one time when it is selected, and is constantly remained to 0 V in the other periods. Therefore, a pulsed voltage is not applied to the word line at the time of the reading, and furthermore, the voltage applied to the memory cell is substantially constant at 0 V. As a result, there is substantially no influence of the read disturbance.

As described above, in the read operation state in the first embodiment, it is configured that all the word line voltages are set to the unselected word line voltage VPPL (the ground voltage Vss (0 V)), and when a memory cell of a word line is selected, the word line voltage of the selected memory cell is lowered to the selected word line voltage VREAD (−3.5 V). Such threshold values can be set in the following manner.

Figure 6A:
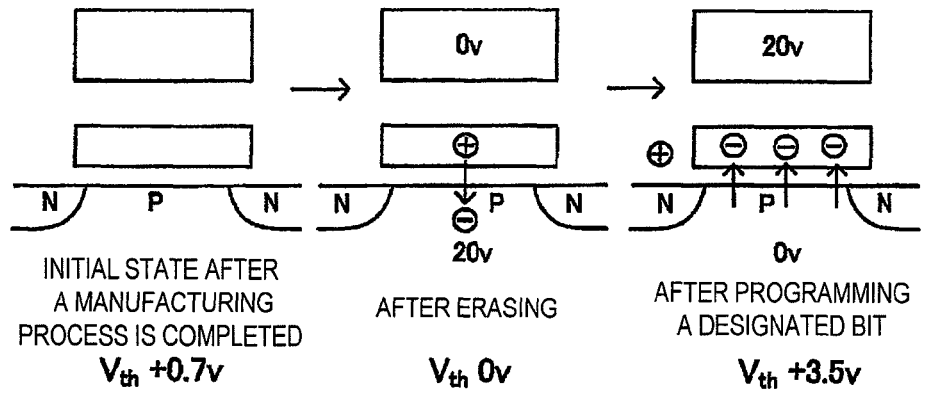
FIGS. 6A to 6C are explanatory diagrams of a case when memory cells with a desired threshold value are formed in an enhancement MOS transistor.
Figure 6B:
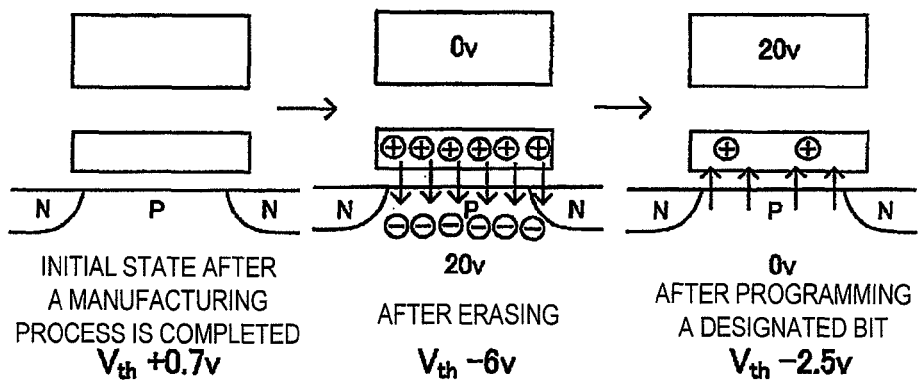
Figure 6C:
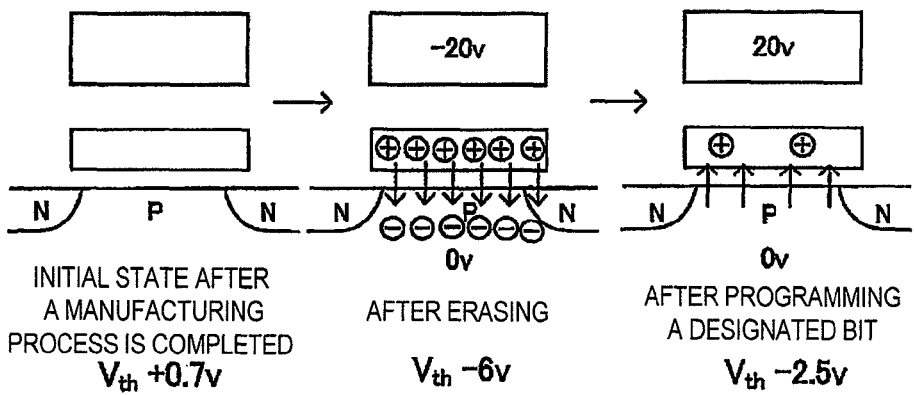

FIGS. 6A to 6C are explanatory diagrams of settings of the threshold values when the memory cells M0, M1, . . . are formed in an enhancement MOS transistor.

Figure 36:
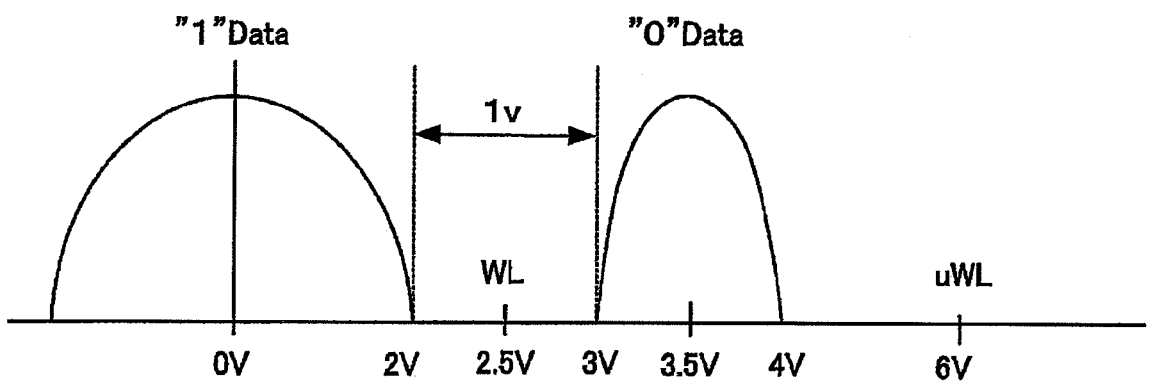
FIG. 36 is a graph for explaining a distribution of threshold values of memory cells in the conventional NAND strings.
Figure 37:
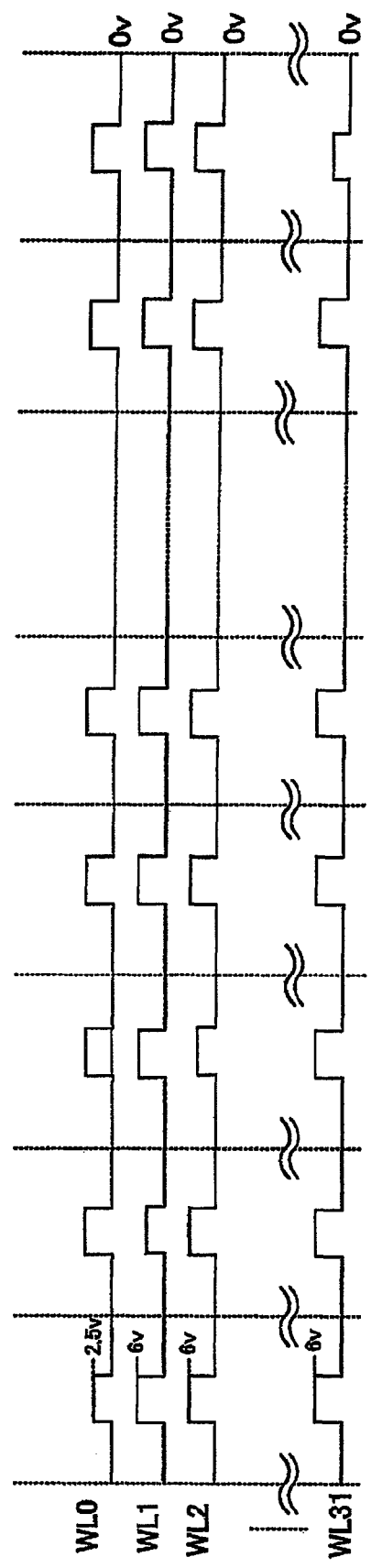
FIG. 37 is a waveform diagram showing voltages of word lines in a conventional NAND flash memory.
Figure 38:
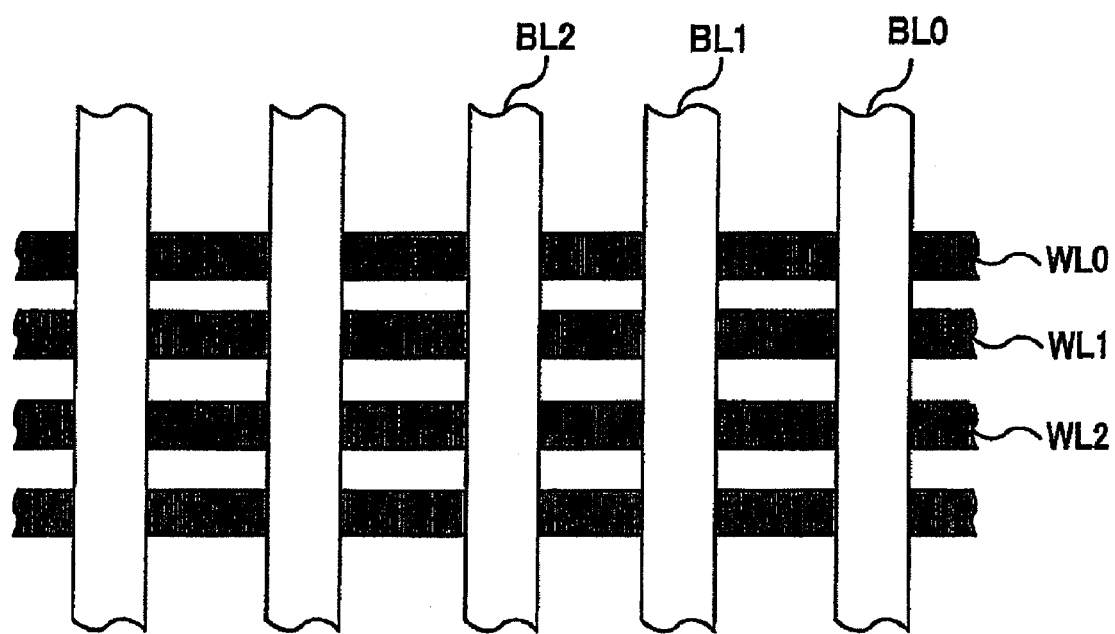
FIG. 38 is an explanatory diagram of a cause of read disturbance.
Figure 39A:
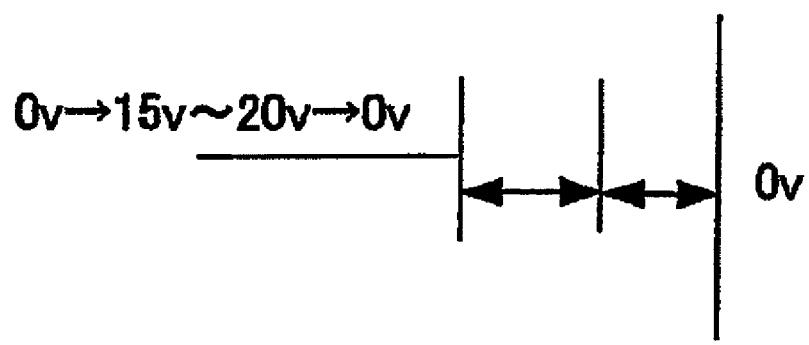
FIGS. 39A and 39B are explanatory diagrams of a cause of read disturbance.
Figure 39B:
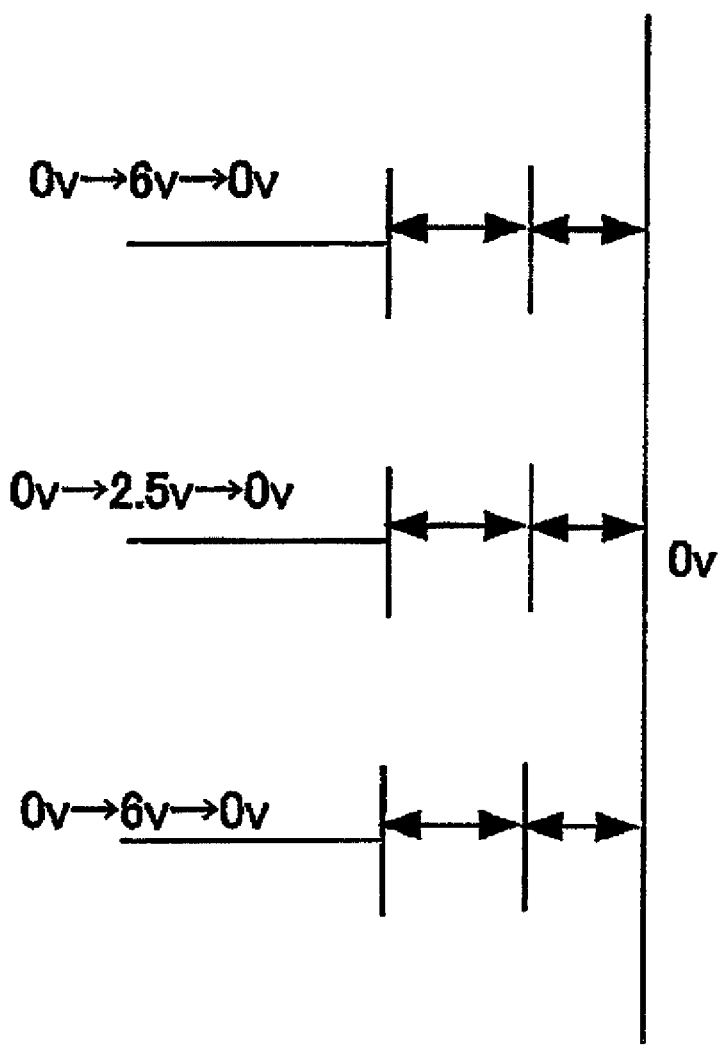

FIG. 6A shows an example of forming a transistor of a memory cell in which the selected word line voltage is 2.5 V and the unselected word line voltage is 6 V (see FIG. 36). In this case, a threshold value Vth at the time of erasing is distributed around 0 V, and the threshold value Vth at the time of programming is distributed around 3.5 V.

In the case of the enhancement MOS transistor, as shown in FIG. 6A, the threshold value Vth of the memory cell in an initial state after a manufacturing process is completed is +0.7 V. The gate is set to 0 V and a high voltage of, for example, 20 V is applied to a substrate and a P-type well, by which erasing is performed. With this operation, electrons are emitted from the floating gate to the P-type well by an FN tunnel current, and the threshold value Vth drops to, for example, 0 V. At the time of programming, a high voltage of, for example, 20 V is applied to the gate, and the P-type well is set to, for example, 0 V. With this operation, electrons are injected from the P-type well to the floating gate, and the threshold value Vth rises to, for example, +3.5 V. In this manner, in the example shown in FIG. 6A, the threshold value Vth at the time of erasing becomes 0 V, and the threshold value Vth at the time of programming becomes 3.5 V.

FIG. 6B shows an example of forming a transistor of a memory cell, as shown in FIG. 4, in which the selected word line voltage is −3.5 V and the unselected word line voltage is 0 V. In the case of the enhancement mode, as shown in FIG. 6B, the threshold value Vth of the memory cell in an initial state after a manufacturing process is completed is +0.7 V. The gate is set to 0 V and a high voltage of, for example, 20 V is applied to a substrate and a P-type well, by which erasing is performed. With this operation, electrons are emitted from the floating gate to the P-type well. At this time, by controlling the number of voltage pulses and the like to be applied, if a plurality of electrons are emitted from the floating gate, the threshold value Vth drops to, for example, −6 V. At the time of programming, a high voltage of, for example, 20 V is applied to the gate, and the P-type well is set to, for example, 0 V. With this operation, electrons are injected from the P-type well to the floating gate, and the threshold value Vth rises to, for example, 0 V. In this manner, in the example shown in FIG. 6B, the threshold value Vth at the time of erasing becomes −6 V, and the threshold value Vth at the time of programming becomes −2.5 V.

FIG. 6C shows another example of forming a transistor of a memory cell, as shown in FIG. 4, in which the selected word line voltage is set to −3.5 V and the unselected word line voltage is set to 0 V. In this example, the gate is set to −20 V, and a voltage of 0 V is applied to the P-type well. With this operation, electrons are emitted from the floating gate to the P-type well, and the threshold value Vth drops to −6 V. At the time of programming, a high voltage of, for example, 20 V is applied to the gate, and the P-type well is set to 0 V. With this operation, electrons are injected from the P-type well to the floating gate, and the threshold value Vth rises to 0 V. In this manner, in the example shown in FIG. 6C, the threshold value Vth at the time of erasing becomes −6 V, and the threshold value Vth at the time of programming becomes −2.5 V. In addition, it also suffices that a voltage of 10 V is applied to the P-type well and a voltage of −10 V is applied to the gate at the time of erasing.

If the memory cells of the NAND flash memory are configured with an enhancement MOS transistor structure having the same threshold value formed in the above manner, for example, it becomes easy to control the memory cells.

FIGS. 7A and 7B are explanatory diagrams of settings of the threshold values when the memory cells M0, M1, . . . are formed in a depletion MOS transistor.

FIG. 7A shows an example of forming a transistor of a memory cell in which the selected word line voltage is 2.5 V and the unselected word line voltage is 6 V. In this case, the threshold value Vth at the time of erasing is distributed around 0 V and the threshold value Vth at the time of programming is distributed around 3.5 V.

In the case of the depletion MOS transistor, as shown in FIG. 7A, the threshold value Vth of the memory cell in an initial state after a manufacturing process is completed is −1 V. The gate is set to 0 V and a high voltage of, for example, 20 V is applied to a P-type well, by which erasing is performed. With this operation, the threshold value Vth drops to, for example, −2 V. At the time of programming, a high voltage of, for example, 20 V is applied to the gate, and the P-type well is set to, for example, 0 V. With this operation, electrons are injected from the P-type well to the floating gate, and the threshold value Vth rises gradually up to, for example, +3.5 V. In this manner, in the example shown in FIG. 7A, the threshold value Vth at the time of erasing becomes −2 V, and the threshold value Vth at the time of programming becomes 3.5 V.

FIG. 7B shows an example of forming a transistor of a first memory cell, as shown in FIG. 4, in which the selected word line voltage is −3.5 V and the unselected word line voltage is 0 V. In the case of the depletion mode, as shown in FIG. 7B, the threshold value Vth of the memory cell in an initial state after a manufacturing process is completed is −1 V. The gate is set to 0 V and a high voltage of, for example, 20 V is applied to a P-type well, by which erasing is performed. With this operation, electrons are emitted from the floating gate to the P-type well. At this time, by controlling the number of voltage pulses and the like to be applied, the threshold value Vth drops to, for example, −6 V. At the time of programming, a high voltage of, for example, 20 V is applied to the gate, and the P-type well is set to, for example, 0 V. With this operation, electrons are injected from the P-type well to the floating gate, and the threshold value Vth rises to, for example, −2.5 V. In this manner, in the example shown in FIG. 7B, the threshold value Vth at the time of erasing becomes −6 V, and the threshold value Vth at the time of programming becomes −2.5 V.

As describe above, the threshold value can be adjusted in a memory cell having a floating gate. The select transistors SGD and SGS for constituting the NAND string shown in FIG. 2 can be configured with a MOS transistor having the same floating gate as that of the transistor of the memory cell as well as with a normal MOS transistor without having a floating gate. Configuring the select transistors SGD and SGS with the MOS transistor having the same floating gate as that of the transistor of the memory cell, it is possible to form the select transistors SGD and SGS at the same process with the memory cells M0, M1, . . . , and at the same time, it is possible to adjust the threshold value.

If the memory cells of the NAND flash memory are configured with a depletion MOS transistor structure having the same threshold value formed in the above manner, for example, it becomes easy to control memory cells.

Figure 8A:
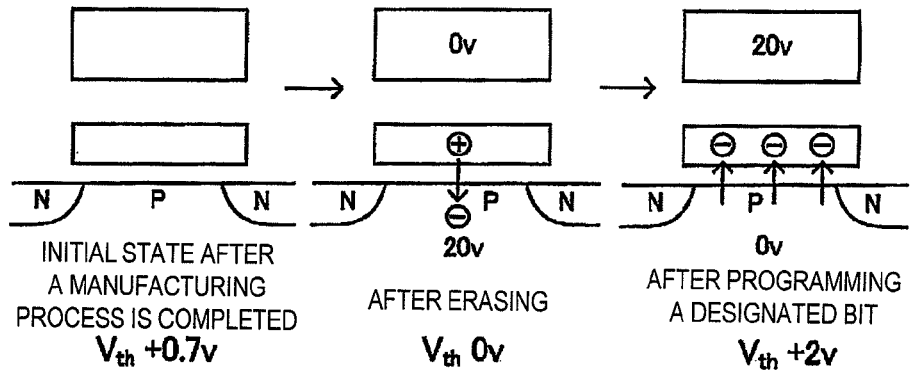
FIGS. 8A to 8C are explanatory diagrams of a case when a select transistor with a desired threshold value is formed with an enhancement MOS transistor having a floating gate.
Figure 8B:
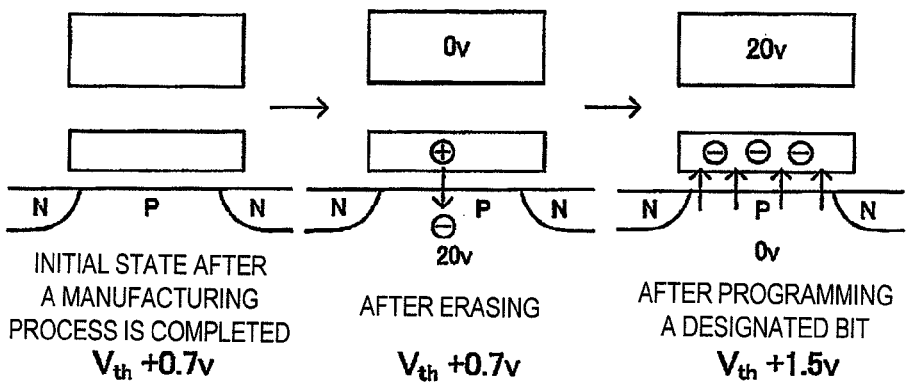
Figure 8C:
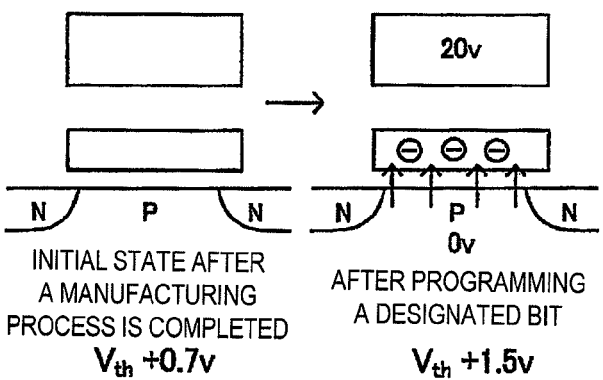

FIGS. 8A to 8C show an example of forming a select transistor with an enhancement MOS transistor having a floating gate.

FIG. 8A shows an example of forming the select transistor having the threshold value of 2 V with an enhancement MOS transistor having a floating gate. In the case of the enhancement mode, as shown in FIG. 8A, the threshold value Vth of the memory cell in an initial state after a manufacturing process is completed is +0.7 V. The gate is set to 0 V and a high voltage of, for example, 20 V is applied to a substrate and a P-type well, by which erasing is performed. At this time, by controlling the number of voltage pulses and the like to be applied, the threshold value Vth is set to 0 V. With this operation, electrons are emitted from the floating gate to the P-type well, and the threshold value Vth drops to 0 V. A voltage of, for example, 20 V is then applied to the gate, and the P-type well is set to 0 V, by which programming is performed. With this operation, electrons are injected from the P-type well to the floating gate, and the threshold value Vth rises. In this manner, the select transistor having the threshold of 2.0 V is formed.

FIG. 8B shows an example of forming the select transistor having the threshold value of 1.5 V with an enhancement MOS transistor having a floating gate.

In the case of the enhancement MOS transistor having a floating gate, as shown in FIG. 8B, it is desirable that the threshold value Vth of the memory cell in an initial state after a manufacturing process is completed, in which neither erasing nor programming is performed, is constant at +0.7 V. However, there is a fluctuation in the threshold voltage, so that the threshold voltage Vth of the memory cell may be +0.8 V and the like. In this situation, for example, the gate is set to 0 V and a high voltage of, for example, 20 V is applied to a P-type well, by which erasing is performed. With this operation, electrons are emitted from the floating gate to the P-type well, and the threshold value Vth drops. At this time, by controlling the number of voltage pulses and the like to be applied, the threshold value Vth of such a memory cell having the threshold value Vth of +0.8 V after erasing is set to +0.7 V. A voltage of, for example, 20 V is then applied to the gate of the memory cell of which the threshold value Vth is set to +0.7 V, and the P-type well is set to, for example, 0 V, by which programming is performed. With this operation, electrons are injected from the P-type well to the floating gate, and the threshold value Vth rises. In this manner, the select transistor having the threshold value of 1.5 V is formed.

The power source voltage Vcc of the NAND flash memory is 3 V. If the threshold value of the select transistor is 1.5 V, the threshold value is set to the middle of the ground voltage Vss (0 V) and the power source voltage Vcc (3 V), which is easy to use.

FIG. 8C shows another example of forming the select transistor having the threshold value of 1.5 V with an enhancement MOS transistor having a floating gate. In this example, a high voltage of, for example, 20 V is applied to the gate and the P-type well is set to, for example, 0 V without performing erasing, by which programming is performed. With this operation, electrons are injected from the P-type well to the floating gate, and the threshold value Vth rises. At this time, by controlling the number of voltage pulses and the like to be applied, the threshold value Vth is set to 1.5 V. In this manner, the select transistor having the threshold value of 1.5 V is formed. In this manner, if there is little fluctuation in the threshold value Vth of the memory cell in the initial state, the select transistor having the threshold value of 1.5 V can be formed only with programming without performing erasing.

If the select transistors of the NAND flash memory are configured with an enhancement MOS transistor structure having the same threshold value formed in the above manner, for example, it becomes easy to control the select transistors.

Figure 9A:
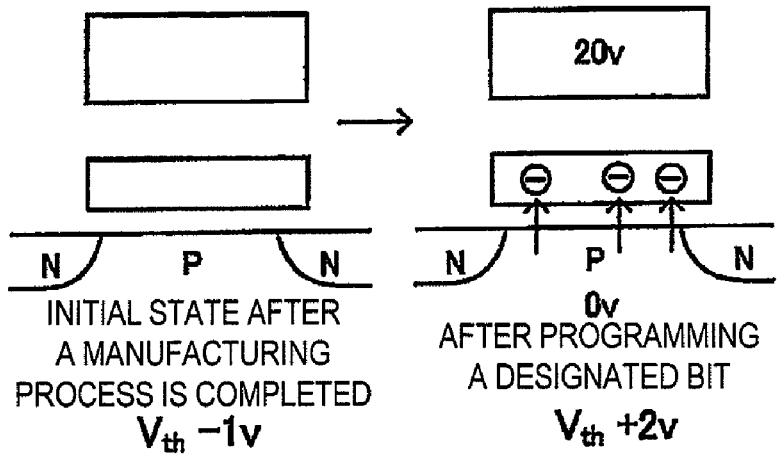
FIGS. 9A to 9C are explanatory diagrams of a case when a select transistor with a desired threshold value is formed with a depletion MOS transistor having a floating gate.
Figure 9B:
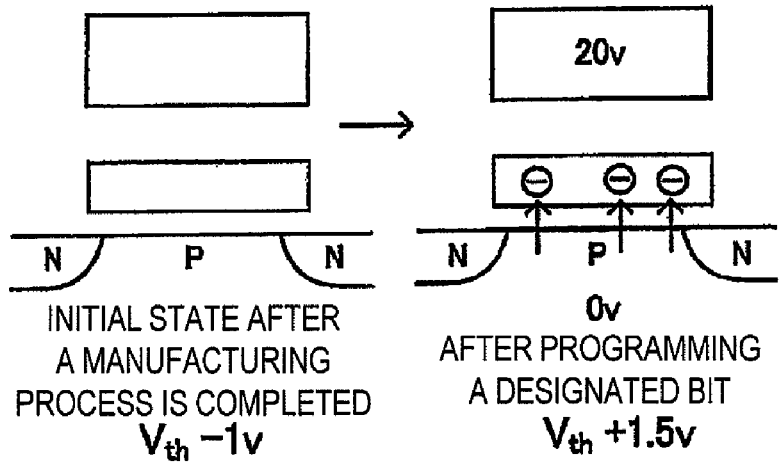
Figure 9C:
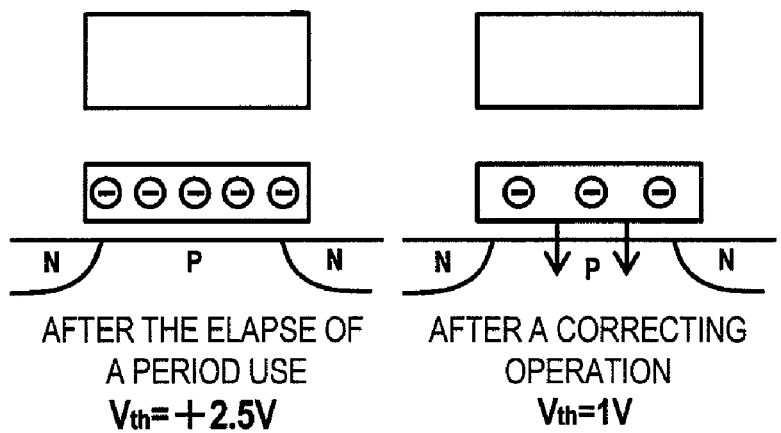

FIGS. 9A to 9C show an example of forming the select transistors SGD and SGS with depletion MOS transistors each having a floating gate.

FIG. 9A shows an example of forming the select transistor having the threshold value of 2 V with a depletion MOS transistor having a floating gate. In the case of the depletion mode, as shown in FIG. 9A, the threshold value Vth of the memory cell in an initial state after a manufacturing process is completed, in which neither erasing nor programming is performed, is −1 V. A high voltage of, for example, 20 V is then applied to the gate and a substrate and a P-type well are set to, for example, 0 V, by which programming is performed. With this operation, electrons are injected from the P-type well to the floating gate, and the threshold value Vth rises. In this manner, the select transistor having the threshold of 2.0 V is formed.

FIG. 9B shows an example of forming the select transistor having the threshold value of 1.5 V with a depletion MOS transistor having a floating gate. In the case of the depletion mode, as shown in FIG. 9B, the threshold value Vth of the memory cell in an initial state after a manufacturing process is completed, in which neither erasing nor programming is performed, is −1 V. A high voltage of, for example, 20 V is then applied to the gate and a substrate and a P-type well are set to, for example, 0 V, by which programming is performed. With this operation, electrons are injected from the P-type well to the floating gate, and the threshold value Vth rises. At this time, by controlling the number of voltage pulses and the like to be applied, the threshold value Vth is set to 1.5 V. In this manner, the select transistor having the threshold of 1.5 V is formed.

If the select transistors of the NAND flash memory are configured with a depletion MOS transistor structure having the same threshold value formed in the above manner, for example, it becomes easy to control the select transistors.

When adjusting the threshold values of the memory cells M0, M1, . . . , and the MOS transistors shown in FIGS. 6 to 9, each of voltages of the memory cells and controls gates of the MOS transistors can be set to a predetermined voltage by an X decoder shown in FIGS. 21 and 22 described later. The predetermined voltage is within the voltage settings described in the preceding twenty two paragraphs.

FIG. 9C shows a case to adjust the threshold voltage of a select transistor. Select transistors SGD,SGS are driven frequently in the same frequency with memory cells where even worse disturbing condition is anticipated because select transistors should be an enhancement type to cut the current of un-selected strings without gate bias voltage. This makes the threshold voltage gradually higher with read cycles. In addition, when the chip is in the programming cycle, the NAND string voltage goes up to 8 V for the program-inhibited string and a strong (8 V) reverse bias shows up for the select transistor. This makes the threshold voltage gradually lower by injection of holes by Band-to-Band tunneling phenomena. As a result, the threshold voltage of a select transistor is not stable in case the gate structure is the same with memory cells. This alteration happens more severely when the memory cells are so called charge-trapping type but floating gate types are not the exception. So an adjustment process (The memory controller 12) is added to decrease the threshold voltage of select transistor SGD and/or select transistor SGS by the same way with erasing or an adjustment process is added to increase the threshold voltage of select transistor SGD and/or select transistor SGS by the same with programming. The memory controller 12 performs the adjustment process (erase and program). Unlike the regular erasing process where a huge block is in the erasing condition, only the gate of select transistors are biased relatively negative to the source/drain/substrate to decrease the threshold voltage. An alternative method is to apply relatively high reverse bias condition to the source junction connected to the bit line to cause Band-to-Band hot-hole injection. The adjustment process could take place every time when power is fed to the chip or in the initializing process of the NAND chip.

<1-4. Read Timing in First Embodiment>

A read timing in the NAND flash memory according to the first embodiment is explained next. An outline of the read operation of the NAND flash memory is explained first.

Figure 10:
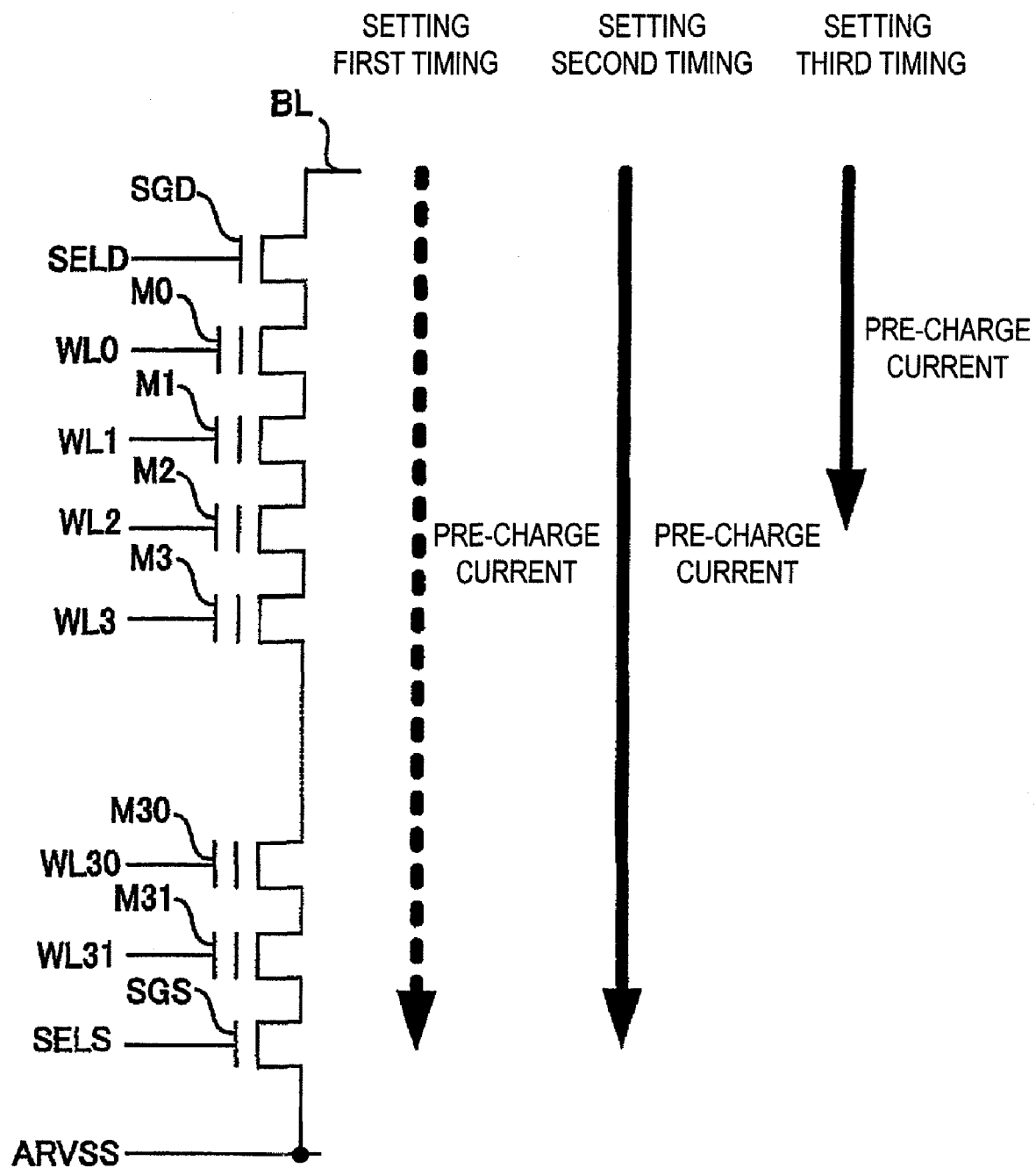
FIG. 10 is an explanatory diagram of pre-charge currents when respective timings are set.

When reading data from a NAND string shown in FIG. 10, the bit line BL is pre-charged, the select transistor SGD is made conductive, the unselected word line voltage is set to VPPL, the selected word line voltage is set to VREAD, and the select transistor SGS is made conductive. As described above, in the first embodiment, the selected word line voltage VREAD is +3.5 V and the unselected word line voltage VPPL is 0 V.

In FIG. 10, the memory cell M2 is selected so that a voltage of the word line WL2 is set to the selected word line voltage VREAD (−3.5 V) and voltages of the other word lines are set to the unselected word line voltage VPPL (the ground voltage Vss (0 V)).

With this configuration, a voltage of the bit line BL is changed according to whether the selected memory cell is programmed.

That is, when the voltages of the unselected word lines WL0, WL1, and WL3 to WL31 are set to VPPL (the ground voltage Vss (0 V)), the unselected memory cells M0, M1, and M3 to M31 are all switched on. Furthermore, when the word line voltage of the selected word line WL2 is set to VREAD (−3.5 V), the memory cell M2 is switched on if it is not programmed, and switched off if it is programmed.

Therefore, if the memory cell M2 is not programmed, charges stored in the bit line BL flows to the common source line ARVSS through the select transistor SGD, the memory cells M0 to M31, and the select transistor SGS, so that the voltage of the bit line BL drops. On the other hand, if the memory cell M2 is programmed, the memory cell M2 is switched off, so that the charges stored in the bit line BL does not flow to the common source line ARVSS, and the voltage of the bit line BL does not drop. As a result, it is possible to determined data from the voltage of the bit line BL.

In the configuration of the NAND flash memory according to the first embodiment shown in FIG. 1, a control of pre-charge of the bit line BL is performed by the sense amplifier controller 16. Furthermore, the selected word line voltage VREAD and the unselected word line voltage VPPL are set by the WL/uWL regulator 15. The data is then determined from the voltage of the bit line BL by the decoder/read determining circuit 17. This data is stored in the SRAM 22, latched in the latch 18, and output from the I/O buffer 19.

In this manner, in the NAND flash memory, an operation of reading the data is performed by pre-charging the bit line BL, switching on the select transistor SGD, setting the word line voltage of the word line WL2 to VREAD, setting the voltages of the other unselected word lines WL0, WL1, and WL3 to WL31 to VPPL, and switching on the select transistor SGS. A timing for each stage in this operation is explained below.

As described above, in the first embodiment, upon entering the read operation state, the voltages of all the word lines are fixed to VPPL (the ground voltage Vss (0 V)), and when selecting a word line, the voltage of the word line is lowered to the voltage VREAD (−3.5 V); and therefore, concerning a setting timing for the word line, it suffices to consider only a timing for setting the selected word line voltage. Timings to be considered at the time of reading include a timing for pre-charging the bit line BL, a timing for switching on the select transistor SGD, a timing for lowering the selected word line voltage to VREAD, and a timing for switching on the select transistor SGS.

Among these timings, it is preferable to set the timing for switching on the select transistor SGS at the end. It is because switching on the select transistor SGS may discharge the bit line BL before the data is determined. In addition, because the pre-charge of the bit line BL is performed to determine the data, it is performed prior to the timing for lowering the voltage of the word line to the selected word line voltage VREAD. From these aspects, three timing settings can be considered as the timings for the reading in the first embodiment.

(1) Setting First Timing

After starting the pre-charge of the bit line BL, the select transistor SGD is switched on, the voltage of the selected word line is then lowered to VREAD, and finally, the select transistor SGS is switched on.

(2) Setting Second Timing

The select transistor SGD is switched on at the same time as the start of the pre-charge of the bit line BL, the voltage of the selected word line is lowered to VREAD upon completing the pre-charge, and finally, the select transistor SGS is switched on.

(3) Setting Third Timing

The pre-charge of the bit line BL starts, the voltage of the selected word line is lowered to VREAD, the select transistor SGD is switched on, and finally, the select transistor SGS is switched on. In this case, the order of switching on the select transistor SGD and the select transistor SGS can be reversed.

The setting of a first timing is a setting that follows a basic read method for the NAND string that includes pre-charging the bit line BL, switching on the select transistor SGD, lowering the voltage of the selected word line to VREAD, and finally switching on the select transistor SGS. In this case, as shown in FIG. 10, the pre-charge of the NAND string is not performed until the select transistor SGD is switched on. The timing for lowering the selected word line voltage to VREAD is waited from switching on the select transistor SGD until the pre-charge of the NAND string.

Furthermore, in the setting of the first timing described in (1), because the unselected word line voltage is fixed to a desired voltage, a step-up operation or a step-down operation of the unselected word line voltage is not performed during a predetermined period from the start of the pre-charge of the bit line BL to switching on the select transistor SGS.

In the setting of a second timing, because the timing for starting the pre-charge of the bit line BL is the same as the timing for switching on the select transistor SGD, as shown in FIG. 10, the pre-charge of the NAND string is also performed at the same time as the start of the pre-charge. Therefore, an operation margin can be secured until lowering the selected word line voltage to VREAD, and as a result, it is possible to speed up an output cycle, leading to high-speed reading.

Furthermore, in the setting of the second timing described in (2), because the unselected word line voltage is fixed to a desired voltage, a step-up operation or a step-down operation of the unselected word line voltage is not performed during a predetermined period from the start of the pre-charge of the bit line BL and simultaneous switching on the select transistor SGD to switching on the select transistor SGS.

In the setting of a third timing, because the select transistor SGD is switched on after lowering the selected word line voltage to VREAD, as shown in FIG. 10, if the memory cell M2 on the selected word line is programmed, the memory cell M2 is switched off. Therefore, if the memory cell M2 is programmed, when the select transistor SGD is switched on, the pre-charge is only performed to the memory cell M2 in the NAND string, which makes it possible to achieve a reduction of the power consumption.

Furthermore, in the setting of the third timing described in (3), because the unselected word line voltage is fixed to a desired voltage, a step-up operation or a step-down operation of the unselected word line voltage is not performed during a predetermined period from the start of the pre-charge of the bit line BL to switching on the select transistor SGS.

An operation at each of the timing settings is explained next. The setting of the first timing is explained first. As describe above, in the setting of the first timing, the pre-charge of the bit line BL starts, the select transistor SGD is then switched on, the selected word line voltage is lowered to VREAD, and finally, the select transistor SGS is switched on. Such settings of the timings are realized by timing circuits shown in FIGS. 11A to 11C.

Figure 11A:
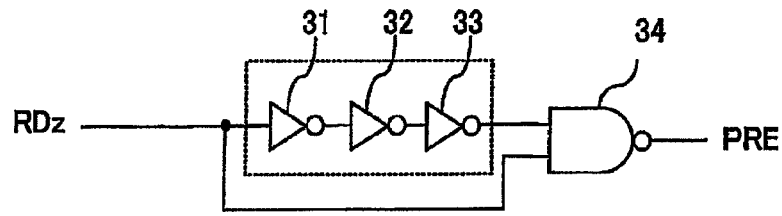
FIGS. 11A to 11C are explanatory diagrams of a circuit configuration for realizing a first timing setting.
Figure 11B:
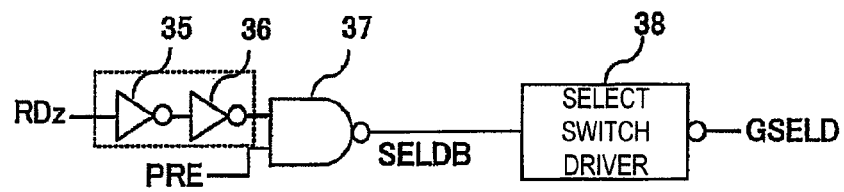
Figure 11C:
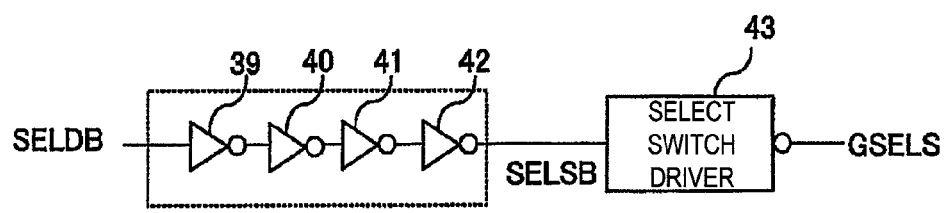

FIG. 11A is a timing setting circuit for a pre-charge signal PRE, FIG. 11B is a timing circuit for a drive signal GSELD for driving the select transistor SGD, and FIG. 11C is a timing circuit for a drive signal GSELS for driving the select transistor SGS.

As explained with reference to FIG. 1, in the read operation state, the read mode signal RDz from the command decoder 11 becomes a high level. As shown in FIG. 11A, the pre-charge signal PRE is obtained by supplying the read mode signal RDz and a signal obtained by delaying the read mode signal RDz by delay elements 31, 32, and 33 to a NAND gate 34.

Figure 24:
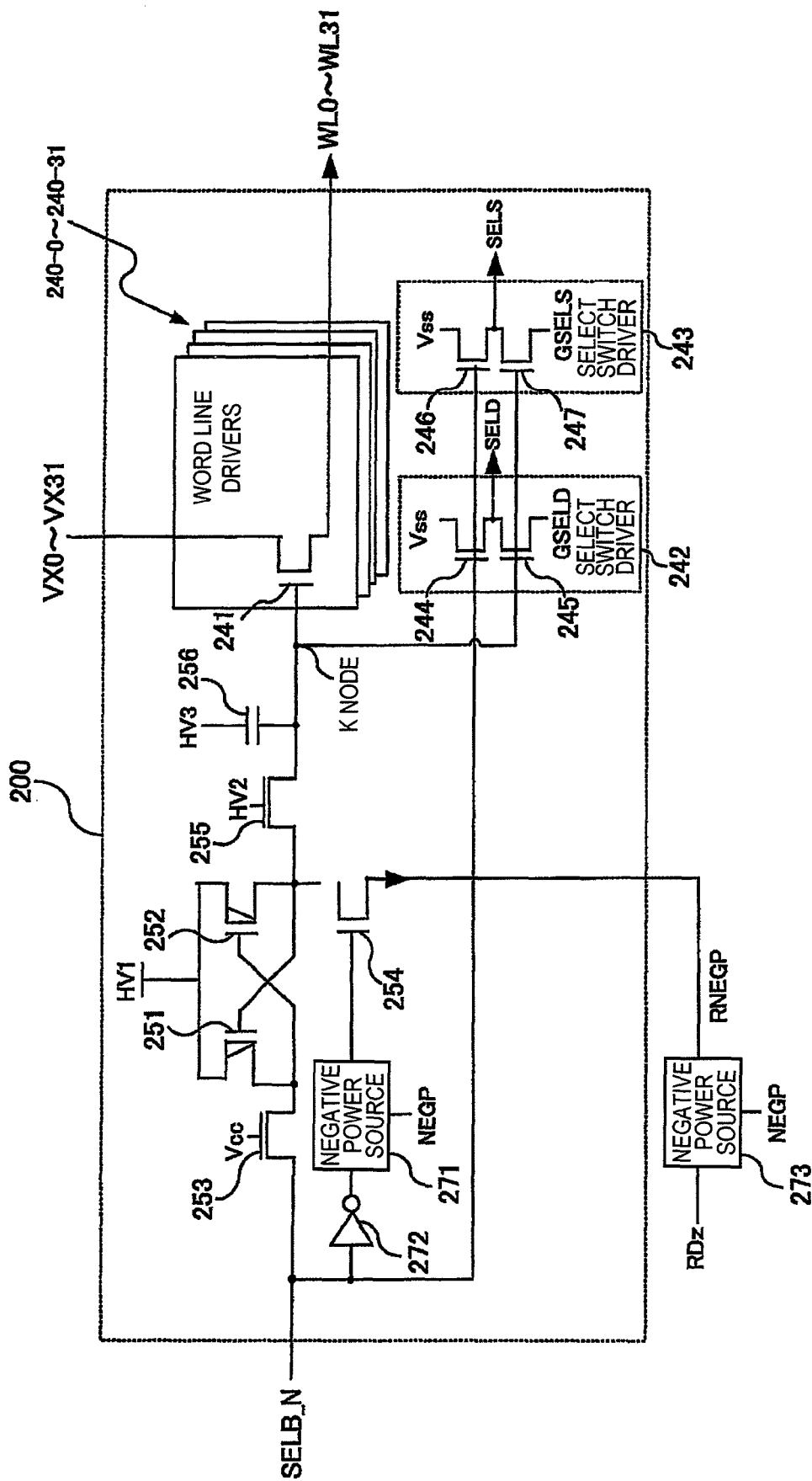
FIG. 24 is a block diagram for explaining a configuration of the X decoder according to the first embodiment.

As shown in FIG. 11B, the drive signal GSELD for driving the select transistor SGD is obtained by supplying a signal obtained by delaying the read mode signal RDz by delay elements 35 and 36 and the pre-charge signal PRE (see FIG. 11A) to a NAND gate 37 and supplying an output signal SELDB of the NAND gate 37 to a select switch driver 38 (corresponding to a select switch driver 242 shown in FIG. 24).

As shown in FIG. 11C, the driver signal GSELS for driving the select transistor SGS is obtained by supplying a signal SELSB obtained by delaying the signal SELDB shown in FIG. 11B by delay elements 39, 40, 41, and 42 to a select switch driver 43 (corresponding to a select switch driver 243 shown in FIG. 24).

An amount of the delay by the delay elements in FIGS. 11A to 11C can be considered as various time orders. Based on a time order for a desired timing, a timing setting circuit and a timing circuit of various configurations can be considered other than the above configurations, and these various configurations are also included in the scope of the present invention.

Figure 25:
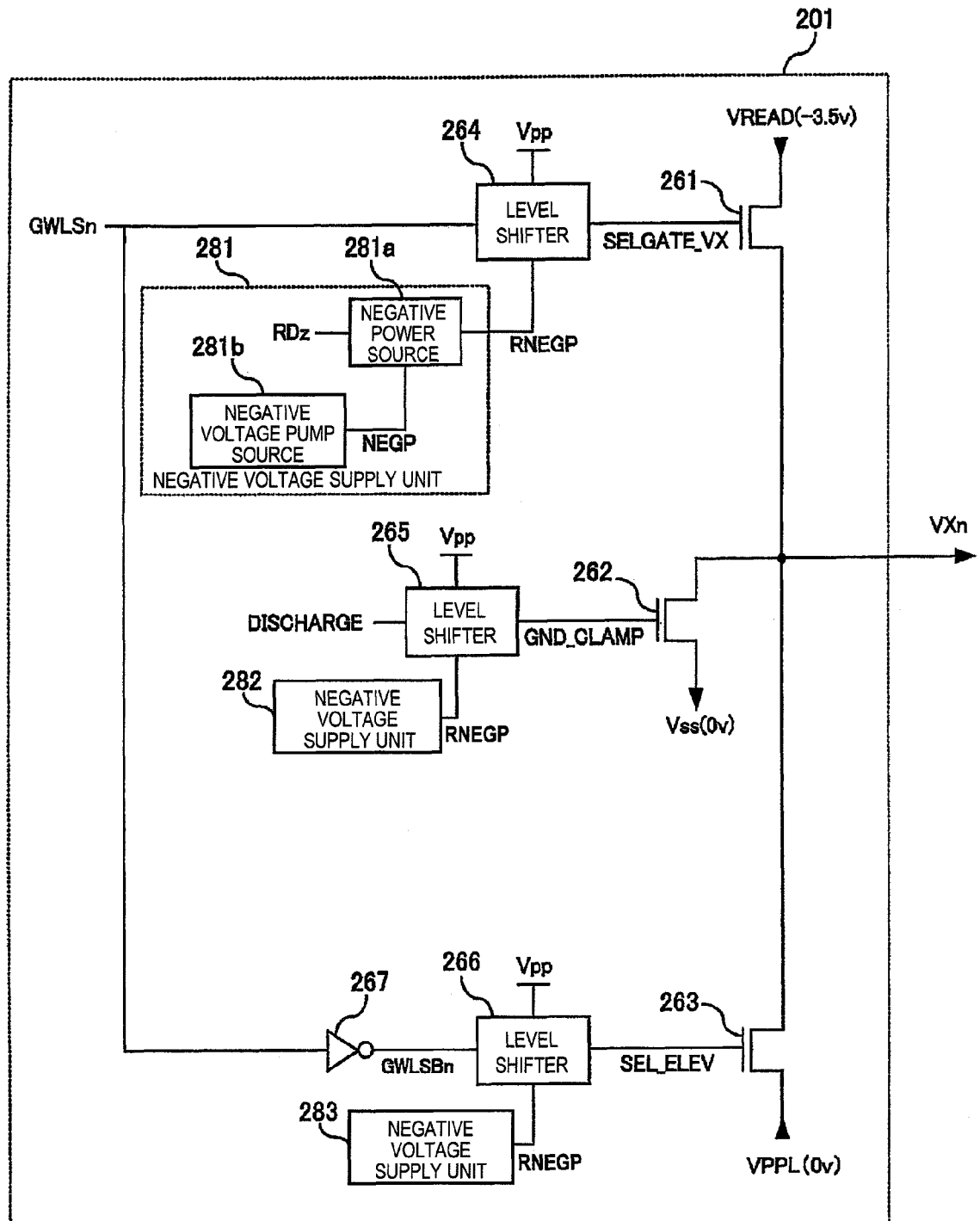
FIG. 25 is a block diagram for explaining a configuration of the VX decoder according to the first embodiment.

A timing for a word line can be adjusted by a timing of a block selection signal SELB_N of an X decoder 200 (see FIG. 24), adjustments of high-voltage powers HV1, HV2, and HV3, and a switching timing of a VX decoder 201 (see FIG. 25).

Figure 12:
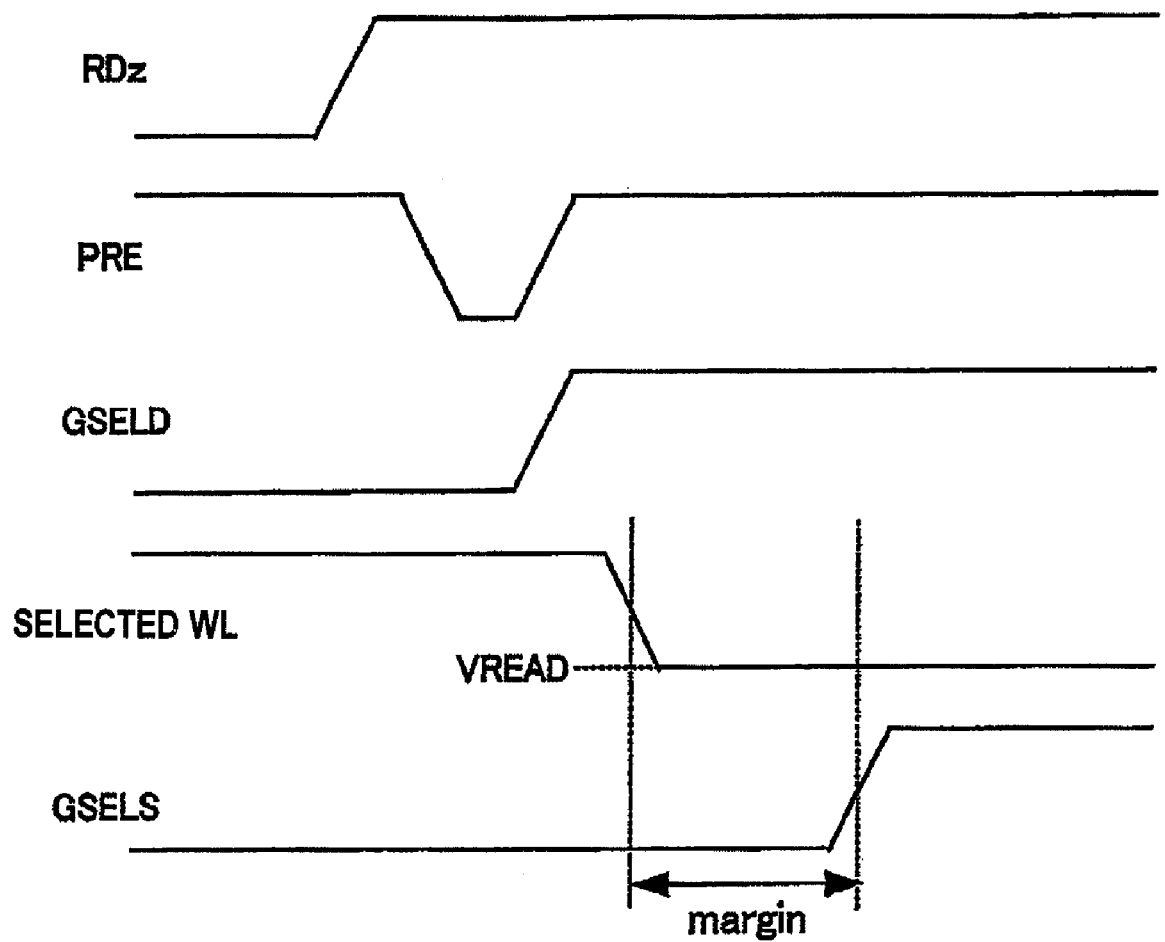
FIG. 12 is a timing chart for explaining the first timing setting.

FIG. 12 is a timing chart showing a timing of each part set at the first timing. As shown in FIG. 12, when the read mode signal RDz becomes the high level, the pre-charge signal PRE becomes a low level, and then the drive signal GSELD for driving the select transistor SGD becomes the high level, so that the select transistor SGD is switched on. Therefore, the selected word line voltage is lowered to VREAD, and finally, the drive signal GSELS for driving the select transistor SGS becomes the high level, so that the select transistor SGS is switched on. Although an operation margin needs to be secured in switching on the select transistor SGS after the voltage of the selected word line (selected WL) is lowered to VREAD, this operation margin is secured by the timing setting circuit and the timing circuits shown in FIGS. 11A to 11C.

Figure 13:
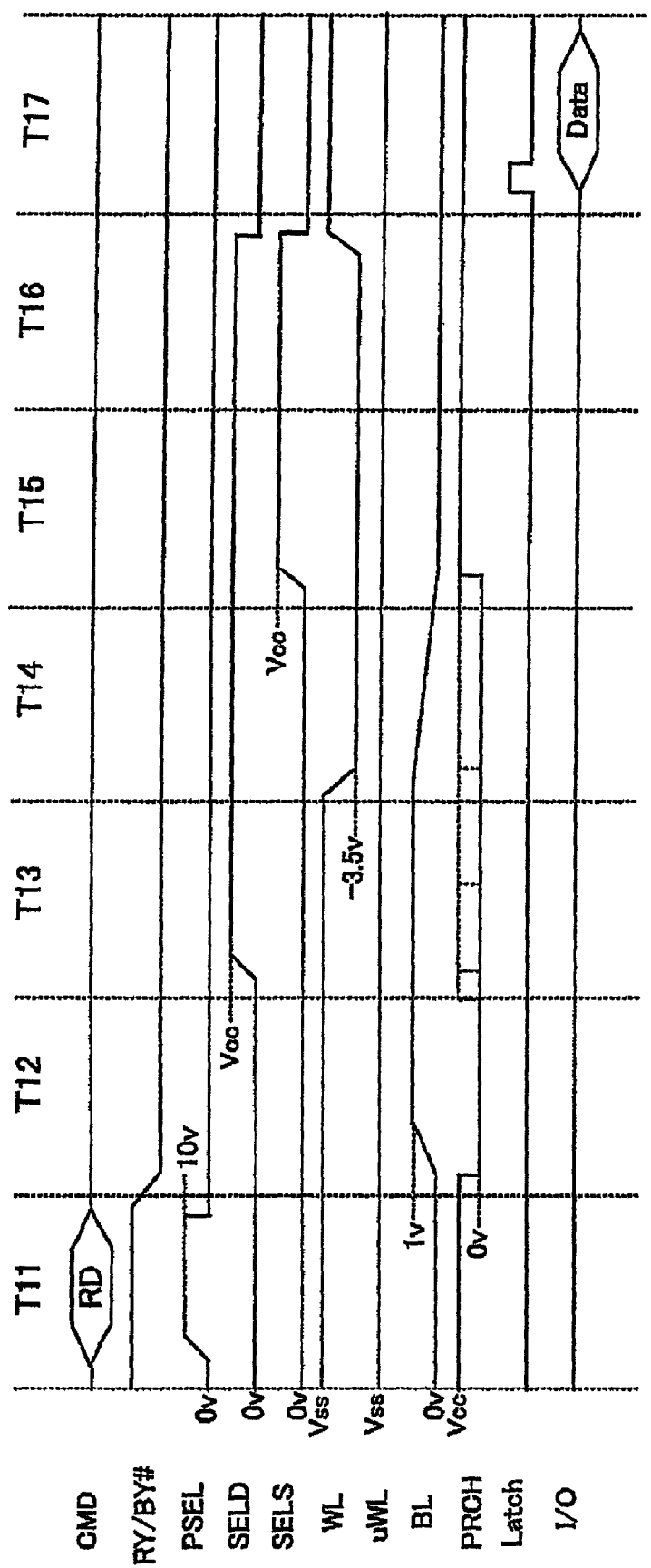
FIG. 13 is a waveform diagram showing a waveform of each part set at a first timing in the first embodiment.

FIG. 13 is a waveform diagram showing a waveform of each part set at the first timing. As described above, in the example of setting the first threshold value, the selected word line voltage VREAD is −3.5 V and the unselected word line voltage VPPL is the ground voltage Vss (0 V).

As shown in FIG. 13, at a time T11, upon receiving a read command RD from the command decoder 11, an initial operation starts, and the bit line BL is discharged by a signal PSEL. At this moment, both the voltage of the selected word line WL and the voltage of the unselected word line uWL are the ground voltage Vss (0 V).

Next, at a time T12, a pre-charge signal PRCH becomes the low level, and the pre-charge of the bit line BL starts. This causes the voltage of the bit line BL to gradually rise. In this example, the bit line BL is pre-charged to 1 V.

An end timing of the pre-charge can be before or after or simultaneously with rising of the selected signal line SELD after the start of the pre-charge, before or after or simultaneously with falling of the selected word line WL, or before or simultaneously with rising of the selected signal line SELS (see a dotted line of the signal PRCH). If the pre-charge is completed before the selected signal line SELD rises, there is an advantage that it is possible to reduce the current consumption. If the end of the pre-charge is later than the rising of the selected signal line SELD, it is possible to lengthen the pre-charge time. In addition, because the pre-charge is performed additionally to the selected word line WL after the select transistor SGD is opened, a level difference due to data of the bit line BL can be widely taken, so that the read margin increases.

Therefore, at a time T13, the drive signal of the selected signal line SELD becomes the power source voltage Vcc, and the select transistor SGD is switched on.

Next, at a time T14, the voltage of the selected word line WL is lowered to −3.5 V, and at a time T15, the drive signal of the selected signal line SELS becomes the power source voltage Vcc, and the select transistor SGS is switched on.

At a time T16, after a read determination of the bit line BL, the voltages of the selected signal lines SELD and SELS are returned to 0 V, and the voltage of the selected word line WL is returned to 0 V (the ground voltage Vss).

At a time T17, an output data is latched in the latch 18 by a latch pulse Latch and output from the I/O buffer 19. During the times T11 to T17, the unselected word line uWL is maintained to a fixed voltage.

A case of setting the second timing is explained next. The setting of the second timing makes it possible to achieve a high-speed operation by switching on the select transistor SGD simultaneously with a start of the pre-charge of the bit line BL, lowering the selected word line voltage to VREAD when the pre-charge is completed, and finally switching on the select transistor SGS. Such settings of the timings are realized by timing circuits shown in FIGS. 14A to 14D.

Figure 14A:
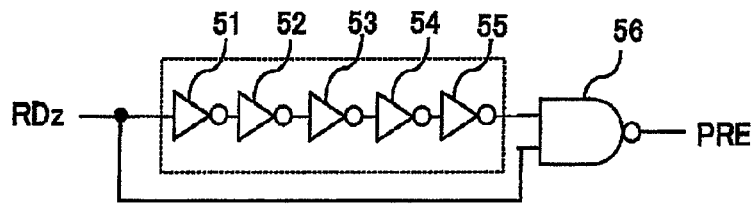
FIGS. 14A to 14D are explanatory diagrams of a circuit configuration for realizing a second timing setting.
Figure 14B:
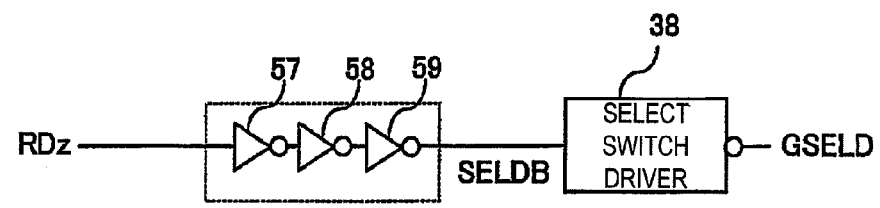
Figure 14C:
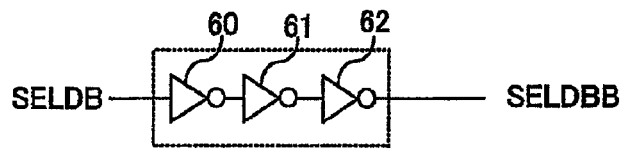
Figure 14D:
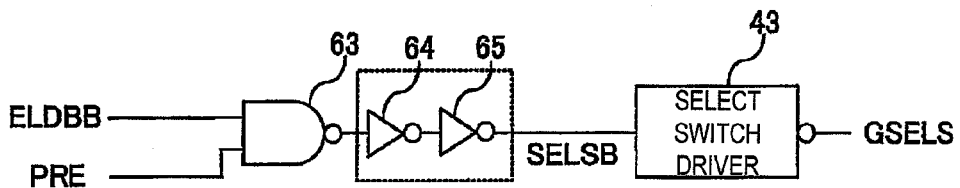

FIG. 14A is a timing setting circuit for the pre-charge signal PRE, FIG. 14B is a timing circuit for the drive signal GSELD for driving the select transistor SGD, and FIGS. 14C and 14D are timing circuits for the drive signal GSELS for driving the select transistor SGS.

In the read operation state, the read mode signal RDz from the command decoder 11 becomes the high level. As shown in FIG. 14A, the pre-charge signal PRE is obtained by supplying the read mode signal RDz and a signal obtained by delaying the read mode signal RDz by delay elements 51 to 55 to a NAND gate 56.

As shown in FIG. 14B, the drive signal GSELD for driving the select transistor SGD is obtained by forming an output signal SELDB by delaying the read mode signal RDz by delay elements 57, 58, and 59 and supplying the output signal SELDB to a select switch driver 38 (corresponding to the select switch driver 242 shown in FIG. 24).

The drive signal GSELS for driving the select transistor SGS is obtained by forming a signal SELDBB by delaying the signal SELDB (see FIG. 14B) by delay elements 60, 61, and 62 as shown in FIG. 14C, and as shown in FIG. 14D, supplying the signal SELDBB and the pre-charge signal PRE to a NAND gate 63 and supplying an output of the NAND gate 63 to a select switch driver 43 (corresponding to the select switch driver 243 shown in FIG. 24) via delay elements 64 and 65.

The delay elements 60 to 62 have a delay amount equal to or larger than a delay caused by a line resistance and a line capacitance to the select transistor SGD, and the delay elements 64 and 65 have a delay amount equal to or larger than a delay caused by a line resistance and a line capacitance of a word line.

An amount of the delay by the delay elements in FIGS. 14A to 14D can be considered as various time orders. Based on a time order for a desired timing, a timing setting circuit and a timing circuit of various configurations can be considered other than the above configurations, and these various configurations are also included in the scope of the present invention.

Figure 15:
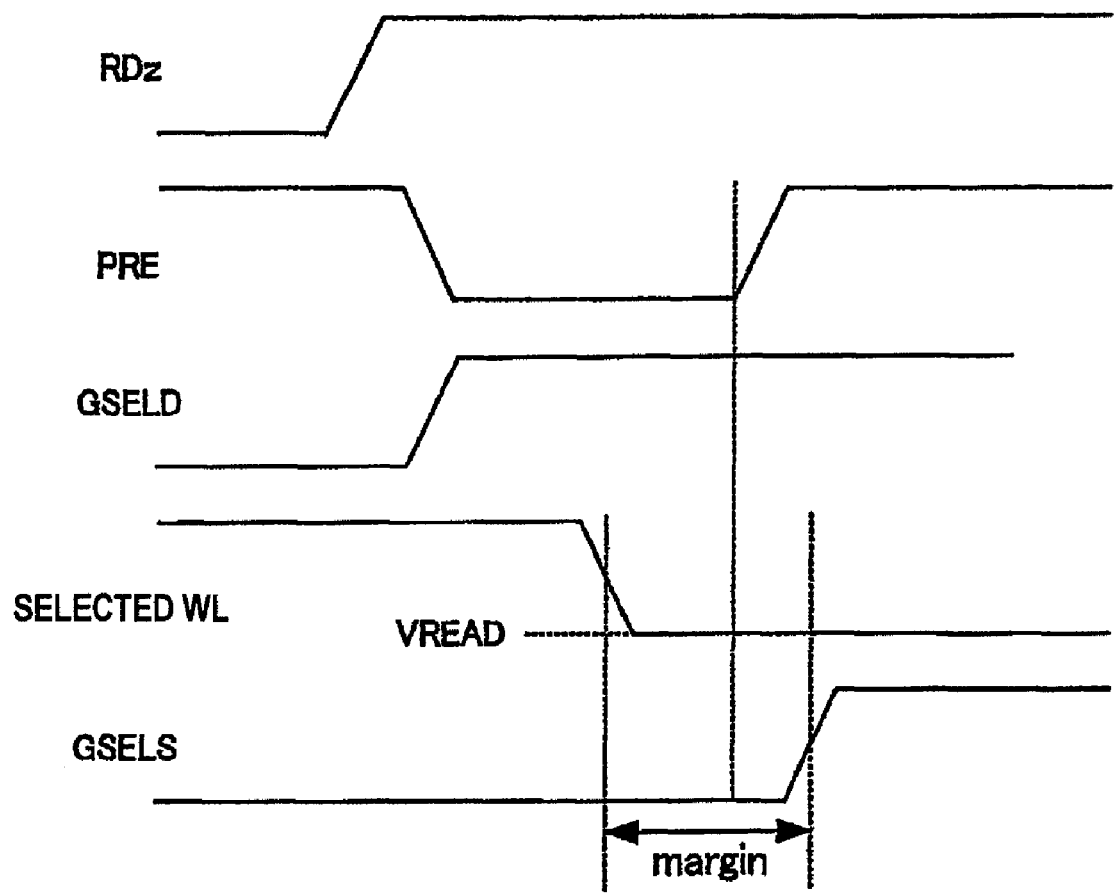
FIG. 15 is a timing chart for explaining the second timing setting.

FIG. 15 is a timing chart showing a timing of each part set at the second timing. As shown in FIG. 15, when the read mode signal RDz becomes the high level, the pre-charge signal PRE becomes the low level, and then the drive signal GSELD for driving the select transistor SGD becomes the high level simultaneously with performing the pre-charge, so that the select transistor SGD is switched on. Therefore, the selected word line voltage is lowered to VREAD, and finally, the drive signal GSELS for driving the select transistor SGS becomes the high level, so that the select transistor SGS is switched on. The timing at which the pre-charge signal PRE returns to the high level from the low level can be before or after the selected word line voltage is lowered to VREAD as long as it is before the drive signal GSELS becomes the high level. Although an operation margin needs to be secured in switching on the select transistor SGS after the voltage of the selected word line voltage is lowered to VREAD, this operation margin is secured by the timing setting circuit and the timing circuits shown in FIGS. 14A to 14D.

Figure 16:
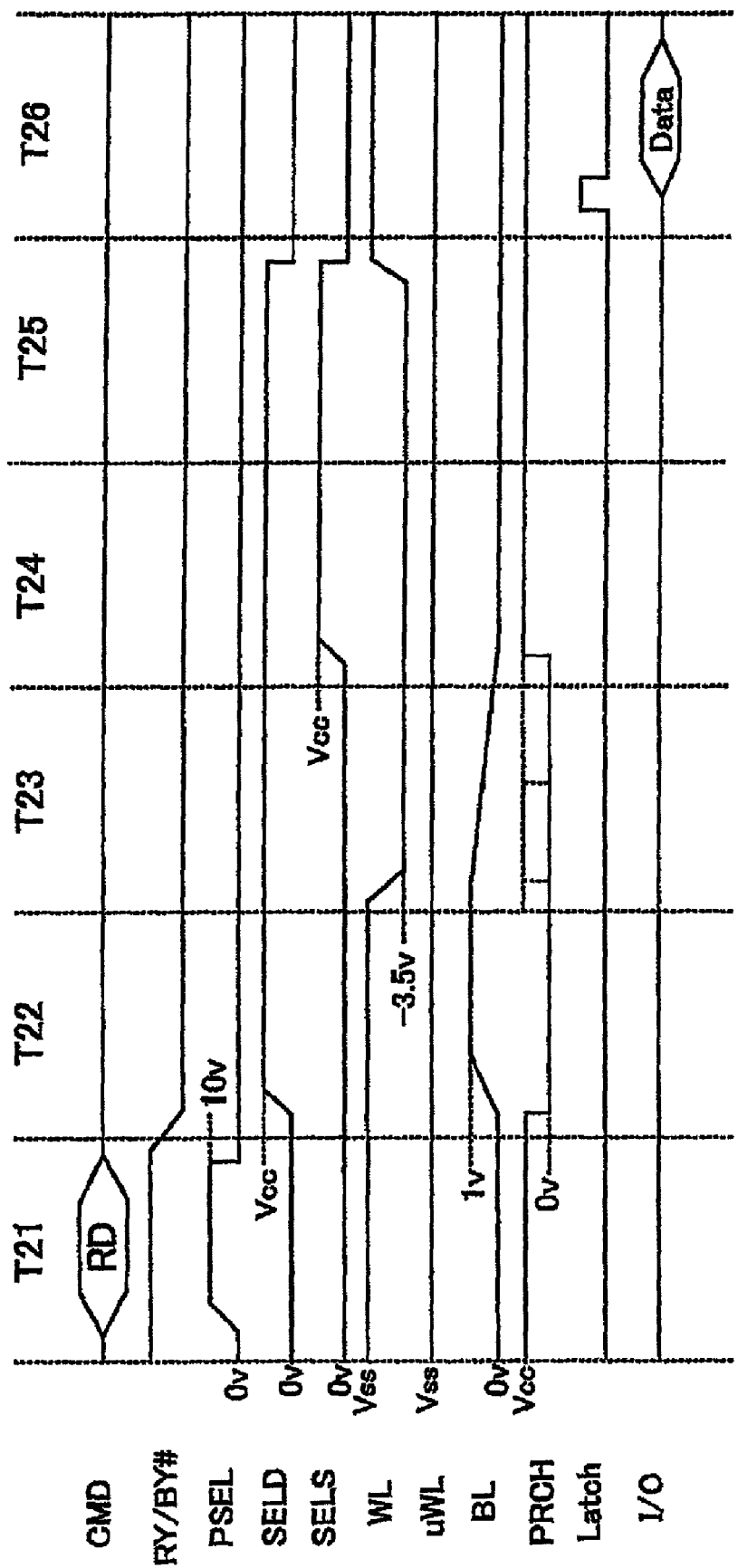
FIG. 16 is a waveform diagram showing a waveform of each part set at a second timing in the first embodiment.

FIG. 16 is a waveform diagram showing a waveform of each part set at the second timing. As shown in FIG. 16, at a time T21, upon receiving a read command RD from the command decoder 11, an initial operation starts, and the bit line BL is discharged by the signal PSEL. At this moment, both the voltage of the selected word line WL and the voltage of the unselected word line uWL are 0 V (the ground voltage Vss).

Next, at a time T22, a pre-charge signal PRCH becomes the low level, and the pre-charge of the bit line BL starts. This causes the voltage of the bit line BL to rise. In this example, the bit line BL is pre-charged to 1 V. At the same time, at a time T22, the drive signal of the selected signal line SELD becomes the power source voltage Vcc, and the select transistor SGD is switched on.

An end timing of the pre-charge can be before or after or simultaneously with rising of the selected signal line SELD after the start of the pre-charge, before or after or simultaneously with falling of the selected word line WL, or before or simultaneously with rising of the selected signal line SELS (see a dotted line of the signal PRCH). If the pre-charge is completed before the selected signal line SELD rises, there is an advantage that it is possible to reduce the current consumption. If the end of the pre-charge is later than the rising of the selected signal line SELD, it is possible to lengthen the pre-charge time. In addition, because the pre-charge is performed additionally to the selected word line WL after the select transistor SGD is opened, a level difference due to data of the bit line BL can be widely taken, so that the read margin increases.

Next, at a time T23, the voltage of the selected word line WL is lowered to −3.5 V, and a time T24, the drive signal of the selected signal line SELS becomes the power source voltage Vcc, and the select transistor SGS is switched on.

At a time T25, after a read determination of the bit line BL, the voltages of the selected signal lines SELD and SELS are returned to 0 V, and the voltage of the selected word line WL is returned to 0 V (the ground voltage Vss).

At a time T26, an output data is latched in the latch 18 by a latch pulse Latch and output from the I/O buffer 19. During the times T21 to T26, the unselected word line uWL is maintained to a fixed voltage.

A case of setting the third timing is explained next. The setting of the third timing makes it possible to achieve a reduction of the power consumption by starting the pre-charge of the bit line BL, lowering the selected word line voltage to VREAD, switching on the select transistor SGD, and finally, switching on the select transistor SGS. Such settings of the timings are realized by timing circuits shown in FIGS. 17A to 17D.

Figure 17A:
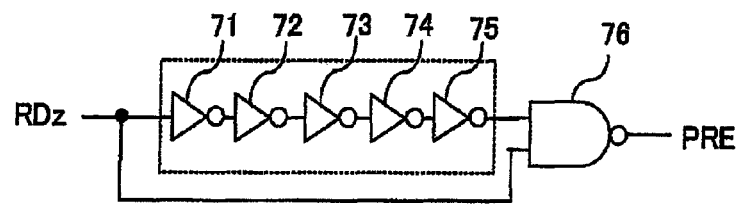
FIGS. 17A to 17D are explanatory diagrams of a circuit configuration for realizing a third timing setting.
Figure 17B:
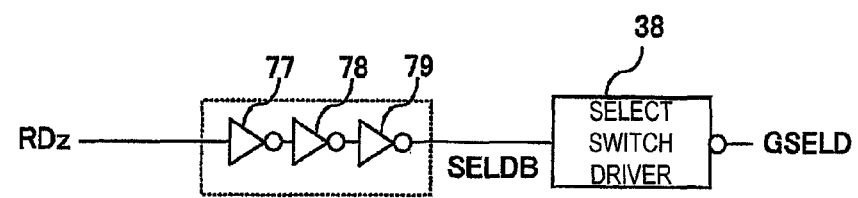
Figure 17C:
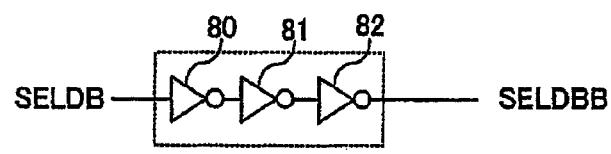
Figure 17D:
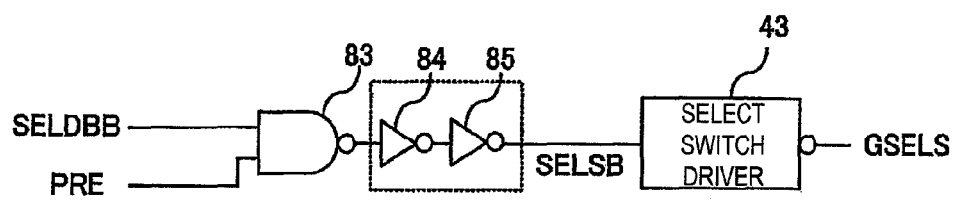

FIG. 17A is a timing setting circuit for the pre-charge signal PRE, FIG. 17B is a timing circuit for the drive signal GSELD for driving the select transistor SGD, and FIGS. 17C and 17D are timing circuits for the drive signal GSELS for driving the select transistor SGS.

In the read operation state, the read mode signal RDz from the command decoder 11 becomes the high level. As shown in FIG. 17A, the pre-charge signal PRE is obtained by supplying the read mode signal RDz and a signal obtained by delaying the read mode signal RDz by delay elements 71 to 75 to a NAND gate 76.

As shown in FIG. 17B, the drive signal GSELD for driving the select transistor SGD is obtained by forming an output signal SELDB by delaying the read mode signal RDz by delay elements 77, 78, and 79 and supplying the output signal SELDB to a select switch driver 38 (corresponding to the select switch driver 242 shown in FIG. 24).

As shown in FIG. 17C, a signal SELDBB is obtained by delaying the signal SELDB (see FIG. 17B), which is delayed by the delay elements 77, 78, and 79, by delay elements 80, 81, and 82. Therefore, as shown in FIG. 17D, the drive signal GSELS for driving the select transistor SGS is obtained by supplying the signal SELDBB and the pre-charge signal PRE to a NAND gate 83 and supplying an output of the NAND gate 83 to a select switch driver 43 (corresponding to the select switch driver 243 shown in FIG. 24) via delay elements 84 and 85.

The delay elements 80 to 82 have a delay amount equal to or larger than a delay caused by a line resistance and a line capacitance to the select transistor SGD, and the delay elements 84 and 85 have a delay amount equal to or larger than a delay caused by a line resistance and a line capacitance of a word line.

An amount of the delay by the delay elements in FIGS. 17A to 17D can be considered as various time orders. Based on a time order for a desired timing, a timing setting circuit and a timing circuit of various configurations can be considered other than the above configurations, and these various configurations are also included in the scope of the present invention.

Figure 18:
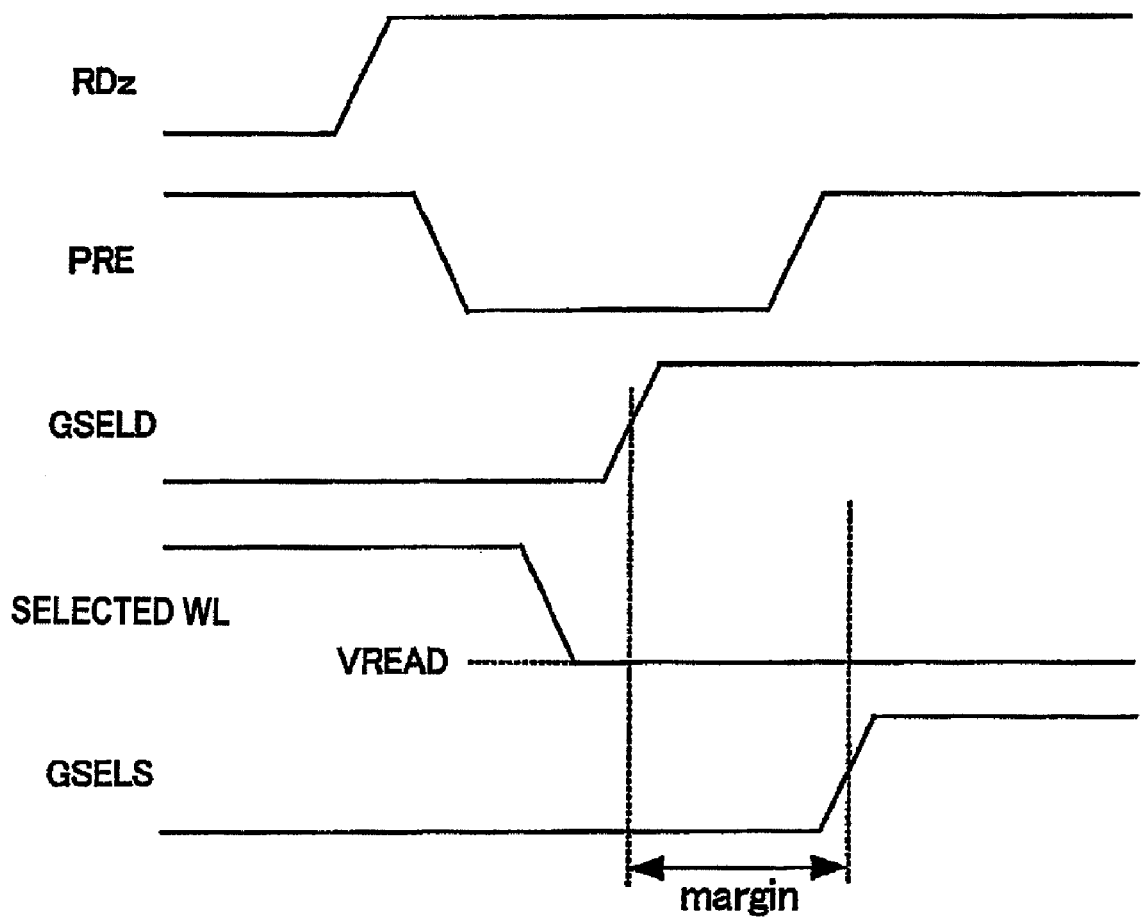
FIG. 18 is a timing chart for explaining the third timing setting.

FIG. 18 is a timing chart showing a timing of each part set at the third timing. As shown in FIG. 18, when the read mode signal RDz becomes the high level, the pre-charge signal PRE becomes the low level, to perform the pre-charge. After the selected word line voltage is lowered to VREAD, the drive signal GSELD for driving the select transistor SGD becomes the high level, so that the select transistor SGD is switched on. Finally, the drive signal GSELS for driving the select transistor SGS becomes the high level, so that the select transistor SGS is switched on. Although an operation margin needs to be secured in switching on the select transistor SGS after the voltage of the selected word line voltage is lowered to VREAD, this operation margin is secured by the timing setting circuit and the timing circuits shown in FIGS. 17A to 17D.

Figure 19:
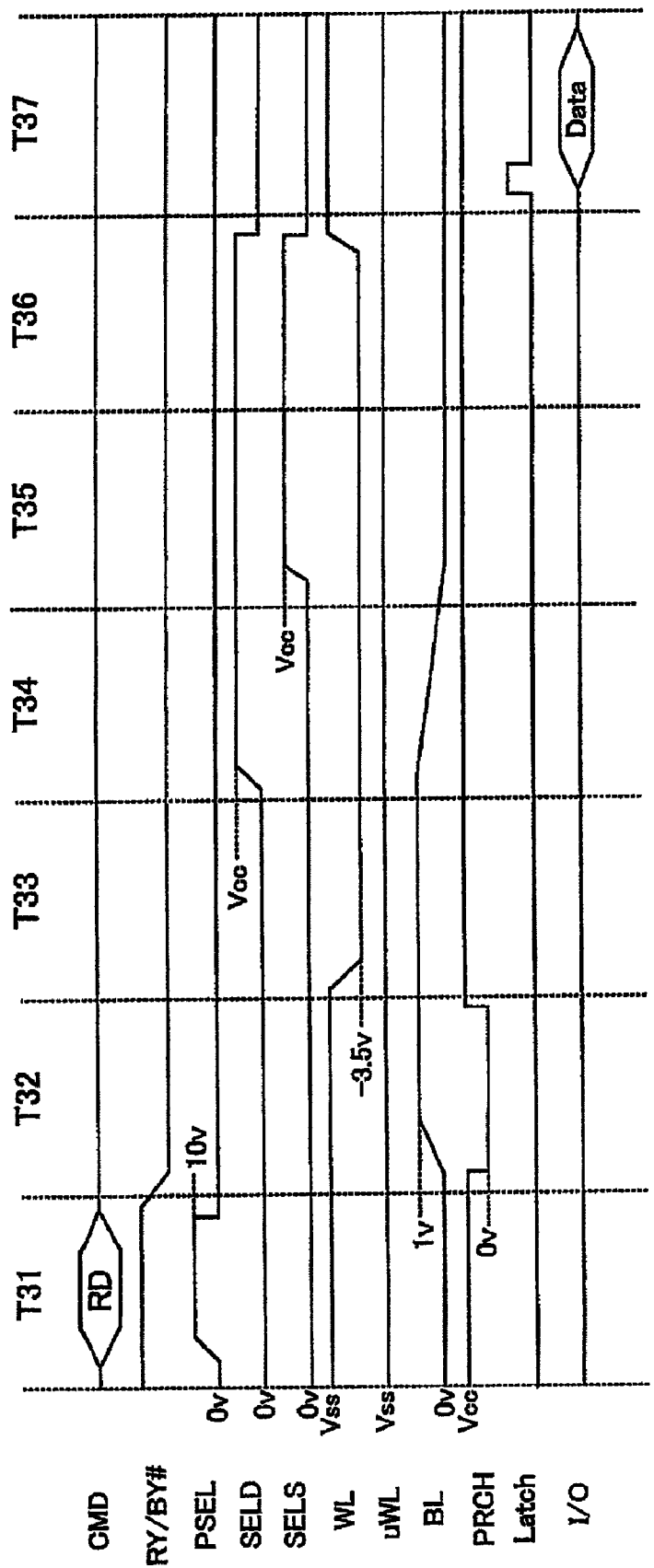
FIG. 19 is a waveform diagram showing a waveform of each part set at a third timing in the first embodiment.

FIG. 19 is a waveform diagram showing a waveform of each part set at the third timing. As shown in FIG. 19, at a time T31, upon receiving a read command RD from the command decoder 11, an initial operation starts, and the bit line BL is discharged by the signal PSEL. At this moment, both the voltage of the selected word line WL and the voltage of the unselected word line uWL are 0 V (the ground voltage Vss).

Next, at a time T32, a pre-charge signal PRCH becomes the low level, and the pre-charge of the bit line BL starts. This causes the voltage of the bit line BL to rise. In this example, the bit line BL is pre-charged to 1 V. An end timing of the pre-charge is before rising of the selected signal line SELD.

Next, at a time T33, the voltage of the selected word line WL is lowered to −3.5 V, and at a time T34, the drive signal of the selected signal line SELD becomes the power source voltage Vcc, and the select transistor SGD is switched on. At a time T35, the drive signal of the selected signal line SELS becomes the power source voltage Vcc, and the select transistor SGS is switched on.

At a time T36, after a read determination of the bit line BL, the voltages of the selected signal lines SELD and SELS are returned to 0 V, and the voltage of the selected word line WL is returned to 0 V (the ground voltage Vss).

At a time T37, an output data is latched in the latch 18 by a latch pulse Latch and output from the I/O buffer 19. During the times T31 to T37, the unselected word line uWL is maintained to a fixed voltage.

Figure 20:
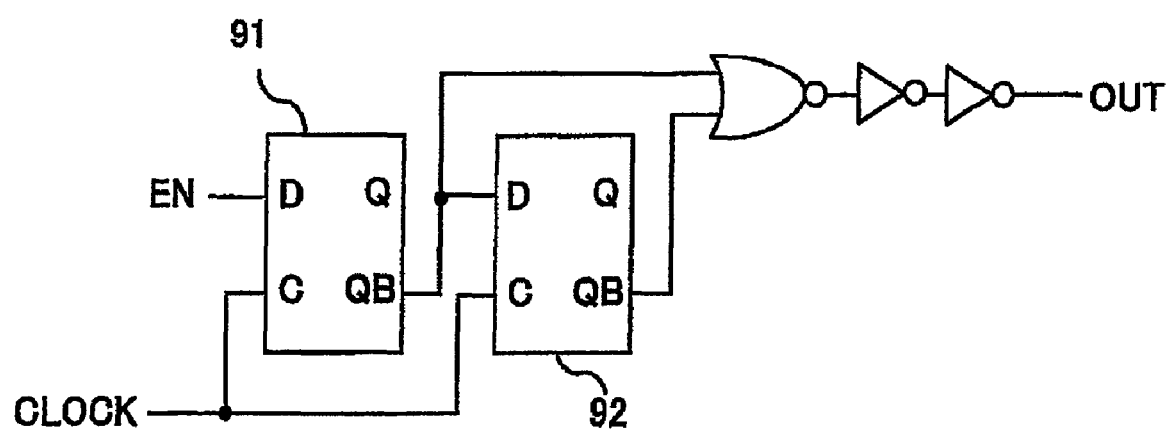
FIG. 20 is a block diagram for explaining a delay circuit used for setting respective timings.

Although a delay circuit employing an inverter is used for the delay circuits in FIGS. 11, 14, and 17, a timer circuit configured with D flip-flops 91 and 92 can be used instead, as shown in FIG. 20. With such a timer circuit, it is possible to obtain an accurate delay amount synchronized with a clock. That is, all kinds of circuits that can realize a desired timing (the first timing to the third timing) are included in the present invention.

The setting of the second timing is characterized by a high-speed operation, and the setting of the third timing is characterized by a reduction of the power consumption. In this respect, the setting of the first timing is designated as a normal mode, the setting of the second timing is designated as a high-speed mode, and the setting of the third timing is designated as a power saving mode, so that the mode can be set according to an application.

The normal mode, the high-speed mode, and the power saving mode can be set by a command or the like input from outside, and each of the modes can be prepared in a single or a multiple manner.

In addition, a NAND flash memory that operates at the first timing, a NAND flash memory that operates at the second timing, and a NAND flash memory that operates at the third timing can be prepared for a sale, so that a user can select and purchase a product according to the purpose of use.

<1-5. Power Supply to Word Lines in First Embodiment>

When reading data from a memory cell in the NAND flash memory according to the first embodiment, it is configured that the voltage of the unselected word line is fixed to the predetermined voltage VPPL (the ground voltage Vss (0 V)), and at the time of selecting a word line, the voltage of the selected word line is lowered to the predetermined voltage VREAD (−3.5V). By setting the word line voltages in the above manner, even when a voltage over the power source voltage Vcc is required at the time of the reading, it becomes a voltage about 1.5 times the power source voltage Vcc. However, the first embodiment requires a voltage equal to or lower than 0 V to be supplied to the word line. Therefore, it is necessary to make sure that the device operates without fail even when the voltage equal to or lower than 0 V is applied to the word line. A power source for the word line in the NAND flash memory according to the first embodiment is explained below.

Figure 21:
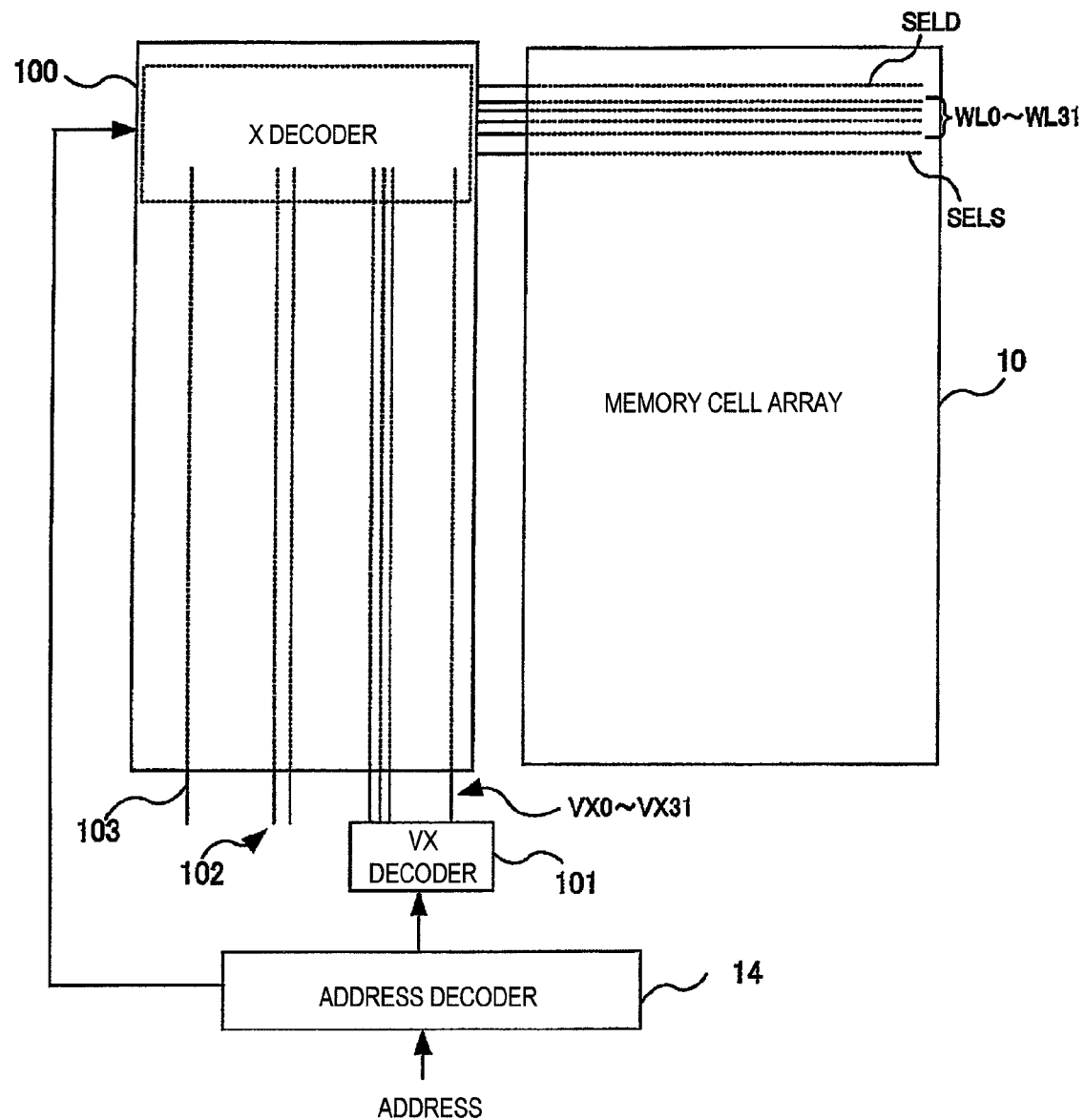
FIG. 21 is a block diagram for explaining a configuration of main parts for voltage settings of respective parts.

In the NAND flash memory, as shown in FIG. 21, it is configured that the power is supplied to the word lines WL0 to WL31 by using an X decoder 100 and a VX decoder 101.

As shown in FIG. 21, the word lines WL0 to WL31 and the selected signal lines SELD and SELS are derived from the X decoder 100 toward the memory cell array 10. The power for the word lines WL0 to WL31 is supplied from the VX decoder 101 through vertical signal lines VX0 to VX31. Furthermore, drive signal lines 102 for the drive signals GSELD and GSELS for the selected signal lines SELD and SELS and a power source line 103 from high-voltage powers HV1, HV2, and HV3 for assisting decode (not shown) are provided to the x decoder 100.

The X decoder 100 selects a block including a memory cell to be selected, based on a decode signal from the address decoder 14. The VX decoder 101 supplies necessary voltages to a selected word line and an unselected word line among the word lines WL0 to WL31, based on the decode signal from the address decoder 14.

In the NAND flash memory, a voltage of 6 V is supplied to the unselected word line and a voltage of 2.5 V is supplied to the selected word line. In this case, the X decoder 100 and the VX decoder 101 are configured as shown in FIG. 22 and FIG. 23, respectively.

Figure 22:
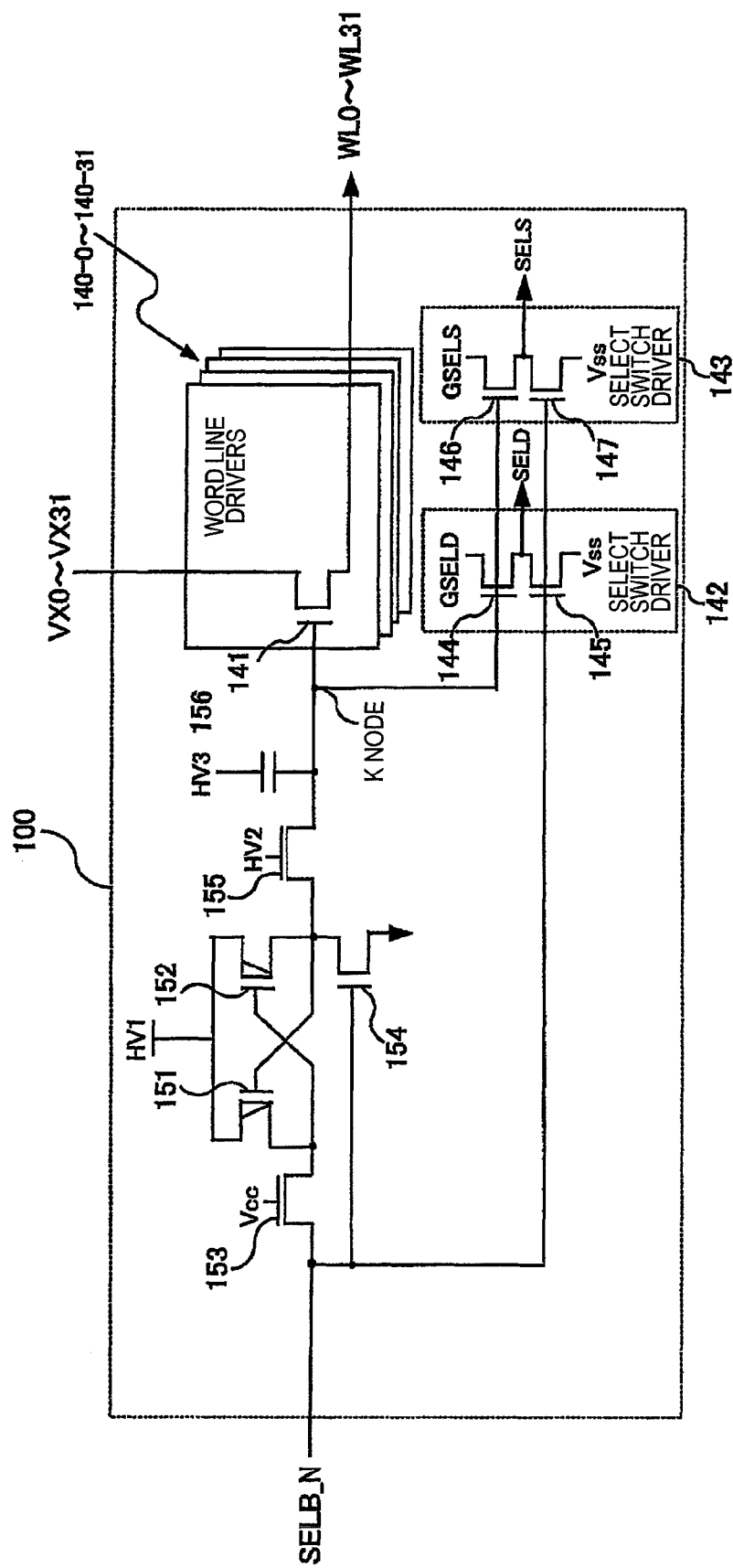
FIG. 22 is a block diagram for explaining a configuration of an X decoder.
Figure 23:
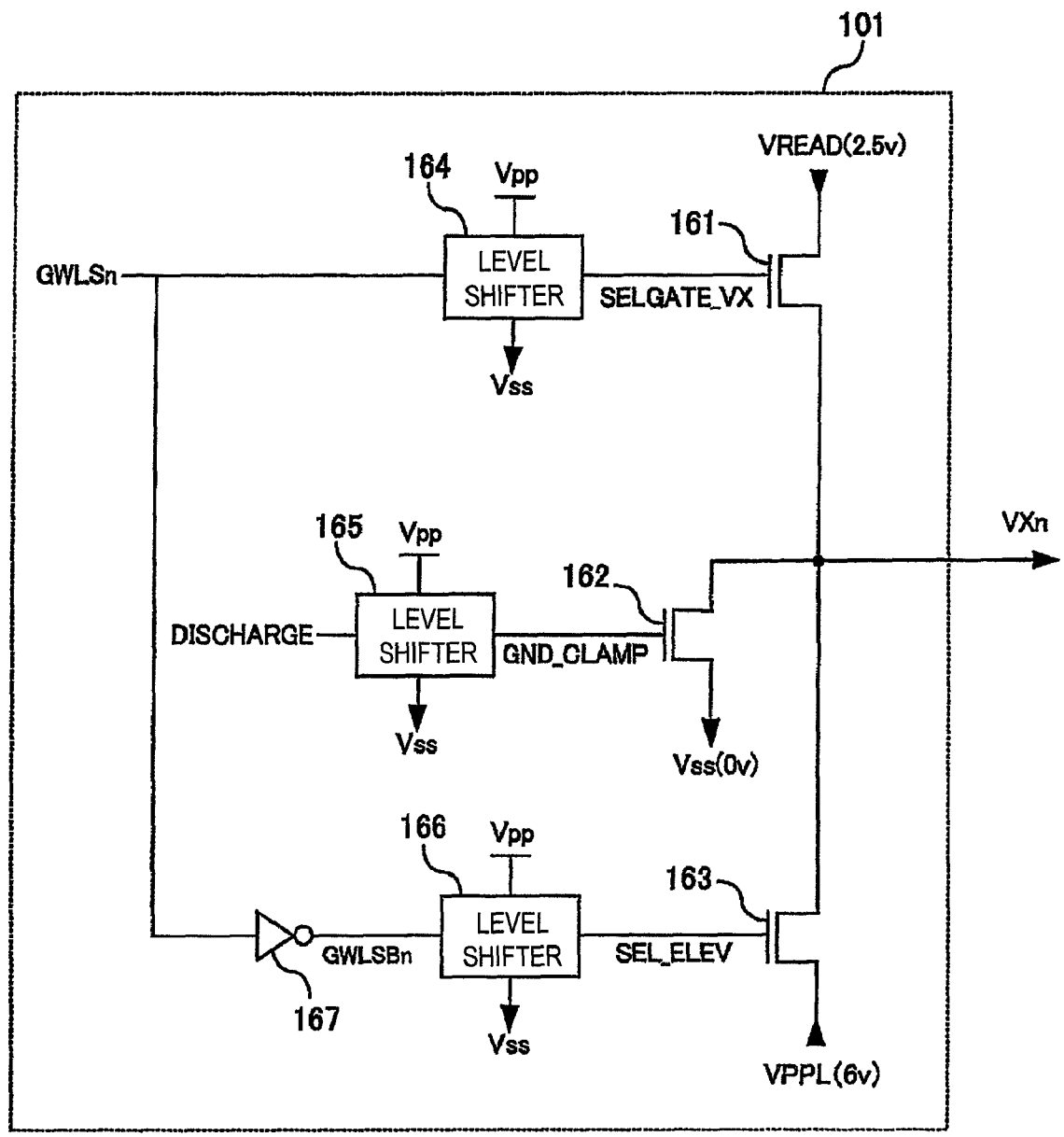
FIG. 23 is a block diagram for explaining a configuration of a VX decoder.

As shown in FIG. 22, the X decoder 100 includes 32 word line drivers 140-0 to 140-31. Each of the word line drivers 140-0 to 140-31 is constituted by a MOS transistor 141. One end of the MOS transistor 141 that constitutes each of the word line drivers 140-0 to 140-31 is connected to corresponding one of the vertical signal lines VX0 to VX31, and the other end of the MOS transistor 141 is connected to corresponding one of the word lines WL0 to WL31. The gate of the MOS transistor 141 is connected to a K node.

The X decoder 100 further includes select switch drivers 142 and 143. The select switch driver 142 is constituted by N-channel MOS transistors 144 and 145. The drive signal GSELD for driving the select transistor SGD is supplied to the drain of the MOS transistor 144. The source of the MOS transistor 145 is connected to a line of the ground voltage Vss. The selected signal line SELD is derived from a connection point of the MOS transistor 144 and the MOS transistor 145. The gate of the MOS transistor 144 is connected to the K node. The gate of the MOS transistor 145 is connected to a signal line of the block selection signal SELB_N that is a decode signal (a signal for selecting a block in the memory cell) from the address decoder 14.

The select switch driver 143 is constituted by N-channel MOS transistors 146 and 147. The drive signal GSELS for driving the select transistor SGS is supplied to the drain of the MOS transistor 146. The source of the MOS transistor 147 is connected to the line of the ground voltage Vss. The selected signal line SELS is derived from a connection point of the MOS transistor 146 and the MOS transistor 147. The gate of the MOS transistor 146 is connected to the K node. The gate of the MOS transistor 147 is connected to the signal line of the block selection signal SELB_N that is a decode signal (a signal for selecting a block in the memory cell) from the address decoder 14.

P-channel MOS transistors 151 and 152 and N-channel MOS transistors 153, 154, and 155 constitute a cross-coupled level shifter. In this example, it is necessary to set a voltage of the K node to switch on the MOS transistor 141 that constitutes each of the word line drivers 140-0 to 140-31, because the unselected word line voltage is 6 V and the selected word line voltage is 2.5 V. The cross-coupled level shifter that is constituted by the P-channel MOS transistors 151 and 152 and the N-channel MOS transistors 153, 154, and 155 forms a predetermined voltage with the high-voltage powers HV1 and HV2. The high-voltage power HV3 is applied to the K node via a capacitor 156, so that the K node is boosted. With this configuration, a voltage that can switch on the MOS transistor 141 is supplied to the gate of the MOS transistor 141. The high-voltage powers HV1, HV2, and HV3 are voltage in a range from 6 to 15 V.

On the other hand, as shown in FIG. 23, the VX decoder 101 includes N-channel MOS transistors 161 to 163 and level shifters 164 to 166 each shifting up a high level signal to a high voltage Vpp level and shifting down a low level signal to a Vss level. The high voltage Vpp level is a voltage to switch on the N-channel MOS transistors 161 to 163. The VX decoder 101 shown in FIG. 23 is a configuration for a single vertical signal line VXn, and therefore, if the number of the word lines is 32, there are 32 circuits of the same configuration as the VX decoder 101.

The selected word line voltage VREAD (2.5V) is supplied to one end of the MOS transistor 161, and the other end of the MOS transistor 161 is connected to the vertical signal line VXn. The ground voltage Vss (0 V) is supplied to one end of the MOS transistor 162, and the other end of the MOS transistor 162 is connected to the vertical signal line VXn. The unselected word line voltage VPPL (6 V) is supplied to one end of the MOS transistor 163, and the other end of the MOS transistor 163 is connected to the vertical signal line VXn.

A selection signal GWLSn becomes the high level when selecting a word line. The selection signal GWLSn is supplied to the gate of the MOS transistor 161 through the level shifter 164, and at the same time, inverted by an inverter 167. The inverter 167 outputs a selection signal GWLSBn that becomes the high level when selecting no word line. The selection signal GWLSBn is supplied to the gate of the MOS transistor 163 as a signal SEL_ELEV through the level shifter 166.

A signal DISCHARGE becomes the high level when discharging the vertical signal line VXn or a word line WL0n after a program or the like is completed. At the time of normal reading, the signal DISCHARGE becomes the low level. The signal DISCHARGE is supplied to the gate of the MOS transistor 162 through the level shifter 165.

The MOS transistors 161 to 163 select a voltage to be output to the vertical signal lines VXn for selecting a word line, selecting no word line, or discharging.

That is, at the time of selecting a word line, the selection signal GWLSn becomes the high level, and is shifted to a signal SELGATE_VX of the Vpp level by the level shifter 164. The signal SELGATE_VX of the Vpp level is supplied to the MOS transistor 161, by which the MOS transistor 161 is switched on. Meanwhile, the selection signal GWLSn is turned into the selection signal GWLSBn by being inverted by the inverter 167, and is shifted to the signal SEL_ELEV of the Vss level by the level shifter 166. Because the signal SEL_ELEV is a Vss level signal, the MOS transistor 163 is switched off. At this time, the MOS transistor 162 is switched off as described above. Therefore, in this case, the selected word line voltage VREAD (2.5 V) is supplied to the vertical signal line VXn.

At the time of selecting no word line, the selection signal GWLSn becomes the low level, and the selection signal GWLSBn that is an output of the inverter 167 becomes the high level. As a result, the signal SEL_ELEV selection signal GWLSBn supplied to the gate of the MOS transistor 163 becomes the high voltage Vpp level, so that the MOS transistor 163 is switched on and the MOS transistors 161 and 162 are switched off. Therefore, at this time, the unselected word line voltage VPPL (6 V) is supplied to the vertical signal line VXn.

At the time of the discharge, the signal DISCHARGE becomes the high level. As a result, a signal GND_CLAMP supplied to the gate of the MOS transistor 162 becomes the high voltage Vpp level, so that the MOS transistor 162 is switched on and the MOS transistors 161 and 163 are switched off. Therefore, at this time, the ground voltage Vss (0 V) is supplied to the vertical signal line VXn.

In this example, because the unselected word line voltage VPPL is 6 V and the selected word line voltage VREAD is 2.5 V, the signals supplied to the gates of the MOS transistors 161 to 163 are shifted to the high voltage Vpp level by the level shifters 164 to 166, to switch on the MOS transistors 161 to 163. The cross-coupled level shifter shown in FIG. 22 can be used as the level shifters 164 to 166.

The vertical signal line VXn shown in FIG. 23 is connected to a word line driver 140-n of the X decoder 100 shown in FIG. 22. Therefore, to the vertical signal line VXn, the selected word line voltage VREAD (2.5V) is supplied when selecting a word line, the unselected word line voltage VPPL (6 V) is supplied when selecting no word line, and the ground voltage Vss (0 V) is supplied when discharging.

In FIG. 22, when the block selection signal SELB_N becomes the low level, the K node becomes the high level based on a voltage of the high voltage power HV1. Furthermore, the high voltage power HV3 is applied to the K node through the capacitor 156, by which the K node is boosted. When the K node becomes the high level, the MOS transistor 141 that constitutes each of the word line drivers 140-0 to 140-31 is switched on.

When the MOS transistor 141 that constitutes each of the word line drivers 140-0 to 140-31 is switched on, a voltage from corresponding one of the vertical signal lines VX0 to VX31 is supplied to corresponding one of the word lines WL0 to WL31 through the MOS transistor 141. With this operation, the selected word line voltage VREAD (2.5 V) is supplied to a selected word line among the word lines WL0 to WL31 when selecting a word line, the unselected word line voltage VPPL (6 V) is supplied when selecting no word line, and the ground voltage Vss (0 V) is supplied when discharging.

Furthermore, when the K node becomes the high level, the MOS transistor 144 that constitutes the select switch driver 142 and the MOS transistor 146 that constitutes the select switch driver 143 are switched on. When the MOS transistor 144 is switched on, the drive signal GSELD for driving the select transistor SGD is supplied to the selected signal line SELD through the MOS transistor 144. In addition, when the MOS transistor 146 is switched on, the drive signal SELS for driving the select transistor SGS is supplied to the selected signal line SELS through the MOS transistor 146.

The X decoder and the VX decoder in the NAND flash memory according to the first embodiment are explained next. As described above, in the first embodiment, the threshold value of the memory cell is equal to or lower than 0 V. As shown in FIGS. 24 and 25, the X decoder 200 and the VX decoder 201 are configured according to a fact that the threshold value of the memory cell is equal to or lower than 0 V.

In FIG. 24, a MOS transistor 241, MOS transistors 244 to 247, MOS transistors 251 to 255, and a capacitor 256 correspond to the MOS transistor 141, the MOS transistors 144 to 147, the MOS transistors 151 to 155, and the capacitor 156 shown in FIG. 22, respectively.

The X decoder 200 shown in FIG. 24 includes a negative power source 271, an inverter 272, and a negative power source 273 corresponding to a fact that the threshold value of the memory cell is equal to or lower than 0 V. The negative power sources 271 and 273 generate a negative voltage of −3.5 V.

In the first embodiment, a voltage of −3.5 V is supplied to the vertical signal line VXn as the selected word line voltage VREAD and a voltage of 0 V is supplied to the vertical signal line VXn as the unselected word line voltage VPPL. Therefore, when selecting no block, it is necessary to switch off the MOS transistor 241 without fail by applying a negative voltage to the gate of the MOS transistor 241 that constitutes each of word line drivers 240-0 to 240-31. Therefore, the negative power sources 271 and 273 are provided. When a block is not selected, the voltage of the K node is lowered to a level of the negative power source 273. With this operation, the voltage of −3.5 V is supplied to the gate of the MOS transistor 241 that constitutes each of the word line drivers 240-0 to 240-31. As a result, even when the voltage of −3.5 V is supplied to the vertical signal line VXn as the selected word line voltage VREAD, the MOS transistor 241 can be switched off.

At the time of having completed all operations, the vertical signal line VXn is in a state of the ground voltage Vss level by the VX decoder 201 shown in FIG. 25. The X decoder 200 is in a selection state by setting the block selection signal SELB_N to the low level. When it is difficult to generate the high voltage power, such as at a time of standby, the high voltage powers HV1, HV2, and HV3 can be the power source voltage Vcc level. Because the word line is already close to the ground voltage Vss level at the time of having completed various operations, a portion of the K node can be maintained to the ground voltage Vss level in a sufficient manner even with a voltage of (Vcc-Vth). If the high voltage powers HV1, HV2, and HV3 are at the power source voltage Vcc level, a signal having the high level of Vcc (3.0 V) and the low level of −3.5 V is supplied to the MOS transistor 241 that constitutes each of the word line drivers 240-0 to 240-31.

In FIG. 25, MOS transistors 261 to 263 and level shifters 264 to 266 correspond to the MOS transistors 161 to 163 and the level shifters 164 to 166 shown in FIG. 23, respectively. As shown in FIG. 25, the VX decoder 201 includes negative voltage supply units 281 to 283 corresponding to a fact that the threshold value of the memory cell is equal to or lower than 0 V. The negative voltage supply unit 281 includes, for example, a negative power source 281a and a negative voltage pump source 281b. The negative power source 281a generates a negative voltage NEGP (−3.5 V) as a voltage RNEGP when the read mode signal RDz becomes the high level at the time of the reading. The negative voltage pump source 281b supplies the negative voltage NEGP (−3.5V) to the negative power source 281a. Configurations of the negative voltage supply units 282 and 283 can be the same as that of the negative voltage supply unit 281 or can be a configuration different from that of the negative voltage supply unit 281. In addition, although three negative voltage supply units are provided in the example shown in FIG. 25, a configuration of having a common negative voltage supply units as can be possible is also included in the scope of the present invention.

As shown in FIG. 25, in the first embodiment, the selected word line voltage VREAD is −3.5 V and the unselected word line voltage VPPL is the ground voltage Vss (0 V).

The MOS transistors 261 to 263 select a voltage to be output to the vertical signal lines VXn for selecting a word line, selecting no word line, or discharging. However, the selected word line voltage VREAD is a negative voltage (−3.5 V). Therefore, in order to block the selected word line voltage VREAD of the negative voltage when selecting no word line, the negative voltage supply unit 281 is provided. With this configuration, the low level voltage supplied to the gate of the MOS transistor 261 becomes the negative voltage (−3.5 V).

For example, at the time of selecting a word line, the selection signal GWLSn becomes the high level, and the signal SELGATE_VX supplied to the gate of the MOS transistor 261 becomes the high voltage Vpp level, so that the MOS transistor 261 is switched on, and the selected word line voltage VREAD (−3.5 V in this case) is supplied to the vertical signal line VXn.

At the time of selecting a word line, the selection signal GWLSn becomes the low level, and the selection signal GWLSn is inverted by an inverter 267. In this case the selection signal GWLSBn of the high level is output from the inverter 267. The selection signal GWLSBn of the high level is then supplied to the level shifter 266, and the signal SEL_ELEV of the high voltage Vpp level, which is an output of the level shifter 266, is supplied to the gate of the MOS transistor 263. As a result, the MOS transistor 263 is switched on, and the unselected word line voltage VPPL (the ground voltage Vss (0 V) in this case) is supplied to the vertical signal line VXn. At this time, the signal SELGATE_VX supplied to the gate of the MOS transistor 261 becomes the negative voltage RNEGP (−3.5 V) level, so that the MOS transistor 261 is switched off, and the selected word line voltage VREAD is not supplied to the vertical signal line VXn.

Furthermore, at the time of selecting a word line, the selected word line voltage VREAD (−3.5 V in this case) is supplied to the vertical signal line VXn. At this time, it is considered that the selected word line voltage VREAD that is a negative voltage is leaked to a ground voltage Vss supply line or an unselected word line voltage VPPL supply line through the N-channel MOS transistors 262 and 263.

At the time of handling this problem, the negative voltage supply units 282 and 283 are provided to cause the low level of a node of the signal GND_CLAMP supplied to the gate of the MOS transistor 262 or the signal SEL_ELEV supplied to the gate of the MOS transistor 263 to be the negative voltage RNEGP (−3.5 V). As described above, the configurations of the negative voltage supply units 282 and 283 can be the same as that of the negative voltage supply unit 281 or can be a configuration different from that of the negative voltage supply unit 281. This makes it possible to prevent the selected word line voltage VREAD of the negative voltage from being leaked to the ground voltage Vss supply line or the unselected word line voltage VPPL supply line through the N-channel MOS transistors 262 and 263.

In addition, if the unselected word line voltage is set to 0 V, the MOS transistor 262 for discharging can be switched on instead of the MOS transistor 263 for the unselected word line voltage at the time of selecting no word line. In this case, it suffices to change logics of the signal DISCHARGE and the signal GWLB.

In the case of the unselected word line voltage VPPL (0 V) level, the voltage of the node of the signal SEL_ELEV supplied to the gate of the MOS transistor 263 or the signal GND_CLAMP supplied to the gate of the MOS transistor 262 is set to a higher voltage when all the operations are completed. That is, if the unselected word line voltage is 0 V, the unselected word line voltage can be selected by the signal GND_CLAMP, and if the unselected word line voltage is, for example, −0.2 V, the unselected word line voltage can be selected by the signal SEL_ELEV.

Because the high voltage Vpp is used in the level shifters 264 to 266, generating the high voltage Vpp at the time of standby increases the current consumption. In the first embodiment, because the unselected word line voltage is 0 V and the selected word line voltage is −3.5 V, the level of the high voltage Vpp can be the power source voltage Vcc. If the levels of the signal SEL_ELEV supplied to the gate of the MOS transistor 263 and the signal GND_CLAMP supplied to the gate of the MOS transistor 262 are the power source voltage Vcc level, there is no problem in maintaining the voltages in a sufficient manner because the voltage of the vertical signal line VXn is at the ground voltage Vss level. If the level of the high voltage Vpp is the power source voltage Vcc, a signal having the high level of the power source voltage Vcc (3.0 V) and the low level of −3.5 V is supplied to the gate of the MOS transistor for selecting the selected word line voltage VREAD.

In the above example, the negative voltage is handled with the N-channel MOS transistor. In the case of handling the negative voltage with the N-channel MOS transistor, a negative voltage is supplied to a back gate (HV-PWELL) of an N-channel FET. Normally, the ground voltage Vss is supplied to the back gate (HV-PWELL) of the N-channel FET.

Figure 26:
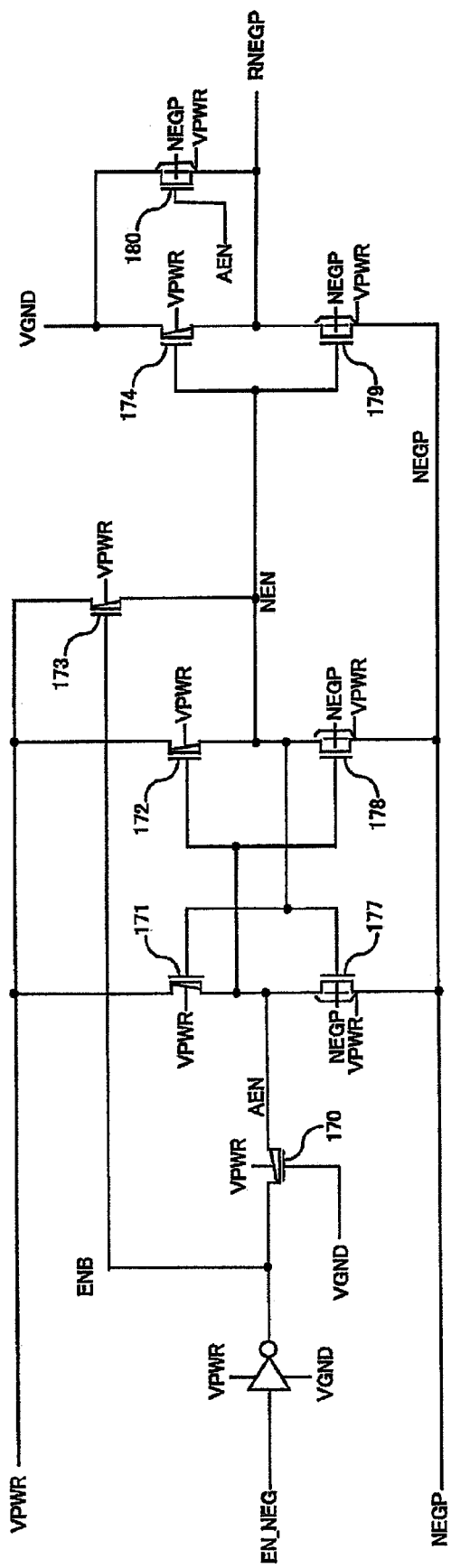
FIG. 26 is an explanatory diagram of a case when a negative voltage is handled in an N-channel MOS transistor.

FIG. 26 is a circuit diagram showing an example of a specific circuit configuration for the negative voltage supply units 281 to 283 shown in FIG. 25, in which a negative voltage is supplied to the back gate (HV-PWELL) of the N-channel MOS transistor to handle the negative voltage. The circuit shown in FIG. 26 is constituted by P-channel MOS transistors 170 to 174 and N-channel MOS transistors 177 to 180, to which a positive voltage VPWR and a negative voltage NEGP are supplied. The negative voltage NEGP is supplied to the back gates of all the N-channel MOS transistors 177 to 180. In this circuit, if a signal EN_NEG becomes the high level when the negative voltage NEGP is supplied, the negative voltage NEGP is output to the output voltage RNEGP, and if the signal EN_NEG becomes the low level, 0 V (VGND) is output to the output voltage RNEGP. In this kind of circuit, the negative voltage NEGP is supplied to the back gates of the N-channel MOS transistors 177 to 179 in order to make sure that an unselected N-channel MOS transistor is switched off.

Also in the cases of the X decoder 200 and the VX decoder 201 shown in FIGS. 24 and 25, the negative voltage NEGP is supplied to the back gate of the N-channel MOS transistor in order to make sure that the unselected N-channel MOS transistor is switched off at the negative voltage.

As is clear from the above explanations, in the NAND flash memory according to the first embodiment, the voltage of 0 V as the unselected word line voltage and the voltage of −3.5 V as the selected word line voltage are required at the time of reading. Generation of a voltage to be applied to the word line is explained next.

Figure 27:
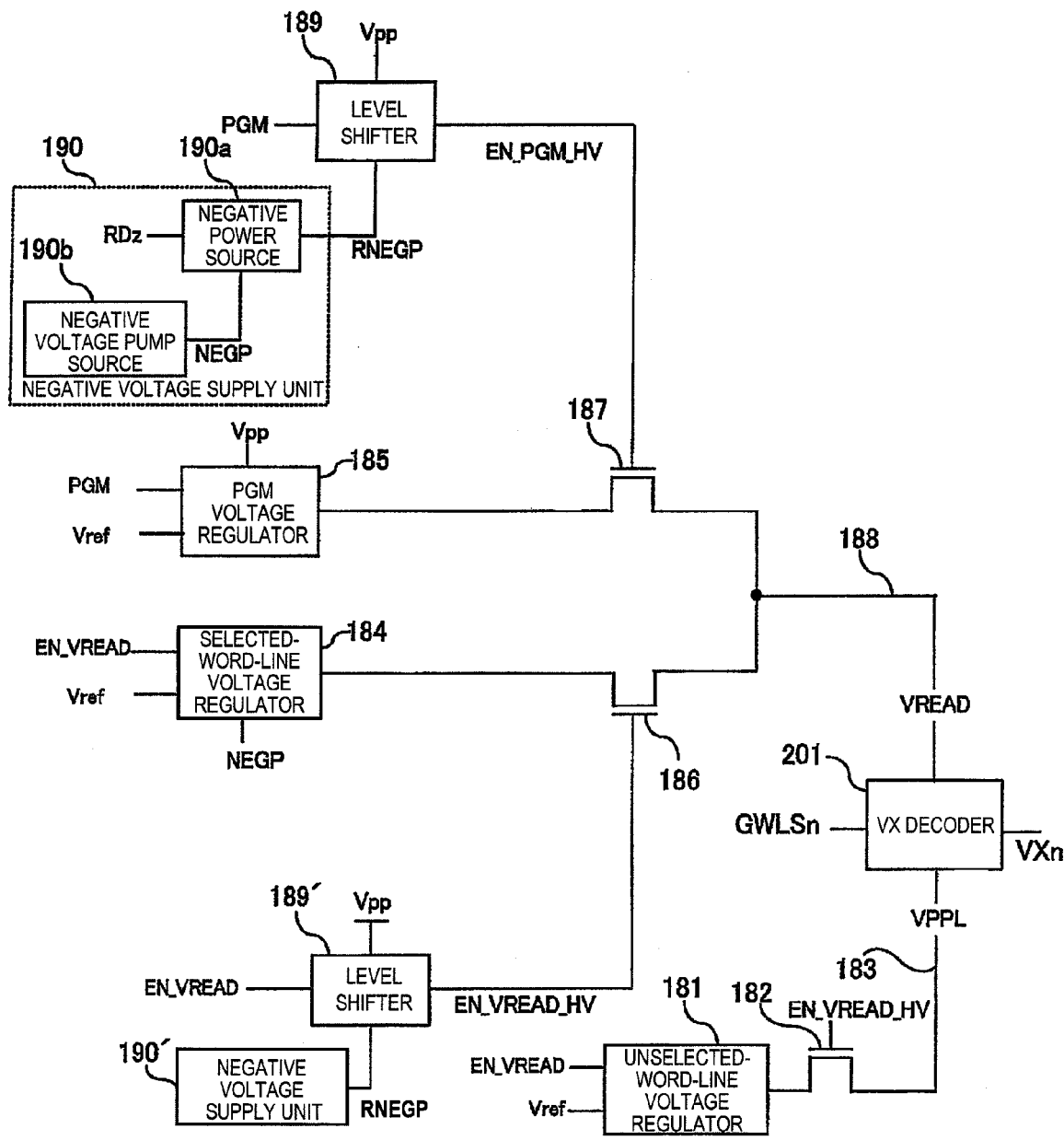
FIG. 27 is a block diagram showing a configuration of a voltage generating circuit according to the first embodiment for supplying a voltage to word lines.

FIG. 27 is a block diagram showing an example of a configuration of the WL/uWL regulator 15 according to the first embodiment. In FIG. 27, an unselected-word-line voltage regulator 181 generates the unselected word line voltage VPPL (0 V). The voltage from the unselected-word-line voltage regulator 181 is supplied to a voltage supply line 183 through a MOS transistor 182, and supplied to the VX decoder 201 as the unselected word line voltage VPPL. A signal EN_VREAD_HV is supplied to the gate of the MOS transistor 182.

A selected-word-line voltage regulator 184 generates the selected word line voltage VREAD (−3.5 V). The voltage from the selected-word-line voltage regulator 184 is supplied to a voltage supply line 188 through a MOS transistor 186, and supplied to the VX decoder 201 as the selected word line voltage VREAD.

A PGM voltage regulator 185 generates a voltage used in a programming. The voltage from the PGM voltage regulator 185 is supplied to the voltage supply line 188 through a MOS transistor 187, and supplied to the VX decoder 201 as a programming voltage.

In this manner, the voltages to be applied to the word lines are generated by the unselected-word-line voltage regulator 181 and the selected-word-line voltage regulator 184, and supplied to the VX decoder 201. The unselected-word-line voltage regulator 181 and the selected-word-line voltage regulator 184 are activated at the time of reading by a POR signal and a VCCOK signal.

The voltage supply line 188 is also used, for example, when supplying a high voltage for programming. These voltages are selected by selector MOS transistors 186 and 187. The gate voltages of the MOS transistors 186 and 187 are normally 0 V when in a non-operating state. When the selected word line voltage VREAD is a negative voltage, the programming voltage cannot be completely cut off, leading to current leakage. Therefore, level shifters 189 and 189' are provided to set the gate voltages of the selector MOS transistors 186 and 187 to a negative voltage in a non-operating state.

Although the unselected word line voltage VPPL has been described as the ground voltage (Vss (0 V)) in the above explanations, it is not necessarily to be exactly 0 V, but a slight error can be included. Similarly, although the selected word line voltage VREAD is described as −3.5 V, it is not necessarily to be exactly −3.5 V, but a slight error can be included. That is, in the present invention, the unselected word line voltage VPPL and the selected word line voltage VREAD include values in a range that can perform operations of the present invention described above.

In addition, in the above examples, because the unselected word line voltage VPPL is set to the ground voltage (Vss (0 V)) and the selected word line voltage VREAD is set to −3.5 V, it is necessary to supply −3.5 V generated by a negative voltage charge pump to the selected-word-line voltage regulator 184. However, a two-stage charge pump is enough to generate −3.5 V from −3 V that is obtained by inverting the power source voltage Vcc.

That is, if reading can be performed with a voltage in a range of 1.5 times the absolute value of the power source voltage, a charge pump circuit and a booster circuit can be realized with about two stages, and the efficiency can be about 80%. Therefore, there occur substantially no degradation of the operation speed and the energy efficiency. As a matter of course, if the selected word line voltage VREAD is set to −3.0 V, the negative voltage charge pump is not required. Therefore, it is sufficient if the selected word line voltage VREAD is set to a voltage in a range from −4 to −3 V that is the range of 1.5 times the absolute value of the power source voltage.

Furthermore, in the first embodiment, there is no need for supplying a negative voltage to a well of the memory cell at the time of reading. In the case of biasing the well constantly to the negative side, a negative voltage charge pump or booster has to be constantly in an operating state, resulting in an increase of the power consumption at the time of standby.

Second Embodiment

<2-1. Threshold Value in Second Embodiment>

The second embodiment of the present invention is explained next. In the first embodiment described above, it is configured that the threshold value of the memory cell is distributed around −6 V for the data "1" and around −2.5 V for the data "0", the selected word line voltage VREAD is set to −3.5 V, and the unselected word line voltage VPPL is set to 0 V. However, in the second embodiment, the threshold value is set in the following manner.

Figure 28:
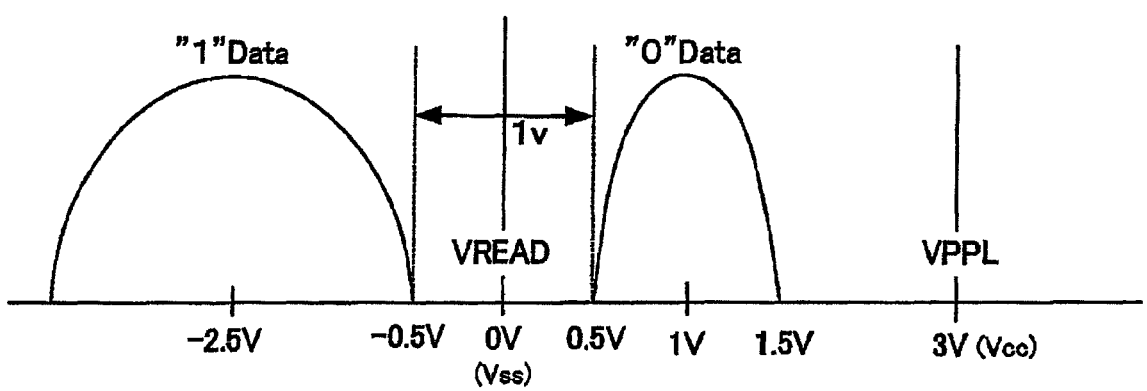
FIG. 28 is an explanatory diagram of a distribution of threshold values of memory cells in a second embodiment of the present invention.

FIG. 28 is a graph representing a distribution of threshold values of memory cells M0, M1, ... according to the second embodiment. In the example shown in FIG. 28, the threshold values of the memory cells are distributed around −2.5 V in the case of data "1" and around 1.0 V in the case of data "0". Therefore, when a voltage of 3 V (the power source voltage Vcc) is applied to the word lines WL0, WL1, ..., all the memory cells M0, M1, ... are switched on. When a voltage of 0 V is applied to the word lines WL0, WL1, ..., the memory cells M0, M1, ... are switched off if the memory cells are programmed and switched on if the memory cells are not programmed. Therefore, in this case, the selected word line voltage VREAD is 0 V, and the unselected word line voltage VPPL is 3 V (the power source voltage Vcc).

Figure 29:
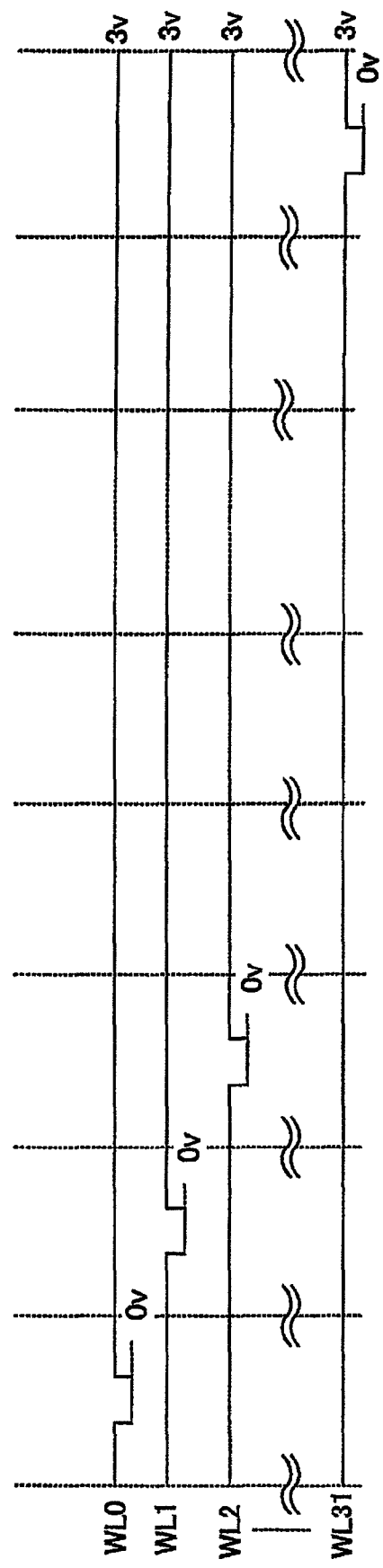
FIG. 29 is an explanatory diagram of a voltage waveform of word lines in the second embodiment.

FIG. 29 is a waveform diagram showing a voltage waveform of each of word lines when the selected word line voltage VREAD is set to the ground voltage Vss (0 V) and the unselected word line voltage VPPL is set to the power source voltage (3 V) as described above.

As shown in FIG. 29, when entering the read operation state, all word lines WL0, WL1, ..., WL31 are already set to the unselected word line voltage of 3 V. When the word line WL0 is selected, a voltage of the word line WL0 is lowered to the selected word line voltage of 0 V, and when the data reading is completed, the voltage of the word line WL0 is returned to 3 V. Subsequently, when the word line WL1 is selected, a voltage of the word line WL1 is lowered to the selected word line voltage of 0 V, and when the data reading is completed, the voltage of the word line WL1 is returned to 3 V. Voltages of the word lines WL2, ..., WL31 are then sequentially lowered to the selected word line voltage of 0 V, and when the data reading is completed, the voltages of the word lines WL2, ..., WL31 are returned to 3 V. During this time, voltages of the other unselected word lines are constantly maintained to 3 V.

As explained above, in this case, the voltage of a word line of a single memory cell is lowered to 0 V once at the time of selecting the word line, and in the other periods, is maintained constant to 3 V. Because the voltage applied to the memory cell is substantially constant during the read operation state, there is substantially no influence of the read disturbance.

<2-2. Read Timing in Second Embodiment>

A timing setting at the time of the reading in the second embodiment is explained next. In the same manner as the first embodiment describe above, timings for the reading in the second embodiment can be considered to include a timing setting of switching on a select transistor SGD after starting a pre-charge of a bit line BL, lowering a selected word line voltage to VREAD, and finally, switching on a select transistor SGS (a first timing setting), a timing setting of switching on the select transistor SGD at the same time as the start of the pre-charge of the bit line BL, lowering the selected word line voltage to VREAD upon completing the pre-charge, and finally, switching on the select transistor SGS (a second timing setting), and a timing setting of starting the pre-charge of the bit line BL, lowering the selected word line voltage to VREAD, switching on the select transistor SGD, and finally, switching on the select transistor SGS (a third timing setting).

Figure 30:
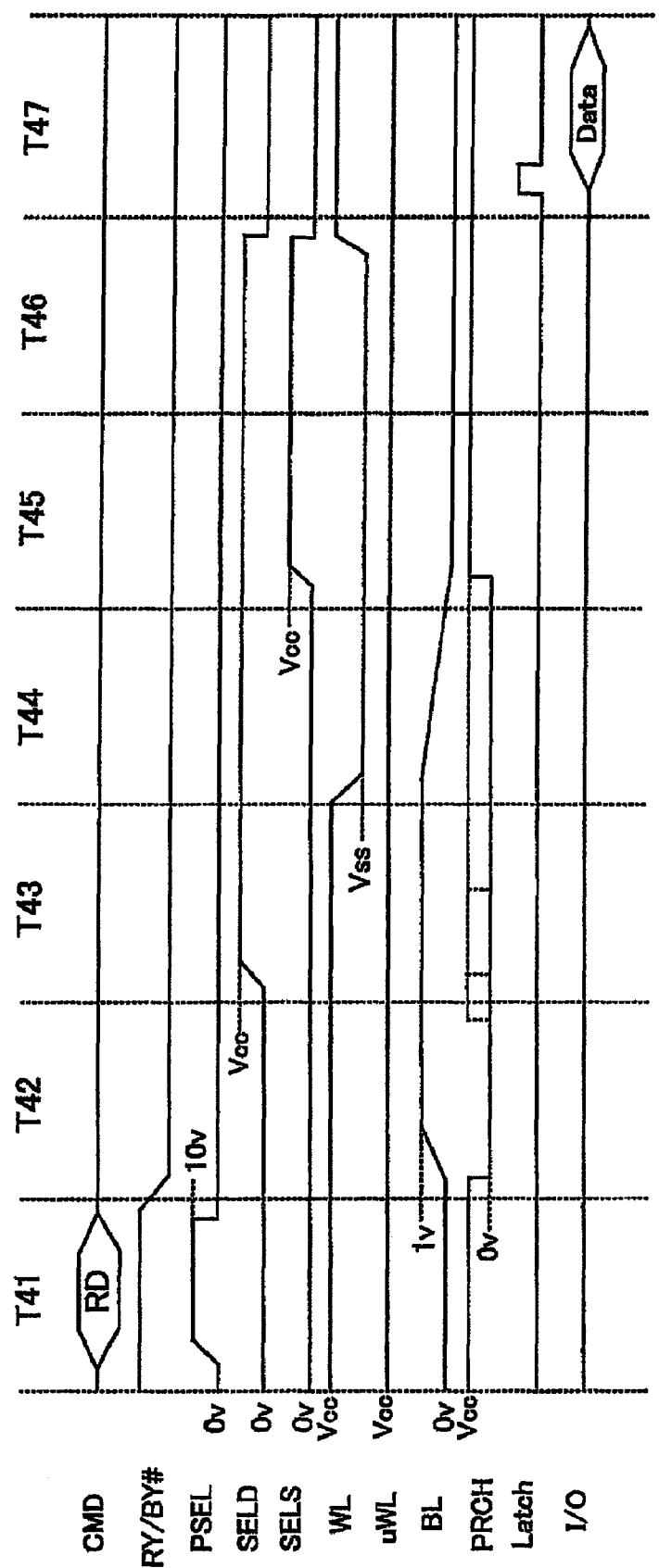
FIG. 30 is a waveform diagram showing a waveform of each part set at a first timing in the second embodiment.

FIG. 30 shows a waveform of each part set at the first timing in the second embodiment. As shown in FIG. 30, at a time T41, upon receiving a read command RD from the command decoder 11, an initial operation starts, and the bit line BL is discharged by a signal PSEL. At this moment, both the voltage of the selected word line WL and the voltage of the unselected word line uWL are 3 V (the power source voltage Vcc).

Next, at a time T42, a pre-charge signal PRCH becomes the low level, and the pre-charge of the bit line BL starts. This causes the voltage of the bit line BL to rise. In this example, the bit line BL is pre-charged to 1 V.

An end timing of the pre-charge can be before or after or simultaneously with rising of the selected signal line SELD after the start of the pre-charge, before or after or simultaneously with falling of the selected word line WL, or before or simultaneously with rising of the selected signal line SELS (see a dotted line of the signal PRCH). If the pre-charge is completed before the selected signal line SELD rises, there is an advantage that it is possible to reduce the current consumption. If the end of the pre-charge is later than the rising of the selected signal line SELD, it is possible to lengthen the pre-charge time. In addition, because the pre-charge is performed additionally to the selected word line WL after the select transistor SGD is opened, a level difference due to data of the bit line EL can be widely taken, so that the read margin increases.

Next, at a time T43, the drive signal of the selected signal line SELD becomes the power source voltage Vcc, and the select transistor SGD is switched on.

Next, at a time T44, the voltage of the selected word line WL is lowered to 0 V (the ground voltage Vss), and at a time T45, the drive signal of the selected signal line SELS becomes the power source voltage Vcc, and the select transistor SGS is switched on.

At a time T46, after a read determination of the bit line BL, the voltages of the selected signal lines SELD and SELS are returned to 0 V, and the voltage of the selected word line WL is returned to 3 V (the power source voltage Vcc).

At a time T47, an output data is latched in the latch 18 by a latch pulse Latch and output from the I/O buffer 19. During the times T41 to T47, the unselected word line uWL is maintained to a fixed voltage.

Figure 31:
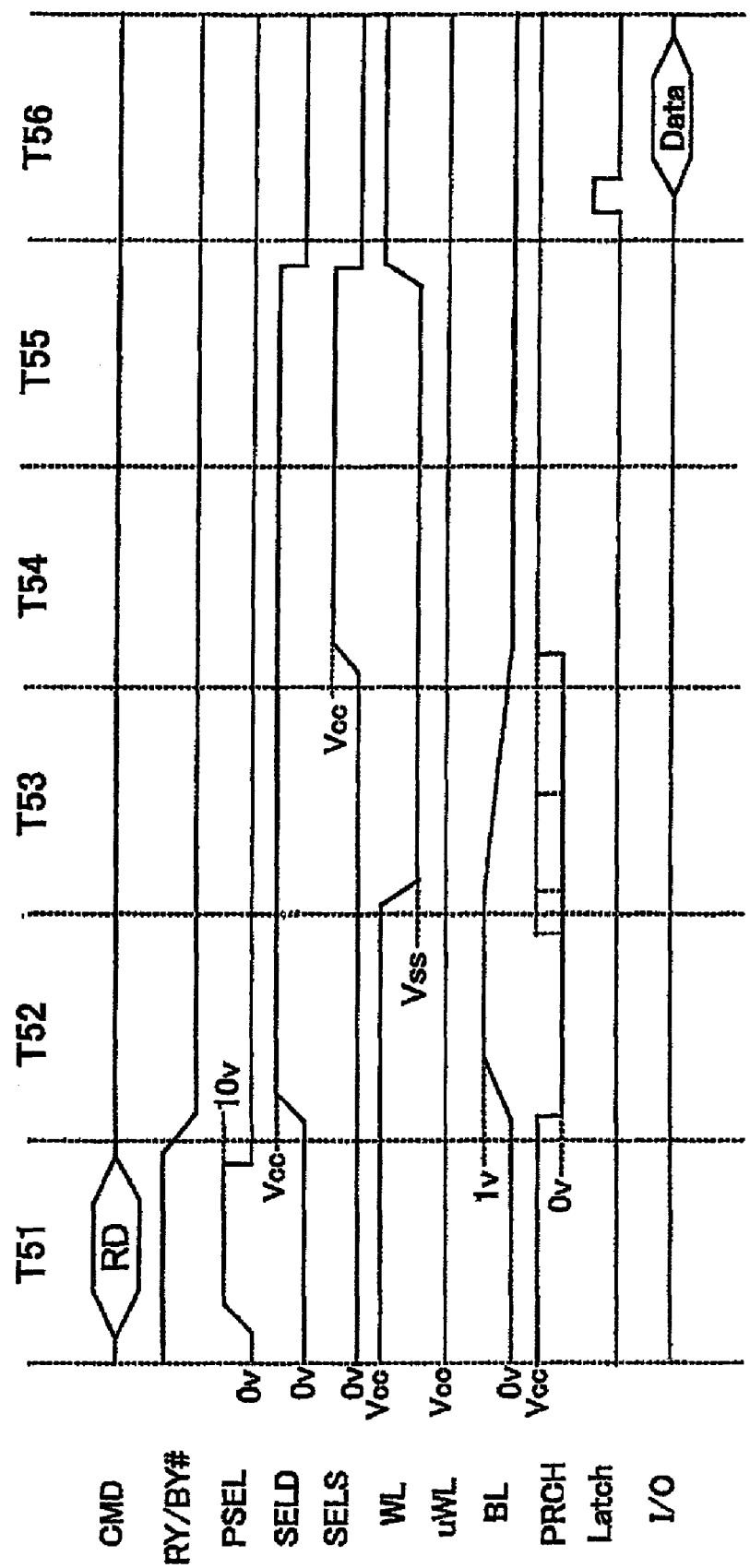
FIG. 31 is a waveform diagram showing a waveform of each part set at a second timing in the second embodiment.

FIG. 31 is a waveform of each part set at a second timing in the second embodiment. As shown in FIG. 31, at a time T51, upon receiving a read command RD from the command decoder 11, an initial operation starts, and the bit line BL is discharged by the signal PSEL. At this moment, both the voltage of the selected word line WL and the voltage of the unselected word line uWL are 3 V (the power source voltage Vcc).

Next, at a time T52, a pre-charge signal PRCH becomes the low level, and the pre-charge of the bit line BL starts. This causes the voltage of the bit line BL to rise. In this example, the bit line BL is pre-charged to 1 V. At the same time, at a time T52, the drive signal of the selected signal line SELD becomes the power source voltage Vcc, and the select transistor SGD is switched on.

An end timing of the pre-charge can be before or after or simultaneously with rising of the selected signal line SELD after the start of the pre-charge, before or after or simultaneously with falling of the selected word line WL, or before or simultaneously with rising of the selected signal line SELS (see a dotted line of the signal PRCH). If the pre-charge is completed before the selected signal line SELD rises, there is an advantage that it is possible to reduce the current consumption. If the end of the pre-charge is later than the rising of the selected signal line SELD, it is possible to lengthen the pre-charge time. In addition, because the pre-charge is performed additionally to the selected word line WL after the select transistor SGD is opened, a level difference due to data of the bit line BL can be widely taken, so that the read margin increases.

Next, at a time T53, the voltage of the selected word line WL is lowered to 0 V (the ground voltage Vss), and a time T54, the drive signal of the selected signal line SELS becomes the power source voltage Vcc, and the select transistor SGS is switched on.

At a time T55, after a read determination of the bit line BL, the voltages of the selected signal lines SELD and SELS are returned to 0 V, and the voltage of the selected word line WL is returned to 3 V (the power source voltage Vcc).

At a time T56, an output data is latched in the latch 18 by a latch pulse Latch and output from the I/O buffer 19. During the times T51 to T56, the unselected word line uWL is maintained to a fixed voltage.

Figure 32:
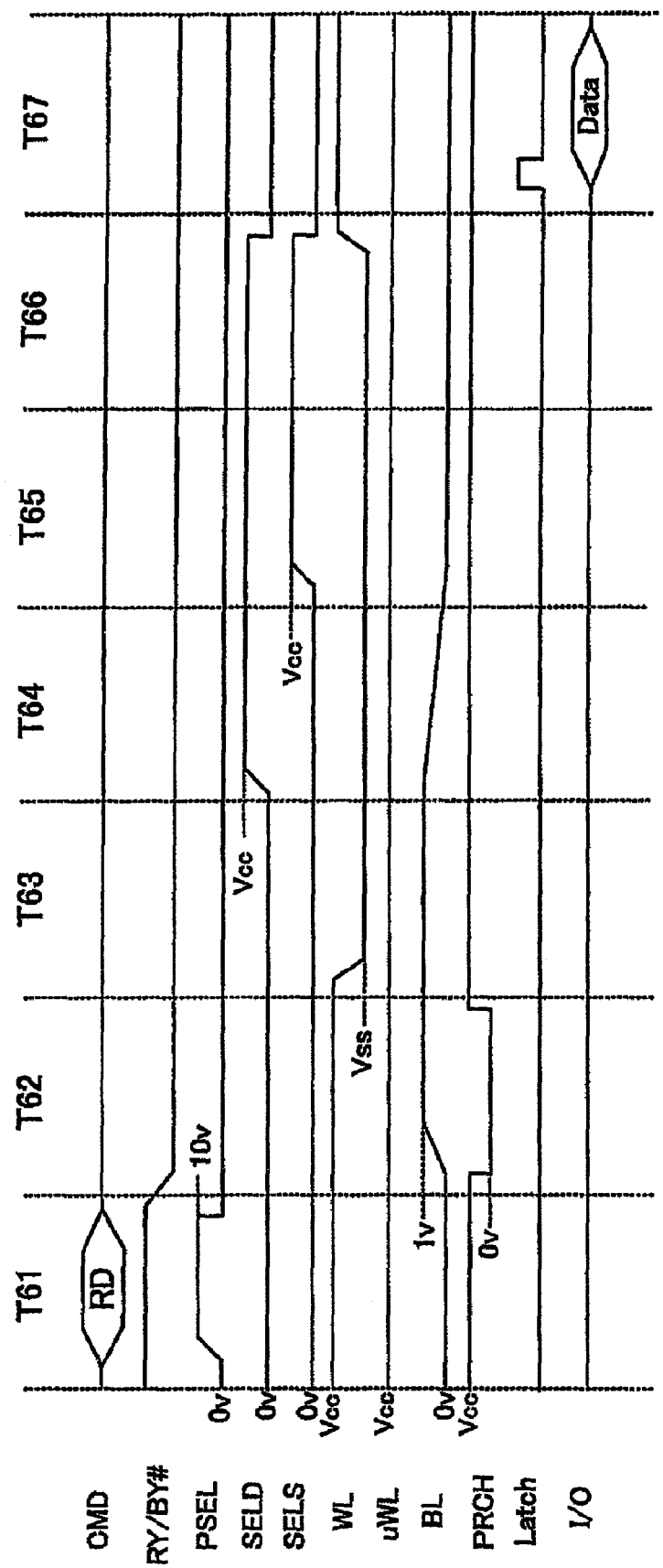
FIG. 32 is a waveform diagram showing a waveform of each part set at a third timing in the second embodiment.

FIG. 32 is a waveform of each part set at a third timing in the second embodiment. As shown in FIG. 32, at a time T61, upon receiving a read command RD from the command decoder 11, an initial operation starts, and the bit line EL is discharged by the signal PSEL. At this moment, both the voltage of the selected word line WL and the voltage of the unselected word line uWL are 3 V (the power source voltage Vcc).

Therefore, at a time T62, a pre-charge signal PRCH becomes the low level, and the pre-charge of the bit line BL starts. This causes the voltage of the bit line BL to rise. In this example, the bit line BL is pre-charged to 1 V. An end timing of the pre-charge is before rising of the selected signal line SELD.

Next, at a time T63, the voltage of the selected word line WL is lowered to 0 V (the ground voltage Vss), and at a time T64, the drive signal of the selected signal line SELD becomes the power source voltage Vcc, and the select transistor SGD is switched on. At a time T65, the drive signal of the selected signal line SELS becomes the power source voltage Vcc, and the select transistor SGS is switched on.

At a time T66, after a read determination of the bit line BL, the voltages of the selected signal lines SELD and SELS are returned to 0 V, and the voltage of the selected word line WL is returned to 3 V (the power source voltage Vcc).

At a time T67, an output data is latched in the latch 18 by a latch pulse Latch and output from the I/O buffer 19. During the times T61 to T67, the unselected word line uWL is maintained to a fixed voltage.

<2-3. Power Supply to Word Lines in Second Embodiment>

An X decoder 300 and a VX decoder 301 in the NAND flash memory according to the second embodiment are explained next (see FIGS. 33 and 34). As described above, in the second embodiment, the unselected word line voltage VPPL is the power source voltage Vcc (3 V) and the selected word line voltage VREAD is the ground voltage Vss (0 V), so that the threshold value of the memory cell never becomes below 0 V. Therefore, basically, the same configurations as the X decoder 100 and the VX decoder 101 shown in FIGS. 22 and 23 can be used for the X decoder 300 and the VX decoder 301.

Figure 33:
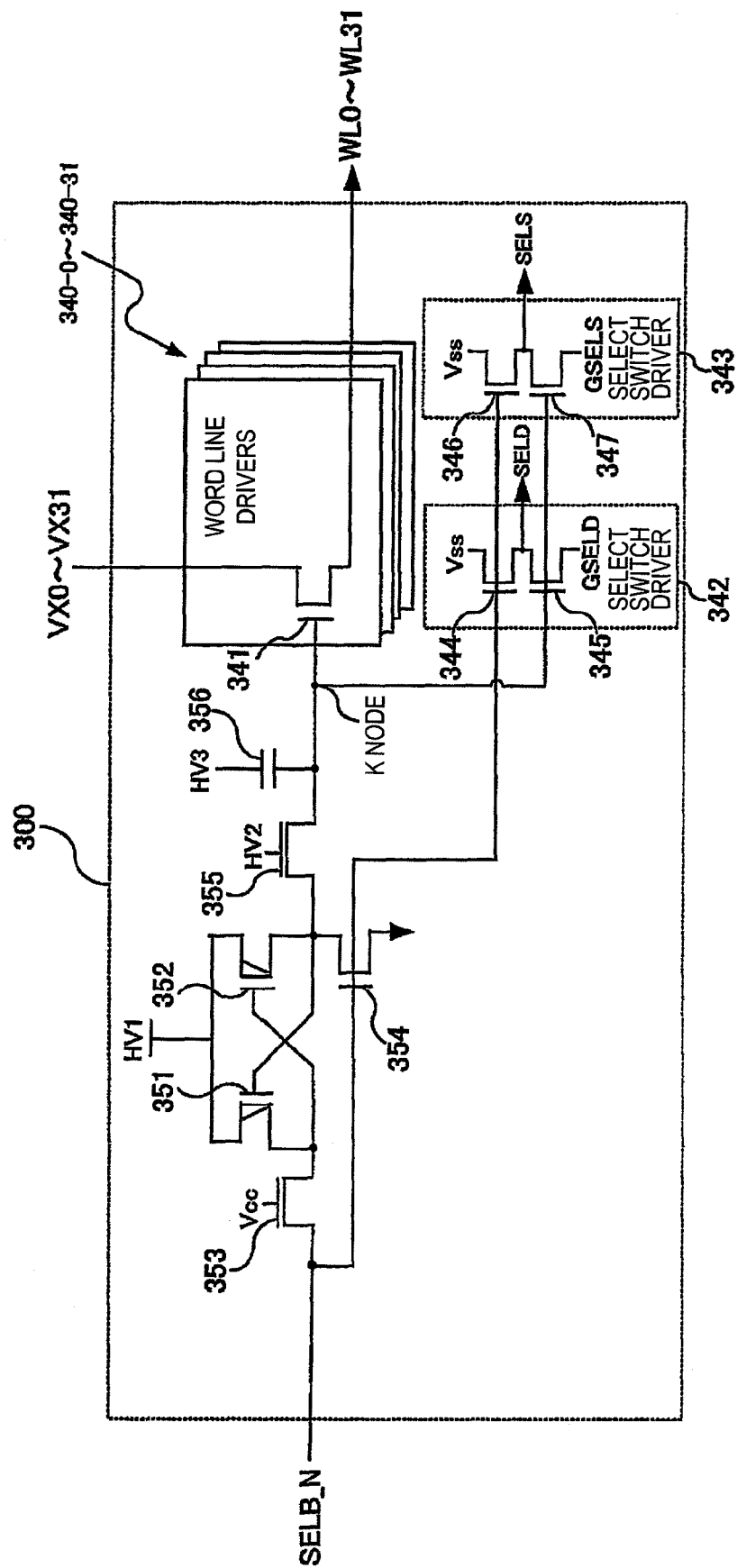
FIG. 33 is a block diagram for explaining a configuration of an X decoder according to the second embodiment.

FIG. 33 is a block diagram showing a configuration of the X decoder 300 according to the second embodiment. In FIG. 33, a MOS transistor 341, MOS transistors 344 to 347, MOS transistors 351 to 355, and a capacitor 356 correspond to the MOS transistor 141, the MOS transistors 144 to 147, the MOS transistors 151 to 155, and the capacitor 156 shown in FIG. 22, respectively. In this case, the high voltage powers HV1, HV2, and HV3 can be the power source voltage Vcc level. Furthermore, in this case, a signal having the high level of 3.0 V and the low level of Vss (0 V) is supplied to the gate of the MOS transistor 341 that constitutes each of word line drivers 340-0 to 340-31.

Figure 34:
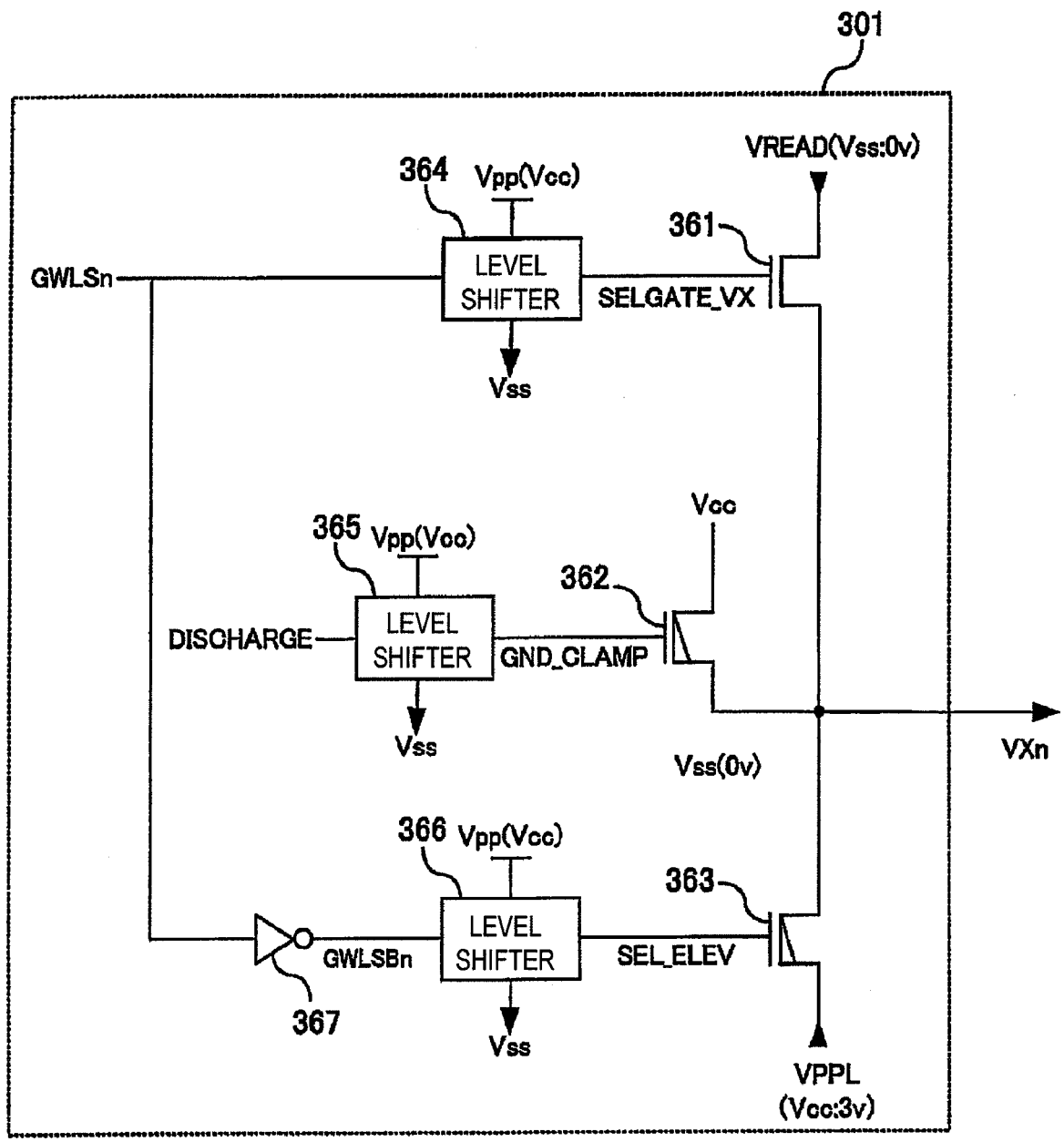
FIG. 34 a block diagram for explaining a configuration of a VX decoder according to the second embodiment.
Figure 35:
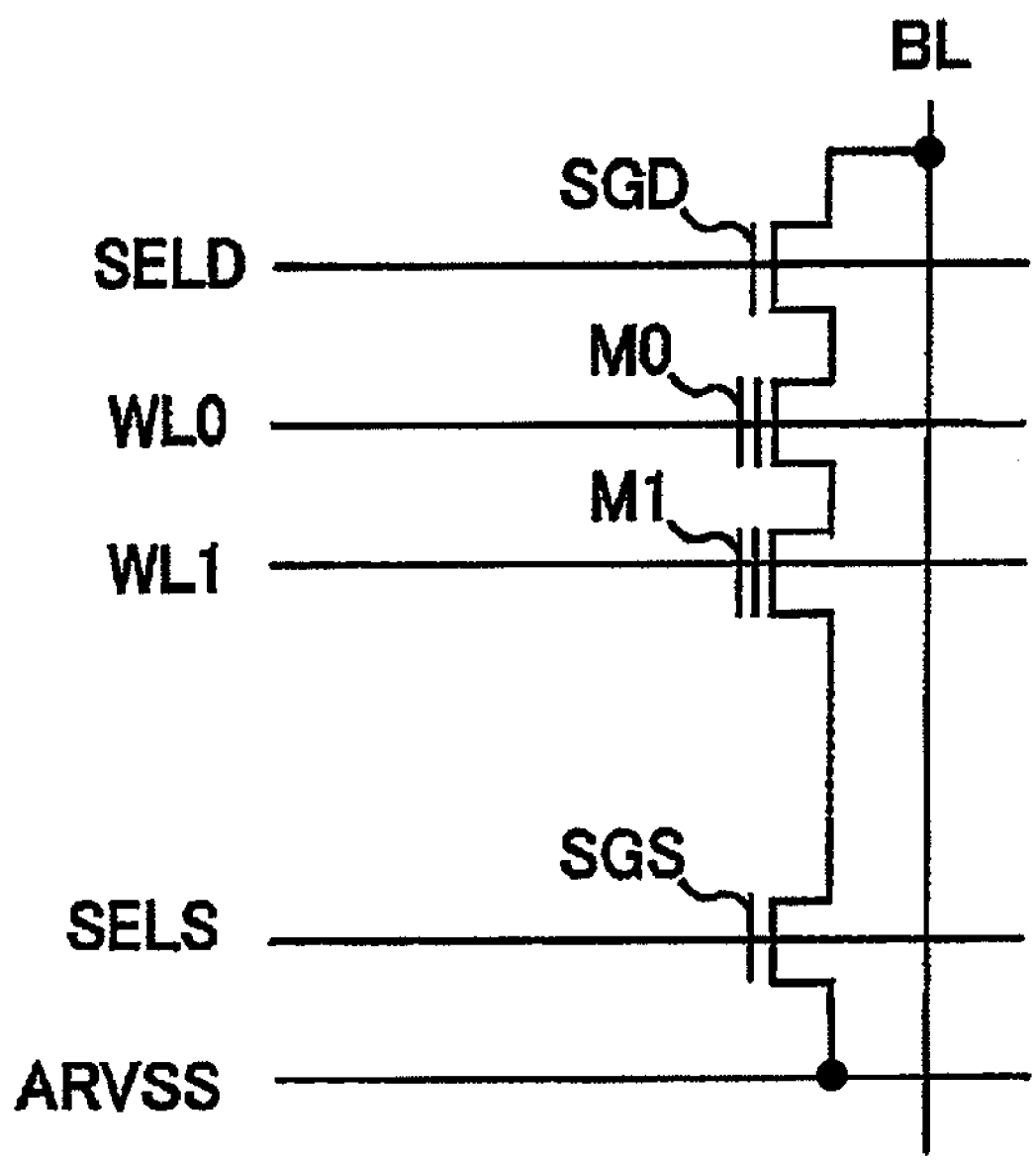
FIG. 35 is a circuit diagram for explaining a configuration of conventional NAND strings.

FIG. 34 a block diagram showing a configuration of the VX decoder 301 according to the second embodiment. In FIG. 34, MOS transistors 361 to 363 and level shifters 364 to 366 correspond to the MOS transistors 161 to 163 and the level shifters 164 to 166 shown in FIG. 23, respectively. The high voltage Vpp to be applied to the level shifters 364, 365, and 366 can be the power supply voltage Vcc.

As shown in FIG. 34, in the second embodiment, the selected word line voltage VREAD is the ground voltage Vss (0 V) and the unselected word line voltage VPPL is the power source voltage Vcc (3 V). In addition, in the second embodiment, a discharge voltage is set to the power source voltage Vcc, by which the vertical signal line VXn is pulled up to the power source voltage Vcc.

In order to avoid a voltage consumption at the time of standby, P-channel MOS transistors are used as the MOS transistor 362 for selecting a discharge voltage and the MOS transistor 363 for selecting the unselected word line voltage. By adopting this configuration, a low level signal is supplied to the gate of the MOS transistor 363 so that the MOS transistor 363 is switched on, and as a result, it is possible to maintain the word line voltage to the unselected word line voltage at the time of standby.

In this case, a signal SELGATE_VX having the high level of the power source voltage Vcc and the low level of Vss is supplied to the MOS transistor 361 for selecting the selected word line voltage VREAD. A signal SEL_ELEV having the high level of the power source voltage Vcc and the low level of Vss is supplied to the MOS transistor 363 for selecting the unselected word line voltage VPPL. A signal GND_CLAMP having the high level of the power source voltage Vcc and the low level of Vss is supplied to the MOS transistor 362 for selecting the pre-charge voltage. Because the MOS transistor 361 is the N-channel type and the MOS transistors 362 and 363 are the P-channel types, the logics are reversed when selecting the selected word line voltage VREAD, when selecting the unselected word line voltage VPPL, and when selecting the pre-charge voltage.

Although the unselected word line voltage VPPL is described as the power source voltage (Vcc (3 V)) in the above explanation, it is not necessarily to be exactly 3 V, but a slight error can be included. Similarly, although the selected word line voltage VREAD is described as the ground voltage (Vss (0 V)), it is not necessarily to be exactly 0 V, but a slight error can be included. Although the power source voltage Vcc is describe as 3 V, the same is true for power source voltages Vcc having different levels.

As explained above, when reading data from a memory cell in the second embodiment, it is configured that the voltage of the unselected word line is fixed to the predetermined voltage VPPL (the power source voltage (3V)), and at the time of selecting a word line, the voltage of the selected word line is lowered to the predetermined voltage VREAD (the ground voltage (0 V)). This makes it possible to reduce the influence of the read disturbance at the time of the reading. In addition, in the second embodiment, it is possible to drive the memory device in a range from the power source voltage Vcc (3 V) to the ground voltage (0 V) at the time of the reading. Therefore, a negative power source and a voltage step-up circuit are not required, and as a result, it is possible to achieve a reduced operation time with a low power consumption.

3. Third Embodiment (1) Circuit Configuration of Memory System (Nonvolatile Semiconductor Memory System)

Figure 40:
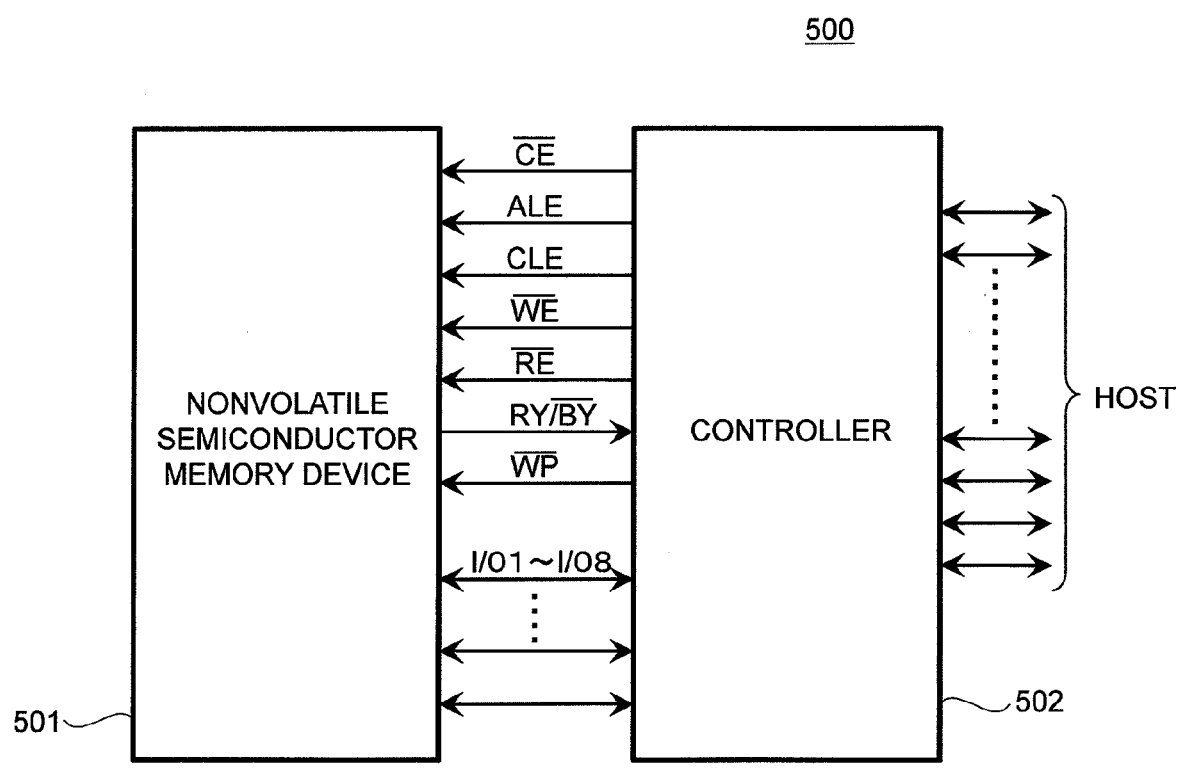
FIG. 40 is a block diagram showing a configuration of a memory system according to a third embodiment of the present invention.

A nonvolatile semiconductor memory system according to a third embodiment of the present invention is explained next. The nonvolatile semiconductor memory system according to the third embodiment includes a controller that controls a nonvolatile semiconductor memory device. FIG. 40 is a block diagram showing a configuration of a memory system 500 according to the third embodiment. The memory system 500 includes a nonvolatile semiconductor memory device 501 and a controller 502. The controller 502 performs a control of an operation (data reading, data writing, and data erasing) of the nonvolatile semiconductor memory device 501 based on a command for writing, reading or the like from a host. The nonvolatile semiconductor memory device 501 includes a control pin and an I/O pin. The control pin is used for basically receiving a control signal from the controller 502, and the I/O pin is used for basically sending and receiving data with the controller 502, receiving a command from the controller 502, and sending a status to the controller 502. In the present example, the control pin includes /CE (chip enable), ALE (address latch enable), CLE (command latch enable), /WE (write enable), /RE (read enable), RY and /BY (ready and busy), /WP (write protect) and the like, and the I/O pin includes I/O1 to I/O8. The control pin and the I/O pin are connected to the controller 502.

The present invention is not limited to the above embodiments, and various modifications and applications can be made without departing from the scope of the invention. The memory cell structure is not necessarily be a floating gate type. It could also be a charge-trapping type or a SONOS (Silicon-Oxide-Nitride-Oxide-Silicon) type or a MONOS (Metal-Oxide-Nitride-Oxide-Silicon) type or whatever a non-volatile cell constructing a NAND string.

The present invention may be applied to various kinds of FETs such as MISs (Metal-Insulator Semiconductors) and TFTs (Thin Film Transistors), other than MOSs (Metal Oxide Semiconductors). The present invention may be applied to various kinds of FETs such as transistors. The transistors may be other transistors than FETs. The transistors may partially include bipolar transistors. Also, p-channel transistors or PMOS transistors are typical examples of the transistors of the first conductivity type, and n-channel transistors or NMOS transistors are typical examples of the transistors of the second conductivity type. Further, the substrate may not necessarily be a p-type semiconductor substrate, and may be an n-type semiconductor substrate, or a semiconductor substrate of a SOI (Silicon on Insulator) structure, or a semiconductor substrate of some other type.

What is claimed is:

1. A nonvolatile semiconductor memory device comprising:
   a string including a plurality of memory cells connected in series, each of the memory cells having a field effect transistor that stores information in a nonvolatile manner;
   a bit line connected to one end of the string;
   a source line connected to other end of the string;
   a plurality of word lines each connected to an associated one of gate electrodes of the field effect transistors;
   a word driver that drives the word lines; and
   a first power source line and a second power source line that supply a first voltage and a second voltage to the word driver, respectively, wherein
   the first voltage is a voltage between a third voltage of a first one of the field effect transistors that stores first information and a fourth voltage of a second one of the field effect transistors that stores second information,
   the second voltage is higher than each of the first, third, and forth voltages,
   the word driver supplies the second voltage to the word lines in a ready time when the string is not accessed, and
   the word driver supplies the first voltage to a gate electrode of a target field effect transistor to be accessed among the field effect transistors and supplies the second voltage to gate electrodes of other field effect transistors not to be accessed, in a read time when the string is to be accessed.

2. The nonvolatile semiconductor memory device as claimed in claim 1, wherein the second voltage is a voltage in which the field effect transistors are brought into electrically conductive state regardless that the first information or the second information are stored.

3. The nonvolatile semiconductor memory device as claimed in claim 2, wherein the third and fourth voltages are lower than a ground voltage.

4. The nonvolatile semiconductor memory device as claimed in claim 3, wherein
   the first voltage is lower than the ground voltage, and
   the second voltage is the ground voltage.

5. The nonvolatile semiconductor memory device as claimed in claim 2, wherein the field effect transistors are depletion type.

6. The nonvolatile semiconductor memory device as claimed in claim 2, wherein
   the first voltage is a low voltage lower than a voltage at a high voltage side supplied from outside to the nonvolatile semiconductor memory device, and
   the second voltage is the voltage at the high voltage side.

7. The nonvolatile semiconductor memory device as claimed in claim 6, wherein
   the third voltage is lower than a ground voltage,
   the fourth voltage is higher than the ground voltage,
   the first voltage is the low voltage, and
   the second voltage is the voltage at the high voltage side.

8. The nonvolatile semiconductor memory device as claimed in claim 7, wherein the first voltage is the ground voltage.

9. The nonvolatile semiconductor memory device as claimed in claim 1, further comprising a first control circuit that generates a first control signal in response to a command to access the string supplied from outside of the nonvolatile semiconductor memory device, wherein
   the word driver transitions a voltage of a word line corresponding to the target field effect transistor from the second voltage to the first voltage, and maintains voltages of word lines corresponding to the other field effect transistors not to be accessed so as to be the second voltage, in response to the first control signal.

10. The nonvolatile semiconductor memory device as claimed in claim 9, further comprising:
    a charging circuit that charges the bit line to a predetermined voltage in response to the first control signal; and
    a second control circuit that controls a first select transistor, a second select transistor, and the charging circuit in response to the first control signal, wherein
    the string includes:
    the first select transistor that electrically connects one end of the field effect transistors connected in series and one end of the string; and the second select transistor that electrically connects other end of the field effect transistors connected in series and other end of the string.

11. The nonvolatile semiconductor memory device as claimed in claim 10, wherein, in response to the command, the first and second control circuits activate the charging circuit,
   activate, after activating the charging circuit, the first select transistor,
   activate, after activating the first select transistor, the target field effect transistor,
   and activate, after activating the target field effect transistor, the second select transistor.

12. The nonvolatile semiconductor memory device as claimed in claim 10, wherein, in response to the command, the first and second control circuits activate the charging circuit and the first select transistor simultaneously,
   activate, after activating the charging circuit, the target field effect transistor,
   and activate, after activating the target field effect transistor, the second select transistor.

13. The nonvolatile semiconductor memory device as claimed in claim 10, wherein, in response to the command, the first and second control circuits activate the charging circuit,
   activate, after activating the charging circuit, the target field effect transistor,
   activate, after activating the target field effect transistor, the first select transistor,
   and activate, after activating the first select transistor, the second select transistor.

14. The nonvolatile semiconductor memory device as claimed in claim 10, further comprising a third control circuit controls the threshold value of the first and/or second selection transistors by Erase and/or Program.

15. The nonvolatile semiconductor memory device as claimed in claim 14, wherein
   the third control circuit controls the threshold value of the first and/or second selection transistors corresponding to a initialization command or power supplied from the outside of the nonvolatile semiconductor memory device.

16. A system comprising the nonvolatile semiconductor memory device as claimed in claim 1, and a controller which controls the nonvolatile semiconductor memory device.

17. A method of controlling a nonvolatile semiconductor memory device comprising:
   receiving from outside a command that reads data from a memory cell;
   transitioning a voltage of a first word line corresponding to a first memory cell to be accessed as a target for reading data from a second voltage to a first voltage that is lower than the second voltage, in response to the command; and
   maintaining voltages of a plurality of second word lines corresponding to a plurality of second memory cells connected to the first memory cell in series so as to be the second voltage, in response to the command.

18. The method of controlling a nonvolatile semiconductor memory device as claimed in claim 17, wherein
   the first voltage is lower than a ground voltage, and
   the second voltage is the ground voltage.

19. The method of controlling a nonvolatile semiconductor memory device as claimed in claim 17, wherein
   the first voltage is a ground voltage, and
   the second voltage is a voltage at a high voltage side supplied from outside to the nonvolatile semiconductor memory device.

20. The method of controlling a nonvolatile semiconductor memory device as claimed in claim 17, further comprising:
   charging a bit line connected to one end of a string that includes the first memory cell and the second memory cells in response to the command;
   after charging, first activating including activating a first select transistor that connects one end of the first memory cell and the second memory cells connected in series and one end of the string;
   after first activating, second activating including activating the first word line; and
   after second activating, third activating including activating a second select transistor that connects other end of the first memory cell and the second memory cells connected in series and other end of the string.

21. The method of controlling a nonvolatile semiconductor memory device as claimed in claim 17, further comprising:
   charging a bit line connected to one end of a string that includes the first memory cell and the second memory cells and first activating including activating the first select transistor that connects one end of the first memory cell and the second memory cells connected in series and one end of the string in response to the command;
   after charging and first activating, second activating including activating the first word line; and
   after second activating, third activating including activating a second select transistor that connects other end of the first memory cell and the second memory cells connected in series and other end of the string.

22. The method of controlling a nonvolatile semiconductor memory device as claimed in claim 17, further comprising:
   charging a bit line connected to one end of a string that includes the first memory cell and the second memory cells in response to the command;
   after charging, first activating including activating the first word line;
   after first activating, second activating including activating the first select transistor that connects one end of the first memory cell and the second memory cells connected in series and one end of the string; and
   after second activating step, third activating including activating a second select transistor that connects other end of the first memory cell and the second memory cells connected in series and other end of the string.

23. A device comprising:
   a non-volatile memory array including a plurality of cells and a plurality of word lines associated with the cells; and
   a controller controlling, in a ready state, the non-volatile memory array so that the word lines establish a second voltage, and
   the controller further controlling, in a read operation state, the non-volatile memory array so that a first one of the word lines establish a first voltage different from the second voltage and second ones of the word lines establish the second voltage, the first one of the word lines being associated with a cell to be read, and the second ones of the word lines being associated with cells not to be read.

24. The device of claim 23, wherein the first voltage is lower than the second voltage.

25. The device of claim 24, where one of the first and the second voltage is a ground voltage.

26. The device of claim 24, where the first voltage is a ground voltage and the second voltage is a power supply voltage which is supplied to the device.

27. The device of claim 23, wherein when the cell to be read is rendered conductive in response to the establishing of the first voltage in the read operation state, a bit line associated with the cell to be read establishes a first read voltage, and wherein when the cell to be read is rendered non-conductive in response to the establishing of the first voltage in the read operation state, the bit line associated with the cell to be read establishes a second read voltage, the second read voltage being higher than the first read voltage.

28. The device of claim 23, wherein the controller changes a state of the non-volatile memory array from the ready state to the read operation state in response to a read command.

29. The device of claim 23, wherein the non-volatile memory array further comprises:
a plurality of bit lines associated with the cells;
a source line;
a plurality pairs of first and second select transistors configured to select, when activated, ones of the cells, the ones of the cells being coupled between the first and second select transistors in a corresponding one of the pairs, the first select transistor being coupled to a corresponding one of the bit lines, and the second select transistor being coupled to the source line;

and wherein the device further comprise:
a charging circuit configured to charge, when activated, one of the bit lines.

30. The device of claim 29, wherein the first voltage on the first one of the word lines is established, after the first select transistor is activated and after the charging circuit is activated.

31. The device of claim 30, wherein the first select transistor and the charging circuit are activated simultaneously.

32. The device of claim 29, wherein the first voltage on the first one of the word lines is established, before the first select transistor is activated and after the charging circuit is activated.

33. The device of claim 29, wherein the controller is configured to select one of first, second, and third modes to read data from the nonvolatile memory array in the read operation state,
the first mode being a mode where the first voltage on the first one of the word lines is established, after the first select transistor is activated and after the charging circuit is activated,
the second mode being a mode where the first voltage on the first one of the word lines is established, after the first select transistor and the charging circuit are activated simultaneously, and
the third mode being a mode where the first voltage on the first one of the word lines is established, before the first select transistor is activated and after the charging circuit is activated.

34. The device of claim 23, wherein the non-volatile memory array are configured in a NAND type.

* * * * *